US006686768B2

(12) United States Patent
Comer

(10) Patent No.: US 6,686,768 B2
(45) Date of Patent: Feb. 3, 2004

(54) ELECTRICALLY-PROGRAMMABLE INTERCONNECT ARCHITECTURE FOR EASILY-CONFIGURABLE STACKED CIRCUIT ARRANGEMENTS

(76) Inventor: Alan Elbert Comer, P.O. Box 1134, Olalla, WA (US) 98359

( * ) Notice: Subject to any disclaimer, the term of this patent is extended or adjusted under 35 U.S.C. 154(b) by 0 days.

(21) Appl. No.: 10/190,003

(22) Filed: Jul. 5, 2002

(65) Prior Publication Data

US 2003/0052712 A1 Mar. 20, 2003

Related U.S. Application Data

(60) Provisional application No. 60/303,113, filed on Jul. 5, 2001.

(51) Int. Cl.[7] ................. H03K 19/173; H01L 23/02
(52) U.S. Cl. ................. 326/38; 326/101; 257/686
(58) Field of Search ................. 326/38, 37, 39, 326/41, 47, 101; 257/686, 723, 529, 530

(56) References Cited

U.S. PATENT DOCUMENTS 5,321,322 A    6/1994  Verheyen et al. ............. 326/41
5,341,267 A    8/1994  Whitten et al. ............... 361/56
5,412,593 A  * 5/1995  Magel et al. .................. 365/96
6,160,420 A  * 12/2000 Gamal et al. .................. 326/41

FOREIGN PATENT DOCUMENTS

JP          01319329 A  * 12/1989    ......... H03K/19/177

* cited by examiner

Primary Examiner—James Cho

(57) ABSTRACT

Ladder network comprises control terminals including at least ground terminal and master terminal, and slave terminals, each individually connected to ground terminal through fuse elements, respectively. The slave terminals are also sequentially linked, each to the next through antifuses, respectively. Master terminal is connected to slave terminal. By applying programming signals to control terminals, master terminal may be disconnected from ground terminal and sequentially connected to each slave terminal. Described ladder variations include segmented ladder, wherein master terminal can be sequentially connected to, and subsequently disconnected from, second conductors; hierarchical ladder network; and programmable SAW transducer. Finally, a programmable architecture based upon such ladder networks, suitable for incorporation within a configurable IC package, is described, including also a programmable contact structure if the package is stackable.

38 Claims, 17 Drawing Sheets

  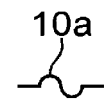 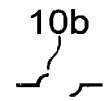
FIG. 1a    FIG. 1b
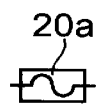 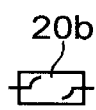  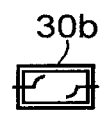
FIG. 1c    FIG. 1d
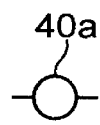 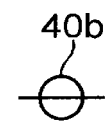
FIG. 1e
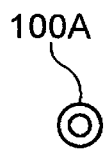  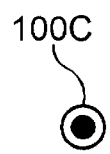   
FIG. 1f    FIG. 1g

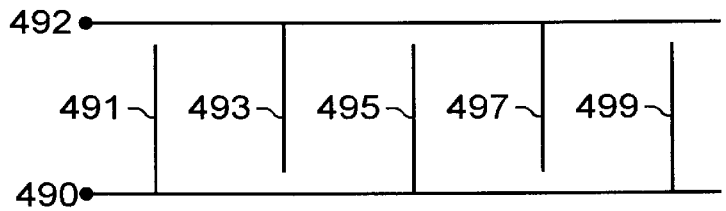
*FIG. 6* - PRIOR-ART SAW TRANSDUCER
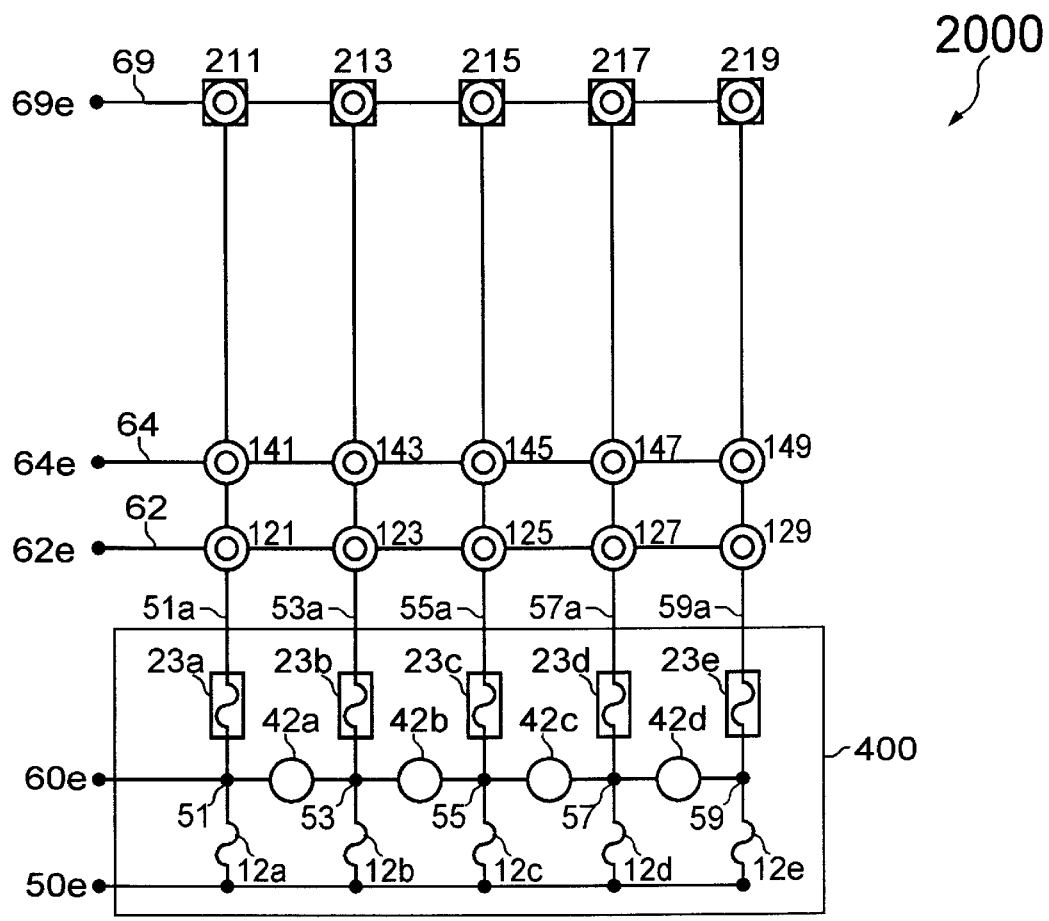
*FIG. 7a*

ELECTRICALLY-PROGRAMMABLE INTERCONNECT ARCHITECTURE FOR EASILY-CONFIGURABLE STACKED CIRCUIT ARRANGEMENTS

CROSS-REFERENCE TO RELATED APPLICATIONS

This application claims the benefit of Provisional Patent Application Ser. No. 60/303,113 filed Jul. 5, 2001.

FEDERALLY SPONSORED RESEARCH

Not Applicable

SEQUENCE LISTING OR PROGRAM

Not Applicable

BACKGROUND

1. Field of Invention

The present invention relates to electrical devices. More specifically, the present invention relates to electrically-programmable interconnect architectures without active devices, capable of making user-defined connections between conductors to form desired networks. Certain aspects of the present invention relate to general-purpose electrically-programmable interconnect architectures which form sequential electrical connections between a master terminal and each of a plurality of slave terminals; such architectures may find widespread utility in a variety of applications. Other aspects of the present invention relate to structures and architectures useful primarily for interconnecting circuits in stacked arrays, especially integrated circuits (ICs) contained within stacked, mating programmable packages such as those described in my related U.S. Pat. No. 5,838,060. In particular, the present invention provides the programmable interconnect architectures necessary for such packages to be built and programmed easily and economically, thereby providing a new, powerful method of flexibly combining arrays of user-selected ICs, housed within packages containing said architectures, so that the arrays of configured packages contain the entire system schematic within their programmed connections.

BACKGROUND

2. Description of Prior Art

It has long been realized that electrical circuits can achieve higher densities, greater modularity, and higher speeds when they are stacked together in a three-dimensional array, rather than spread out over a comparatively large area in a two-dimensional pattern. Different stacked arrangements or circuits have been utilized for many years; in fact, even before the advent of the integrated circuit (IC) chip, stacked modules, each containing several electrical components, were sometimes used as "building blocks" in electrical systems designs. The most common use today of this circuit-stacking technique is the popular and powerful "stacked PC-board" concept (where printed circuit boards (PC-boards) are plugged into an array of parallel receptacles or "slots" in a motherboard). Almost all computers today take advantage of this useful arrangement.

This arrangement, as is currently used in personal computers, demonstrates the compactness and modularity of the stacking concept. A personal computer with several filled slots may have far more total PC-board area even than the footprint of the computer, and the add-on cards can be selected from thousands of available boards. However, since the stacking concept is used on a relatively large scale (stacked PC-boards populated with standard IC packages, each board as large as 10 cm×30 cm, separated by approximately 2 cm. between parallel boards), the circuit is still spread out over a large physical space; so the relative speed advantage inherent in a stacked arrangement is less apparent. In fact, in a standard personal computer today advertised to run at a given clock speed, at most only a small section of the motherboard actually runs at the specified speed; more commonly today, only a section of the CPU runs at the specified speed. In most personal computers today, the bus which connects the stacked PC-boards to the CPU runs much slower than the system clock speed; this speed ratio can be ten times or more. Clearly, although this stacked arrangement may in fact be somewhat faster than an equivalent but entirely two-dimensional arrangement, the inherent speed advantage of a stacked circuit arrangement is not apparent in this example case.

Yet stacked circuit arrangement at the PC-board level is by far the most prevalent application of the stacking concept today, in spite of the lack of significant speed advantages. This has come about for a variety of reasons, primarily having to do with cost and time-to-market. In order to understand why stacked PC-board applications are so overwhelmingly popular compared to other stacking methods, it is necessary to look at the methodology commonly used when building an electronic system.

ICs as they are produced today are inherently two-dimensional. They are produced by building up successive layers, each patterned using plate micro-photolithography, on a two-dimensional wafer substrate. Each wafer is subsequently diced into individual IC chips, each of which performs a required electrical function. IC chips are usually sold pre-packaged (in packages selected by the IC manufacturers) and pretested both at the wafer level and in packaged form. The packages used are generally made in technologies which bridge the microscopic world of the integrated circuit, where critical dimensions are currently measured in tenths of micrometers, to the macroscopic world of the PC-board, where critical dimensions are now measured in tenths of millimeters. Almost all chip packages are designed to be mounted directly onto a PC-board, so the package external contact points (pins, solder-bumps, etc.) are spaced at intervals compatible with PC-board dimensions. Because the external contact points are spread out compared to chip dimensions, most IC packages are significantly larger than their enclosed chip, yet smaller than a PC-board; yet since the design, substrate and fabrication costs per unit area are generally much less for package technologies than for IC technologies, the package cost is typically much less than the IC die cost. To make a system, designers connect different ICs together using PC-boards whose contacts and conductors are designed to mate with the external contact points of each IC package.

So when designing a new electronic system, systems designers can customize circuits at several levels. They can design new IC chips, custom packages, or custom PC-boards.

The costs and lead-time of developing a new IC are quite large, and are many times only justifiable where a large prospective market is anticipated for the new IC. Some custom ICs, also known as application-specific ICs (ASICs), use streamlined design techniques, to make a new IC design more cost-effective even for a smaller potential market; but these are still a relatively small sector of the total IC market. In general, systems designers use standard, relatively economical ICs as much as possible in their designs; customizing a particular system by designing new custom IC chips is almost never done.

Designing and building custom packages is also expensive, and the lead-time from the beginning of the package design cycle is quite long. Because of this, chip packages are generally considered as being relatively fixed, especially in terms of the package external form factor. Again, systems designers rely on standard packages as much as possible in their designs.

In contrast, building a new design using prior-art techniques always requires a custom PC-board design, in order to define the connectivity of the individual components and packaged chips, and thus define the entire circuit. The tooling costs and lead-times for custom PC-boards are both affordable, especially when compared with the costs of producing custom packages or ASICs for each chip in a design. Thus, as much as possible, systems designers use standard IC chips, in standard packages, mounted on custom PC-boards, in order to build their products.

With this currently prevalent methodology in mind, it is easy to see why circuit stacking is primarily used at the PC-board level. In any proposed stacking technology, a "pancake stack" of interconnected circuits requires that each "pancake" have its own custom interconnections, which mate with the connections on the pancakes above and below it in the stack. These custom interconnections now define the wiring connectivity of the components, and thus define the system. As discussed above, custom chips and custom packages are expensive and time-consuming to produce using standard techniques, while custom PC-boards are relatively cheaply and quickly fabricated; also, almost all systems today require custom PC-boards anyway. Thus, using prior-art technologies, relative cost and time-to-market dictate that circuit stacking be commonly used only at the PC-board level, despite the relatively low speed of this approach.

In the past, such speed considerations were not of paramount importance; systems were able to run at speeds consistent with the available integrated circuits using an essentially two-dimensional system-level arrangement. Today, however, integrated circuits are becoming fast enough that the interconnections between chips can dominate overall system performance. In recent years, different circuit stacking arrangements that are inherently faster have begun to be investigated.

The comparative speed advantages between different stacking schemes can be qualitatively compared by comparing the longest distance a signal might have to travel. This distance dictates the time-of-flight for a worst-case electrical signal; and the time-of-flight determines the delay between the time that the driving circuitry signals a condition and the time that the receiving circuitry first becomes aware of that condition and begins to formulate a response. This longest distance also gives an indication of the worst-case parasitic resistance, inductance and capacitance values in a given technology if the transmission-line properties of a given path are not matched well enough to allow clean transmission-line propagation to occur. Even when an attempt has been made to optimize the PC-board traces as strip transmission lines, the longest traces with the most connections are typically the worst performers of the system; even systems with optimized traces rarely are able to prevent reflections and other signal degradations when the transmission line splits.

And such parasitic values in turn determine much of the power consumption of the system. If transmission-line parameters are not optimized, these represent capacitances to be charged and inductances to overcome when signals are transmitted; and if the transmission-line parameters are optimized, they are still related to the time duration for which each signal should be held valid.

In the personal-computer example mentioned above, using perhaps eight stacked PC-boards with edge connectors at one end of one side, the worst-case signal would have to travel from the first board's far end to its connector, then along the motherboard to the farthest board's connector, and then out to the far end of that board. This would total perhaps 2 cm from an IC die through its package, about 30 cm along one end board, another 7*2 cm to access the board on the other end, 30 cm out to the farthest package on that board, and another 2 cm through the receiving package, for a total of about 78 cm. This large "characteristic distance" is comparable to or larger than the largest dimension of an equivalent fully two-dimensional arrangement; and this explains why no especial speed advantage is obtained in this case. Even at the speed of light, the time of flight for this distance is still several nanoseconds, which is comparable or greater than the silicon delays in current systems. But how does this compare with other potential circuit-stacking arrangements?

Of course, the most compact and basic level to begin stacking circuits would be to "layer" multiple integrated circuits together on the same substrate, building up circuit upon circuit with built-in interconnections between layers through vias. The characteristic distance in this case would be equal to an IC maximum dimension (perhaps 1 cm) plus several thicknesses (tens of micrometers at most), or roughly 78 times shorter than the characteristic distance of the personal-computer example. With such a tremendous comparative advantage, such an approach has been investigated and is still under investigation; this approach is inherently the most compact and probably the fastest arrangement, but is plagued by practical difficulties. For example, it is more difficult to keep such an extremely compact structure cool during operation. Also, processing problems such as perfecting planarization techniques between layers, developing re-crystallization techniques for creating quality semiconductor material for upper layers, and basic yield considerations have limited the application of this approach to stacking circuits. With the current state of the art, such truly three-dimensional integrated circuits are not practical for most applications.

The next logical level at which circuits might be stacked is at the die level; separately-manufactured integrated circuit dice might be stacked atop one another with some type of interconnection scheme linking their signals together. This approach would have a characteristic distance as small as one IC maximum dimension (1 cm) plus several wafer thicknesses (perhaps 7*0.625 mm), or roughly 54 times shorter than the personal-computer example. And in fact, an increasing interest in such an approach is becoming apparent. For example, U.S. Pat. Nos. 4,394,712 (1983) and 4,499,655 (1985) to Anthony describe a rather exotic technique for stacking silicon-on-sapphire (SOS) substrates using bored and plated holes as vias to interconnect the various circuits. Of course, such an approach is even more expensive than standard SOS chips, which are already prohibitively expensive for consumer applications. Another interesting approach is described in U.S. Pat. No. 5,019,943 (1991) to Fassbender et. al.; a stack of chips is presented wherein one edge of the chip stack assumes a "zig-zag" shape which exposes bond pads along the edge of each chip. Electrical connections between chips are made by connecting these bond pads with bondwires. As another example, U.S. Pat. No. 5,347,428 to Carson et. al. describes a similar stack of chips, specifically memory chips, integrated with a microprocessor. Although Fassbender does not specifically mention memory chips as his primary application, his approach is also best suited for stacks of memory chips, since interconnections between chips are available along only one edge of the stack; this limits the numbers of inputs/outputs (I/Os) and is most suited to chips which are relatively large in area, but which have relatively few I/Os themselves (such as memory chips). In fact, because of the limited interconnections in these approaches, most prior-art chip-stacking schemes are not applicable to stacks of general-purpose chips which may include chips with many I/Os. Chip-stacking approaches are generally most applicable to memory chips, because the dice should ideally be the same size (width and length), and thus must usually be the same chip; in most systems, only memory chips are used in large-enough quantities to make such a stack practical. And even if all chips produced today were exactly the same size, there would still be problems interconnecting chips in a stack; consider how a pad on one corner of a chip would be connected to a pad on the opposite corner of the next-higher chip in the stack. In general, chip-stacking schemes, which normally allow only near-vertical connections between different chips, require each chip to be designed specifically for use in the stack, or else require that each chip be substantially similar to the others in the stack. Overall, chip-stacking as described in the prior art is not a viable approach to general-purpose dense circuit stacking.

The next level at which circuits might be logically stacked together would be at the package level. The addition of a package surrounding each die creates a standard size (the package size) which can be relatively independent of die size. And more I/O capability may be built into each package than is present in a chip stack. Although a stacked-package arrangement would not be as compact as true three-dimensional circuits or stacked chips, the size of a package stack would still be small enough to expect significant speed advantages. Furthermore, the interconnecting conductive traces in a package can also be designed to have less resistance and less parasitic capacitance than an integrated-circuit trace, yet be much shorter than a PC-board trace, since the density is intermediate between integrated circuit dimensions and PC-board dimensions. With packages interconnected together within the stack, most of the packages do not need to interface with a PC-board at all, new packaging technologies with smaller sizes and thus greater speeds are a possibility. As an example, packages as thin as 1 mm are already being produced, and perimeter ball-grid-array packages perhaps 1.5 times the linear dimensions of an IC die are possible. Using these dimensions, the characteristic distance of a package stack might be 1.5 cm plus 7*1 mm, or roughly 35 times shorter than the personal-computer example above. This speed is comparable to the two inherently more-compact, but less practical, approaches (true 3-d ICs and chip-level stacking) discussed above. In terms of potential performance for general-purpose circuit stacking, the package level would seem to be the most promising level to pursue. One structure for such a stackable package usable in this context is described in my prior U.S. Pat. No. 5,838,060.

Yet package stacks are not now in common use. This is due primarily to the practical concerns mentioned above with prior-art packaging technologies. Although each die need not be custom-designed for use in the stack, each package must now be designed specifically for use in the stack, with the correct connections between package internal and external contact points, and between top and bottom contacts, designed in. As mentioned previously, the costs and delays associated with designing even one such custom package are not small; the total cost and delay associated with designing and manufacturing a matched set of stacking packages for each system design is prohibitive. For example, to make a general-purpose stack comprising ten disparate dice, ten different mating packages need to be designed, and prototypes built and debugged, before the overall circuit can even be tested. And if a given chip is used in multiple designs, multiple different package designs are required for this single chip if this approach is used. Using prior-art technologies, such a stacked-package arrangement is probably only within the reach of large, vertically-integrated companies that design and manufacture chips, packages, and entire systems; and even they will not take such an approach unless the prospective market for such a system can justify such exorbitant costs in time and manpower.

Thus, there is a current need for a practical, low-cost, quick-turnaround method of producing custom interconnections in stackable semiconductor packages. Although there are few examples of such packages in the prior art, some general requirements for such an application can be determined. For example, an electrically-configurable package, quickly programmable using a low-cost programmer similar to those currently used to program EPROMs or FPGAs, would be especially well-suited for such an application. Ideally, an electrically-configurable architecture for use in this application should be compatible with a variety of packaging technologies; it would thus be desirable for such an architecture to be buildable on a variety of substrates. And, since the connectivity of the programmable architecture defines the entire circuitry of the stack, it is highly desirable, if not absolutely necessary, for the programmable elements of the architecture to maintain their states indefinitely, once programmed. Finally, it would be very desirable for such an architecture to be programmable using as few electrical contacts as possible, and preferably without requiring the programmer to contact any of the package's internal electrical contact points.

Such a stacked packaging scheme requires a programmable interconnection architecture, for use in selectively connecting each package's external contact points (pins, contacts, solder-bumps, etc.) and internal contact points (such as bond pads) together as needed by the system design. In such a programmable architecture, the interconnection elements are selectively programmed to connect together desired groups of conductors according to a user-defined pattern. In the prior art, such programmable architectures have been produced using a plurality of switches or other programmable interconnection elements, with one such element connected between each pair of potentially-connectable conductors. Such interconnection elements may be in the form of reprogrammable elements such as physical switches, relays, or transistors whose gates are controlled to make or break each connection. Other possible interconnection elements might be one-time-programmable (OTP) elements such as fuses or antifuses. A fuse is a programmable structure with two terminals, which initially electrically connects its two terminals together, but which, when programmed, permanently electrically disconnects them from one another. An antifuse is a programmable structure with two terminals, which initially does not electrically connect its two terminals together, but which, when programmed, permanently connects them together electrically. In general, OTP elements are cheaper to make than reprogrammable elements.

Reprogrammable elements are still preferred for many programmable interconnection applications, if the additional cost can be justified. However, for incorporation in a programmable package, such elements are not practical. Such large-scale structures as current-technology switches or relays are too cumbersome to incorporate in a compact packaging array. And transistor-based reprogrammable elements require an expensive semiconductor substrate and semiconductor processing, rather than conductive or insulating package substrates with their lower-cost package-technology processing. Also, such reprogrammable elements typically do not provide a connection that has as low a resistance as an OTP connection through a shorted fuse or antifuse of comparable size. Furthermore, such reprogrammable elements generally require considerable additional controlling logic and circuitry, which again adds to the size, cost and power requirements of any design. Thus, an electrically-programmable interconnection architecture suitable for incorporation into configurable, stackable IC packages should ideally be based on OTP interconnection elements such as fuses and antifuses.

In the prior art, programmable interconnection architectures using fuse and antifuse elements have been proposed in many different configurations, each with different advantages and disadvantages. Many approaches combine the OTP elements with reprogrammable elements such as transistors; of course, such approaches are inappropriate here, since again a semiconductor substrate would be required.

Programmable interconnection architectures using only fuses might be constructed; however, such arrays of fuses have practical limitations. For example, a fuse-based interconnection network presents a plurality of conductors initially connected together by fuses. Unwanted connections are then disconnected by programming the unwanted fuses to the open state. Without the assistance of reprogrammable elements, it becomes difficult to isolate the desired fuse from all others for programming, because of possible current paths in parallel with the desired fuse. Depending on the network configuration, these "sneak" paths can demand large currents to be supplied, above the current needed to actually program the desired fuse. With more complicated networks, keeping track of and accounting for all possible sneak paths can become impractical or impossible. In short, although fuse elements have very desirable electrical characteristics, programming a complicated network based entirely on fuses can be prohibitively complex and time-consuming, if it can be reliably performed at all.

By contrast, an antifuse-based interconnection architecture initially presents a plurality of unconnected conductors, which are subsequently programmed by shorting the desired antifuse to the shorted state. This is a much simpler situation that in the above-mentioned fuse-based interconnection architecture. However, care must still be exercised during programming to ensure that excessive voltages do not appear at the terminals of antifuses which are not to be programmed, inadvertently damaging or programming them. More problematically, undesired and unprogrammed antifuses are still present after programming, and must be protected from such accidental programming during the entire operating life of the network.

One very promising architecture is proposed in U.S. Pat. No. 5,321,322 to Verheyen et. al., in which a combination of fuses, antifuses, and tri-state elements electrically equivalent to series-connected fuse/antifuse pairs, is used. The described architecture essentially uses a fuse and antifuse in series as the primary programmable OTP element in the interconnection architecture; this eliminates the problems associated with fuse-only or antifuse-only architectures. Also, Verheyen describes an architecture which might be built on a variety of substrates, so that it might be suitable for a stacked-package scheme.

The particular architecture described by Verheyen, however, allows a user to connect together selected ones of an undifferentiated "plurality of input/output pads through which programming signals may be transmitted to the interconnect architecture", in essence requiring any or all of the I/O pads to be available for transmitting programming signals; thus all of the I/O pads must be electrically accessible to the programmer during programming. However, such an architecture is not practical for use in a programmable package. An architecture used to make an IC package programmable inherently has two main types of I/O pads: 1) package "external contact points" physically located on an exterior surface of the package, and used to connect the package to outside circuitry (e.g. pins, solder-bumps, etc.), and 2) package "internal contact points" physically located inside the package, and used to connect to structures inside the package, such as an included IC die (e.g. bond pads, pads that mate with flip-chip solder bumps, etc.). In other words, package internal contact points, which are typically too small to be easily contacted even if they are accessible, form a substantial subset of said architecture I/O pads; contacting all architecture I/O pads would require both a means of contacting the package external contact points and a probe card or other means of simultaneously contacting the tightly-spaced package internal contact points during programming, in some cases, it may be essentially impossible to physically contact the package internal contact points during programming, especially if the package is to be programmed after the die has been inserted and the package has been hermetically sealed. And additional conductors, routing a connection from each internal contact point out to the package surface, are redundant after programming, add unwanted complexity to the package, and degrade performance of the programmed package. Therefore, a Verheyen architecture, included within a programmable package, is unduly difficult or impossible to program, and may degrade package performance.

Also, the Verlieyen architecture provides for general user-selected interconnection of said I/O pads without any differentiation between them; such an architecture is considerably more flexible than what is required for a configurable package, and thus must provide far more programmable elements than are really required to interconnect an array of stacked packages. For example, internal contact points (that are used to contact an included IC die) will rarely need to be connected together; so if a Verheyen architecture is used in a programmable package, almost all of the programmable elements included to allow connections amongst internal contact points are wasted. Similarly, by far the most common connections actually needed between external contact points in a stacked-package interconnect scheme will be between associated bottom-side contacts and top-side contacts (where nets pass vertically through the package stack through a series of such connections); other connections amongst package external contact points will likewise be rare. So again, most of the programmable elements provided within a packaged Verheyen architecture to allow connections amongst external contact points would be wasted. So even if a practical way of programming a Verheyen architecture within a stackable package was found, it would in general still have far more programmable elements than are required for this application; of course, this leads to higher cost, lower performance and lower yield.

Basically, the Verheyen patent describes an architecture which is quite suitable and desirable for a flexible, multi-purpose 2-dimensional interconnection network, where any given signal might enter the architecture through any pad (making any pad potentially an input) and exit via any other pad (making any pad also potentially an output); such a situation requires that any two terminals of the interconnection architecture be connectable. But such general-purpose architectures are not well-suited for the more limited requirements of a programmable-package interconnection scheme.

However, starting with such a flexible, general-purpose architecture, one can list the modifications which are of obvious value in transforming it to a form more appropriate for a programmable package. These changes can be enumerated as the purposes and requirements of the two applications are compared.

As stated before, the basic purpose of the general-purpose architecture is to connect each signal arriving at any one of its undifferentiated external I/O pads to any other one (or more) of its undifferentiated external I/O pads; whereas the primary purpose of a programmable-package architecture is to "bring out" the IC signals, i.e. to connect each package internal contact point to one (or more) of the package external contact points (and of course, in a stackable package, some connections between the external contact points, particularly related top- and bottom-contacts, are also required). In essence, the conversion to an idealized programmable package architecture requires that a large number of Verheyen I/O pads be "moved" from the package exterior to the interior, where they become essentially inaccessible during programming (ideally, no contact with these pads should be required, and it should not be required that any programming signals be sent through these pads). Thus in a programmable package, there is a clear, basic difference between those I/O pads formed by internal contact points and those formed by external contact points. Verheyen's undifferentiated "plurality of I/O pads through which programming signals may be transmitted to the interconnect architecture" must therefore be differentiated into a first plurality of I/O pads which ARE accessible for programming (package external contact points), and a second plurality of I/O pads which ARE NOT accessible for programming (package internal contact points). It is therefore a goal of the present invention to provide such a programmable architecture, where programming is performed by applying programming signals only to a predetermined subset of the I/O pads of the architecture.

Secondly, the basic requirement of a flexible general-purpose architecture is that any two groups of I/O pads should be connectable by the architecture; whereas a programmable-package architecture requires such maximum flexibility only in the connections between the now-differentiated first and second pluralities of I/O pads; only rare connections within each group are required (again with the exception of the frequent connections required between related top- and bottom-contacts if the package is stackable). Ideally, a programmable architecture for use in programmable-package scheme should take advantage of these inherent differences between the two pluralities of pads, limiting the number of interconnection elements provided for rarely-used connections. It is therefore a goal of the present invention to provide a programmable architecture which is efficient in meeting the needs of a programmable IC package, providing interconnection elements in proportion to the requirements of this particular application.

Thirdly, even if a Verheyen architecture was built into a stackable package in particular, this general-purpose architecture would presumably provide connections between the various undifferentiated I/O pads, including connections between associated top- and bottom-pads, which would generally be of only average length and electrical properties; however, since nets may contain several of these connections in series, an architecture designed for stackable packages should ideally provide a separate means for making these important connections with superior electrical properties. Thus, it is a goal of the present invention to provide an architecture for use in stacked, configurable packages which provides particularly short, high-performance connections between associated bottom-side contacts and top-side contacts.

With these desired modifications clearly in mind, it is useful to consider further how such a programmable-package architecture might be built, and particularly how it might be programmed without physical access to its second plurality of I/O pads.

One means of configuring such a programmable fuse/antifuse architecture (without physical contact to all architecture I/O pads or terminals during programming) might include a means for electrically connecting a control terminal X to one of a plurality of architecture terminals, some of which may be otherwise inaccessible during programming (such as the package internal contact points). This is how programmable fuse/antifuse architectures which include reprogrammable elements are generally programmed—the connections to the architecture terminals during programming are controlled by the reprogrammable elements, such as logic-controlled transistors, within the architecture. However, without reprogrammable elements, this task becomes much more difficult.

Even more useful would be a building block which allowed a user to connect a control terminal X to each of the plurality of controlled terminals, at different times. As an example, consider the special case where control terminal X must be connected sequentially to the first, second, . . . Nth of N controlled terminals, in order that some electrical operation might be accomplished in each of these configurations. This usage is often encountered when encoding information into any machine, and is therefore of general utility. More specifically, this defines a particularly useful special case of the required architectural building block. This form in particular might find general utility in the programming of fuse/antifuse interconnection architectures, where programming is often based on sequencing through various architecture terminals. It is therefore a goal of the present invention to provide such an architectural building block, whereby the interconnection elements may be selectively programmed to connect control terminal X to each of a group of controlled terminals in a particular sequence, without requiring previous electrical connections between control terminal X and these controlled terminals.

Also, it would be advantageous if each such connection itself could be temporary, used only during programming at a specific step in the programming sequence. It is therefore a goal of the present invention to provide the aforementioned architectural building block, wherein means are further provided to allow control terminal X to be subsequently disconnected from each controlled terminal.

One patent in the prior art describes a structure with capabilities somewhat similar to those required. U.S. Pat. No. 5,321,322 to Whitten et. al. discusses a deactivatable, reactivatable, ESD (electrostatic discharge) protection device for preventing damage to an electrical component; the structure described therein is a fuse/antifuse building block capable of disconnecting a pair of initially-connected terminals and then reconnecting/redisconnecting them up to three more times. However, as disclosed in that patent, the Whitten structure does not connect a control terminal to each of several controlled terminals in a sequence; instead, it is intended to connect (and disconnect) a control terminal to/from another single terminal, several times. Also, it is not intended to assist in the programming of any interconnect architecture (beyond protecting it from ESD damage). Further, the Whitten structure is not intended for use in a stackable, configurable package. And, in any case, it provides only a few steps of disconnection/reconnection; certainly not enough to help much in programming any real-world stacked-package system including perhaps hundreds of internal contact points and hundreds or thousands of external contact points in each package.

OBJECTS AND ADVANTAGES

Accordingly, several objects and advantages of the present invention are:

1. To provide a means for sequentially connecting a control terminal to each of a plurality of controlled terminals, using a fuse/antifuse architecture to reduce manufacturing costs compared to IC (transistor-based) interconnection architectures.
2. To provide a means for sequentially connecting a control terminal to each of a plurality of controlled terminals through a low-impedance path.
3. To provide a means for sequentially connecting a control terminal to each of a plurality of controlled terminals which does not require active devices or active control signals.
4. To provide a means for sequentially connecting a control terminal to each of a plurality of controlled terminals using a fuse/antifuse architecture, which does not require any preexisting electrical connection to these terminals to assist in programming.
5. To provide a means for sequentially connecting a control terminal to each of a plurality of controlled terminals, individually.
6. To provide a user-programmable interconnection architecture, suitable for incorporation into IC packages, which does not require a semiconductor substrate or transistors, and therefore may be built for a relatively low cost.
7. To provide a user-programmable interconnection architecture, suitable for incorporation into IC packages, which, once programmed, retains its state indefinitely.
8. To provide an user-programmable interconnection architecture which may be integrated into an IC package in such a manner that the interconnection architecture may be completely programmed by the application of currents and voltages only to contact points on the exterior of the package, without requiring application of currents and voltages to the internal contact points of the package.
9. To provide an user-programmable interconnection architecture for integration into an IC package which efficiently provides configurability in the package connections, by providing substantial flexibility in the connections between the package internal contact points and external contact points, but only limited flexibility in connections amongst the package internal and external contact points.
10. To provide a user-programmable interconnection architecture for integration into a stackable IC package that makes specific provision for programmably connecting corresponding bottom-surface and top-surface package external contacts together, selectively creating short, high-performance connection paths through each package.
11. To provide a means whereby IC packages may be quickly and economically customized in their electrical connections.
12. To provide a quick-turnaround, electrically-programmable means whereby ICs may be combined into a system with customized connections.
13. To provide a new means whereby systems can be quickly and economically modified in their connections, resulting in quicker debugging and faster time-to-market for systems manufacturers.
14. To provide a practical, low-cost, quick-turnaround method whereby slacked circuits may be connected together in a compact, high-speed assembly with significantly-reduced characteristic distances compared to prior art methods.

SUMMARY

According to a first aspect of the present invention, a first architectural building block described as a "single ladder network" is presented, comprising a plurality of first antifuse elements each having first and second terminals, a plurality of first fuse elements each having first and second terminals, a first plurality of control terminals including at least a "ground" terminal and a "master" terminal, and a second plurality of "rung" or "slave" terminals. In this, the single ladder's simplest form, the antifuse elements are connected together in series, with the second terminal of each antifuse connected to the first terminal of the next antifuse, forming a chain of antifuses with a first chain end comprising the first terminal of a first antifuse, and a second chain end comprising the second terminal of a last antifuse. The first chain end is directly connected to the master terminal, and may thus be considered as forming a "bonus" slave terminal. Each second antifuse terminal is connected to a different one of the slave terminals, and is further connected to the second terminal of a different one of the fuse elements; each first fuse terminal of each fuse element is electrically connected to the ground terminal. Thus, in this most basic form, the single ladder network is composed of an array of "rungs" connected in series, wherein each rung comprises one antifuse element, one fuse and one slave or rung terminal; it is a "single" ladder because each rung has only a single antifuse. In this simplest form, it is necessary to provide some means of shorting the master terminal to the ground terminal prior to programming, in order to prevent premature inadvertent programming due to an ESD event. The simple addition of another fuse element, connected between the master terminal and the ground terminal, provides protection against such ESD damage; with this addition, the single ladder becomes an "ESD-protected single ladder".

In the ESD-protected single ladder network, the antifuses both isolate the slave terminals from each other initially and provide a means of subsequently connecting them together. Since the master terminal and the slave terminals are all initially connected to said ground terminal, each through an unblown fuse, all antifuses in the ladder network are initially protected against premature undesired programming. If suitable electrical programming signals are applied to the master and ground terminals, the master terminal may be repeatedly disconnected from the ground terminal (by blowing the next fuse), then reconnected and simultaneously connected to the next rung terminal of the ladder (by shorting the next antifuse). No programming signals need be applied to the rung terminals to achieve this functionality. The ground terminal remains connected throughout the programming sequence with all rung terminals which have not yet been connected to the master terminal, thereby protecting all remaining unprogrammed antifuses from accidental programming until their turn arises in the programming sequence. In these simplest forms of the ladder network, the master terminal remains connected permanently to each rung terminal, once connected; however, often it would be advantageous to provide a means of breaking these connections after they are used, so that the master terminal is only connected to one rung terminal at a time.

Therefore, according to a second aspect of the present invention, a second architectural building block described as a "segmented ladder" network is presented, comprising a single ladder of the present invention, a plurality of second conductors, and a plurality of third fuse elements. Said third fuse elements split each second conductor into two initially-connected proximal and distal "segments", wherein each proximal segment is connected directly to a different one of the slave terminals; these segments may subsequently be separated by blowing said third fuse. This structure allows each second conductor distal segment to be connected to the ladder's master terminal through its slave terminal and proximal segment, and subsequently disconnected by blowing its third fuse. Of course, in the limiting case wherein each said proximal segment is of zero length, this structure reduces to a plurality of second conductors, each connected to a different slave terminal through a different third fuse; this simpler case will be assumed in many of the following examples, for ease of discussion.

Since a connection to each terminal of a fuse is needed to blow the fuse, a separate electrical connection to each second conductor distal segment is required to blow its third fuse; this connection will normally be provided by "segmentation assist" rails with programmable three-state elements linked to each distal segment, so that temporary connections to each distal segment can be made. Thus, said segmentation assist rails provide means whereby said third fuses may be programmed.

According to a third aspect of the present invention, a third architectural building block described as a "double ladder" network is presented, comprising a plurality of first antifuse elements and a plurality of first fuse elements, connected together and further connected to a first "ground" terminal and a plurality of slave terminals. This double-ladder network is identical in structure to the single ladder, except that the chain of single antifuses becomes a chain of series-connected pairs of antifuses. The functionality is likewise identical, except that the antifuse-programming procedure must now be replaced by an antifuse-pair programming procedure, including a step requiring twice the Vpp voltage of a single antifuse programming procedure. In essence, this is the same structure as the single ladder; however, this building block has the important property that no programming signal required by any single ladder network (built in the same antifuse technology) will program one of the antifuse pairs. This allows a double ladder to be used to combine a plurality of single ladder networks into a larger hierarchical ladder network, with a greater total number of slave terminals. This aspect of the present invention effectively increases the total possible number of slave terminals which may be sequentially connected to the master terminal, with better electrical performance than an equivalent single ladder network.

According to a fourth aspect of the present invention, a fourth architectural building block described as an "assisted double-ladder" network is presented. Said assisted double ladder comprises a double-ladder, and further comprises a third "intermediate assist" ladder control terminal, and a plurality of second fuse elements. Said intermediate assist terminal is connected through one of said second fuse elements to each intermediate antifuse terminal connection which links each pair of antifuses. This form of the double ladder provides ease in programming the ladder, since each antifuse can again be programmed individually, using the third assist terminal to transmit further programming signals. Also, this structure has a reduced likelihood of errors before or during programming, since the voltage of the intermediate antifuse terminal connection within each antifuse pair is no longer floating before or during programming (as it is in the basic double ladder). Further, this assisted double-ladder network can be generalized into a means for connecting ladders together according to an hierarchical scheme with an arbitrary number of hierarchy levels, so that ladders with a very-large number of slave terminals can be provided, with significantly-improved performance compared to a single ladder network with the same number of slave terminals.

According to a fifth aspect of the present invention, a programmable surface acoustic wave (SAW) interdigital transducer is presented which incorporates a segmented ladder network to produce a new type of transducer, in which each interdigital finger may be programmably connected to either the positive or negative terminal of said transducer.

An IC package has electrical contacts, such as pins or solder-bumps, located on the exterior of the package ("external contact points") and electrical contacts for the IC die, such as bond pads, located inside the package ("internal contact points"). It is useful to be able to configure the connections between these internal and external contact points using a programmable interconnect matrix linking these internal and external contact points. However, it is preferable to be able to program each package using the application of electrical signals only to the external contact points of the package; then programming can be achieved using a socketed programmer which contacts only the external package pins or contacts, much as EPROMs are programmed. In essence, this requires that programming of the interconnect matrix be conducted even though some of the matrix rows or columns are not directly accessible during programming.

Therefore, according to a sixth aspect of the present invention, a user-programmable interconnect architecture is presented, useful for integration into configurable integrated circuit (IC) packages. This architecture incorporates the ladder network of the present invention to allow a user to selectively connect inaccessible internal contact points to the external contact points, without requiring contact to these inaccessible contact points during programming. For example, using the architecture of the present invention, a user can selectively connect package internal contact points (such as those tiny internal contact points which are commonly used to connect to an included semiconductor die through bond wires or other electrical means), to selected external contact points in a predetermined pattern, without opening the package and contacting these internal contact points with a probe card or other means. This allows a user to programmably and flexibly connect these package internal contact points to the package external contact points in a user-defined pattern, by applying electrical programming signals only to the package external contact points.

If the configurable package is also stackable, it has additional requirements. A stackable IC package has external contact points situated on the top surface of the package ("top contacts"), and matching external contact points on the bottom surface of the package ("bottom contacts"), where at least some of these top contacts are individually associated with a corresponding bottom contact. Within a stackable, programmable package interconnect scheme, it is particularly useful to be able to make or break high-performance connections between the associated pairs of top and bottom contacts, in addition to the configurable connections between these external contact points and the package internal contact points.

Therefore, according to a seventh aspect of the present invention, a fifth architectural building block described as a "programmable contact structure" is provided, ideal for incorporation into configurable, stackable IC packages, wherein a selected pair of package external contact points, including one top contact and one bottom contact, is associated with a common "internal contact terminal" located within the package. This internal contact terminal may in turn be a terminal of a programmable interconnect matrix within the package, allowing configurable connections to other conductors within the package. The programmable contact structure of the present invention also allows a user to selectively make permanent electrical connections between its three terminals: thus signals connected to its top or bottom contact may be routed to its internal terminal; or signals which must pass vertically through the package may be routed by simply connecting the top and bottom terminals together.

According to an eighth aspect of the present invention, a complete stacking architecture, incorporating both the programmable external contact structure and the ladder network of the present invention, is also presented. This complete architecture allows a user to selectively connect inaccessible package contact points to the internal contact terminals associated with the various top and bottom external contact points, without requiring direct access to these inaccessible contact points during programming. For example, using this complete stacking architecture of the present invention, a user can selectively connect package internal contact points (such as those tiny internal contact points which are commonly used to connect to an included semiconductor die through bond wires or other electrical means), to selected internal contact terminals in a predetermined pattern, without opening the package and contacting these internal contact points directly with a probe card or other means. This allows a user to programmably and flexibly connect these package internal contact points to the package external contact points (top and bottom external contacts) in a user-defined pattern, using the application of electrical programming signals to only the package external contact points.

Further, in some cases it may even be desirable to program such a configurable, stackable, IC package after the IC die is already inserted into the package. However, if prior-art programmable fuse/antifuse interconnect matrices are used to make configurable packages for standard ICs, such an approach is generally precluded because the signals used to program the matrix can damage the inserted IC die.

Therefore, according to a ninth aspect of the present invention, an optional sixth architectural building block is presented, described as a "die isolation structure", which provides a means for isolating each package internal contact point from its associated die-attach contact point (such as a bond pad) so that the potentially-damaging signals present during programming are not applied to the die-attach contact points.

Using the programmable architecture of the present invention to connect such internal contact points to internal contact terminals in a predetermined pattern, and using the programmable contact structures to further connect these internal contact terminals to desired top and bottom external contacts, a user can select the desired connectivity between internal and external contact points. Further, such stackable packages may also be programmed with a user-defined connectivity between associated top and bottom contacts. Then, when such programmed packages are subsequently stacked together, an overall circuit may be created, without an additional two-dimensional interconnecting substrate, by the total user-defined connectivity of all included programmed packages in the stack.

When a vertical stack of programmed packages using this architecture is finally connected together to complete such a circuit system, "tree-like" nets are formed, making the connections between included IC dice. Each net has a "root-like" connection that runs horizontally through the lowest package included in the net; it connects a specified internal contact point, connected to an IC die terminal, to a predetermined top external contact on this package. Each net runs, trunk-like, vertically to the uppermost package needed to complete this net, through all intervening packages via "trunk connections" (connected top/bottom contacts of selected contact structures); each top contact in the net is connected to the corresponding bottom contact on the next-higher package in the stack. In each package which has an internal contact point (and its connected die terminal) that is included in this net, a further "branch" connection runs horizontally through the package from the trunk to the internal contact point. In the uppermost package included in the net, the "top branch" connects an internal contact point only to a bottom contact, with no trunk connection. With this architectural arrangement, multiple unrelated "trees" can be placed atop one another in the same trunk position, providing more routability than would otherwise be available.

DRAWINGS

The described architecture is based on fuse elements and antifuse elements. As described in a preferred embodiment, four fuse types are distinguished; these are "tiny" fuses, "small" fuses, "large" fuses, and "trunk" fuses. According to a presently-preferred embodiment, only one type of antifuse is required.

FIGS. 1a–g show the schematic symbols used herein for each of these most basic programmable elements.

FIG. 1a is a diagram showing the schematic symbols used herein to indicate a tiny fuse element 2, in its unprogrammed (shorted) state 2a and its programmed(open) state 2b.

FIG. 1b is a diagram showing the schematic symbols used herein to indicate a small fuse element 10, in its unprogrammed(shorted) state 10a and its programmed (open) state 10b.

FIG. 1c is a diagram showing the schematic symbols used herein to indicate a large fuse element 20, in its unprogrammed(shorted) state 20a and its programmed (open) state 20b.

FIG. 1d is a diagram showing the schematic symbols used herein to indicate a trunk fuse element 30, in its unprogrammed(shorted) state 30a and its programmed (open) state 30b.

FIG. 1e is a diagram showing the schematic symbols used herein to indicate an antifuse element 40, in its unprogrammed(open) state 40a and its programmed (shorted) state 40b.

FIG. 1f is a diagram showing the schematic symbols used herein to indicate a small three-state element 100, electrically equivalent to a small fuse element and an antifuse element in series, in its unprogrammed(open) state 100A, its programmed (shorted) state 100B and its programmed (open) state 100C. When used at the intersection of two conductors in a schematic, these symbols indicate that the conductors are both continuous but unconnected except as allowed by the small tri-state element, which is placed so as to permit a connection to be made between the two conductors only when the element is in its shorted state 100B.

FIG. 1g is a diagram showing the schematic symbols used herein to indicate a large three-state element 200, electrically equivalent to a large fuse element and an antifuse element in series, in its unprogrammed(open) state 200A, its programmed (shorted) state 200B and its programmed (open) state 200C. When used at the intersection of two conductors in a schematic, these symbols indicate that the conductors are both continuous but unconnected except as allowed by the large tri-state element, which is placed so as to permit a connection to be made between the two conductors only when the element is in its shorted state 200B.

FIG. 2 is a schematic diagram showing a ESD-protected single sequentially-connecting fuse/antifuse ladder network 396 of the present invention, which allows a user to sequentially connect master terminal 60e to each slave terminal 51,53,55,57,59.

Figure 4A:
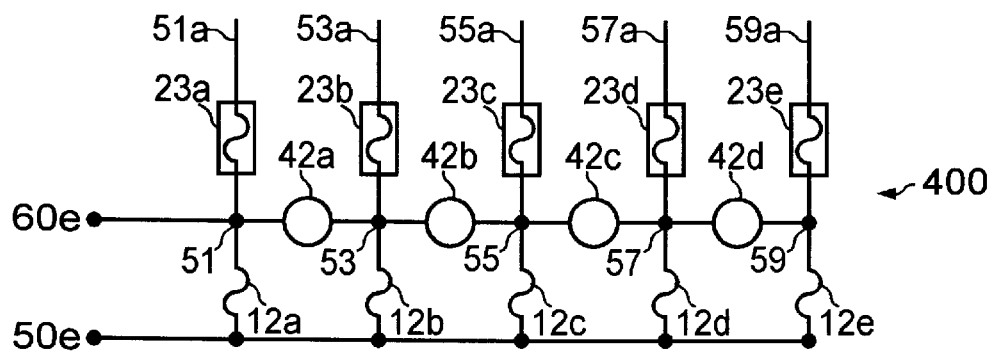
Figure 4B:
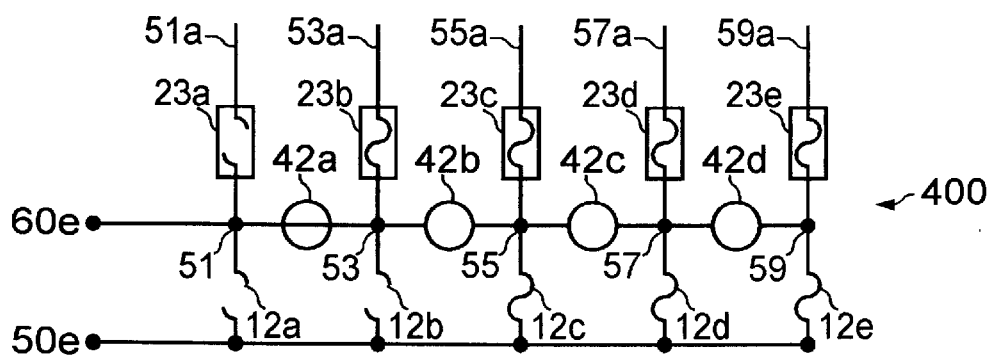
Figure 4C:
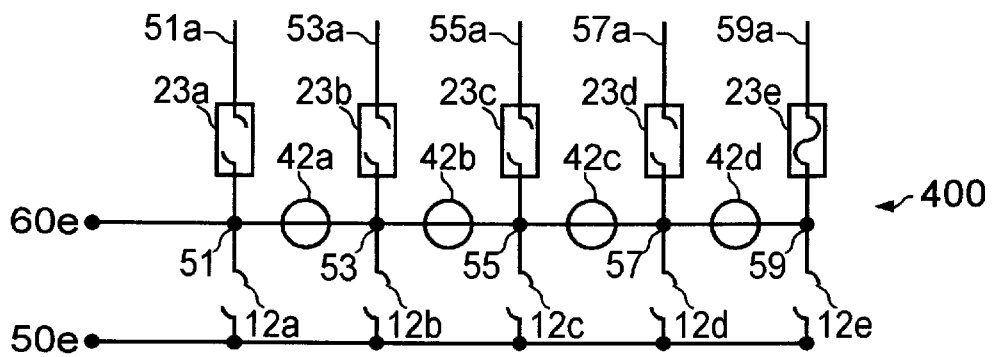

FIGS. 4b,b,c are schematic diagrams showing how third fuses 23a–e, each connecting one of slave terminals 51,53, 55,57,59 to one of second conductors 51a,53a,55a,57a,59a, may be added to ESD-protected single ladder 396 of FIG. 2 to form an ESD-protected sequential-connect/disconnect (segmented) fuse/antifuse ladder network 400; segmented ladder 400 allows a user to sequentially connect master terminal 60e to each second conductor 51a,53a,55a,57a,59a and subsequently disconnect them. Several states of segmented fuse/antifuse ladder network 400 are shown. FIG. 4a shows the initial state of the ladder; FIG. 4b shows an interim programming state of the ladder, when master terminal 60e is connected to slave terminal 53 and (through fuse 23b) second conductor 53a; and FIG. 4c shows the ladder in the state where terminal 60e is connected to last second conductor 59a. Note that an additional electrical connection to the appropriate second conductor is required during programming if any of fuses 23a–c is to be blown.

Figure 5:
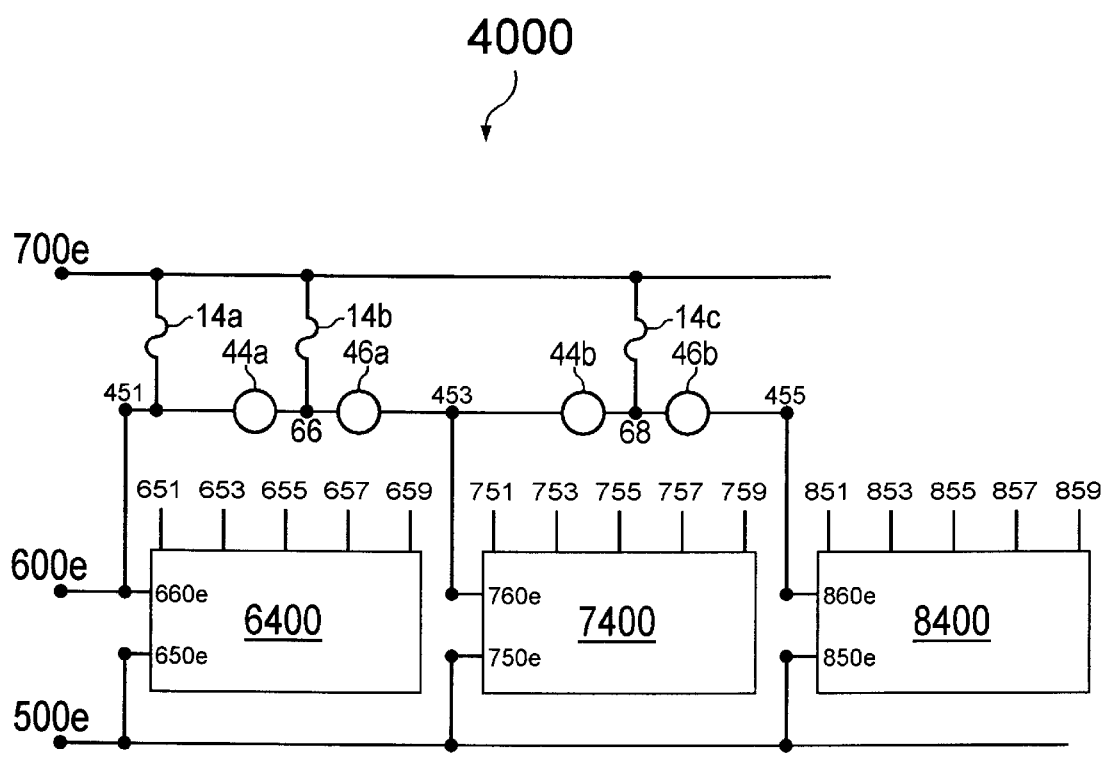

FIG. 5 is a schematic diagram showing an ESD-protected hierarchical assisted ladder network 4000 which combines several single ladders 6400,7400,8400 together into a larger composite structure. Ladders 6400,7400,8400 can be similar to single ladder 396 or segmented ladder network 400. Assisted ladder 4000 has two explicit levels of hierarchy, using double-ladder network 398 of FIG. 3a to connect said single ladders together; and ladder 4000 is protected from ESD damage prior to programming by optional ESD fuse 14a.

FIG. 6 is a schematic diagram showing a prior-art surface-acoustic-wave (SAW) transducer.

FIG. 7a is a schematic diagram showing how segmented fuse/antifuse ladder 400 of FIG. 4a may be augmented by terminals 62e; 64e controlling segmentation assist rails 62;64 and terminal 69e controlling first conductor 69, which are linked, by small tri-state elements 121,123,125,127, 129;141,143,145,147,149 and large tri-state elements 211, 213,215,217,219, respectively, to said second conductors; this creates a structure which is capable of connecting second terminal 60e to each of second conductors 51a,53a, 55a,57a,59a in sequence, and which also provides a means for disconnecting each second conductor from second terminal 60e. As an example of how such a structure might be used, a programmable SAW interdigital transducer 2000 is presented, where said second conductors comprise transducer fingers which may be connected to either a first or second transducer terminal by programming the described structure.

Figure 7B:
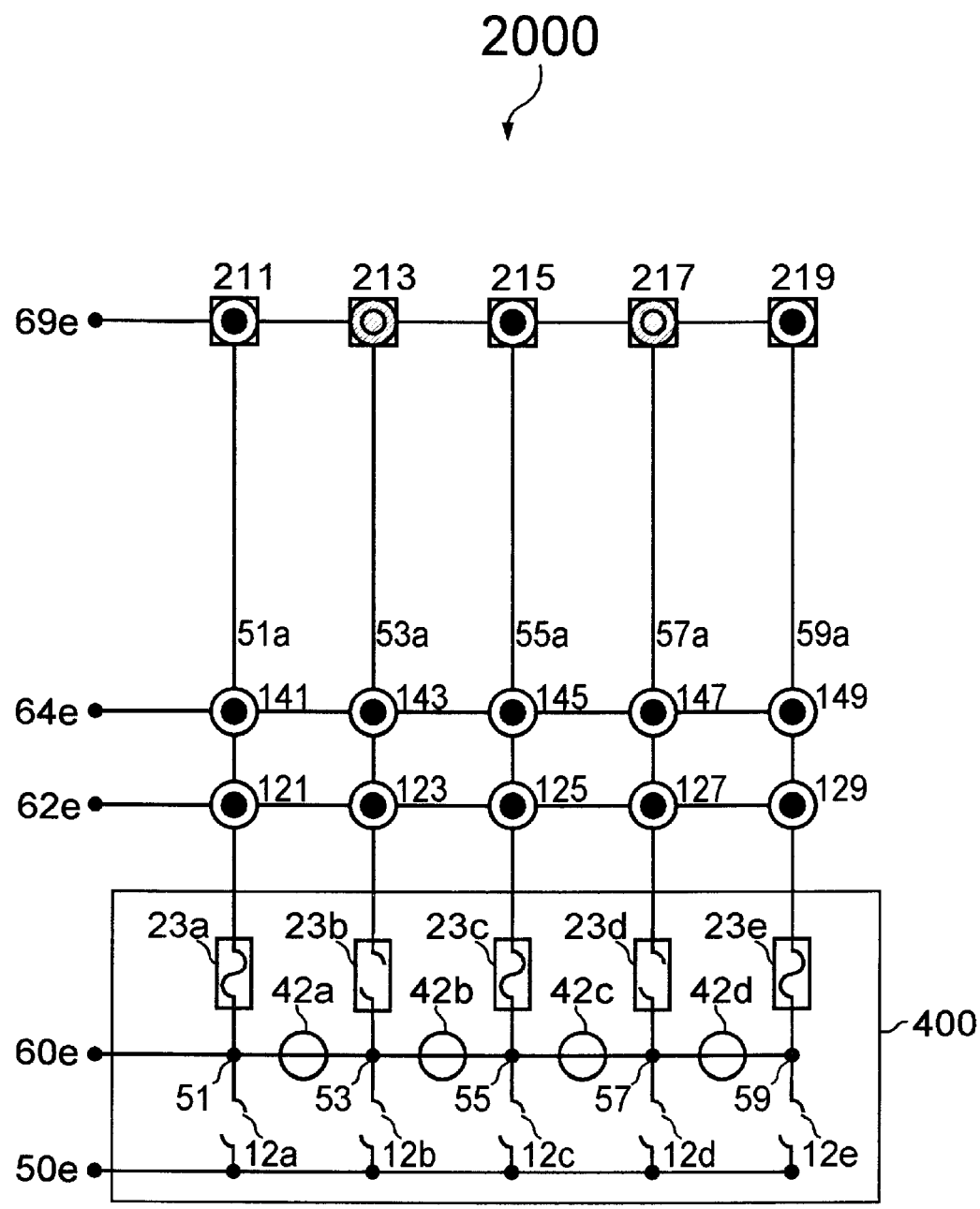

FIG. 7b shows programmable SAW transducer 2000 after it has been programmed to match the connection pattern of the prior-art SAW transducer of FIG. 6.

Figure 8:
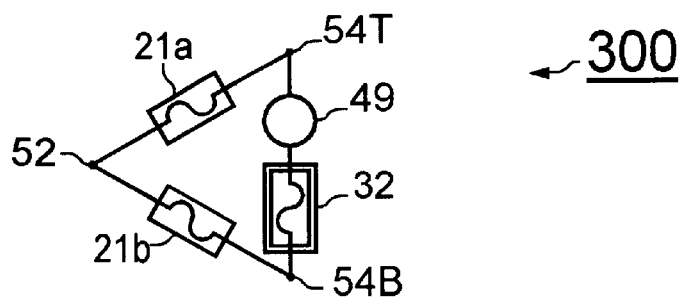

FIG. 8 is a diagram showing a schematic representation of a programmable external contact structure 300 of the current invention, in the unprogrammed state. Said external contact structure provides three potential connection paths between internal contact terminal 52 which is generally located inside the package, bottom contact 54B on a bottom surface of the package, and top contact 54T on the top surface of the package. Terminals 52 and 54T are connected by fuse 21a; terminals 52 and 54B are connected by fuse 21b; and terminals 54B and 54T are connected by trunk fuse 32 in series with antifuse 49.

FIGS. 9a–f are schematic diagrams of a contact structure of the current invention, in the six allowed programmed states.

Figures 9A, 9B, 9C:
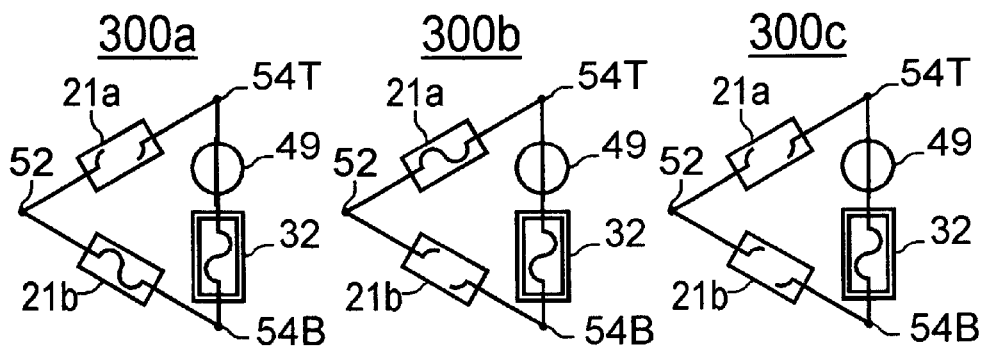

FIGS. 9a shows the contact structure in the first programmed state, wherein internal contact terminal 52 is connected, through fuse 21b, to bottom external contact 54B; bottom contact 54B is connected to top contact 54T through trunk fuse 32 and shorted antifuse 42.

FIG. 9b shows the contact structure in the second programmed state, wherein internal contact terminal 52 is connected, through fuse 21a, to top external contact 54T; bottom contact 54B is connected to top contact 54T through trunk fuse 32 and shorted antifuse 42.

FIG. 9c shows the contact structure in the third programmed state, wherein internal contact terminal 52 is not connected to either external contact; bottom contact 54B is still connected to top contact 54T through trunk fuse 32 and shorted antifuse 42.

Figures 9D, 9E, 9F:
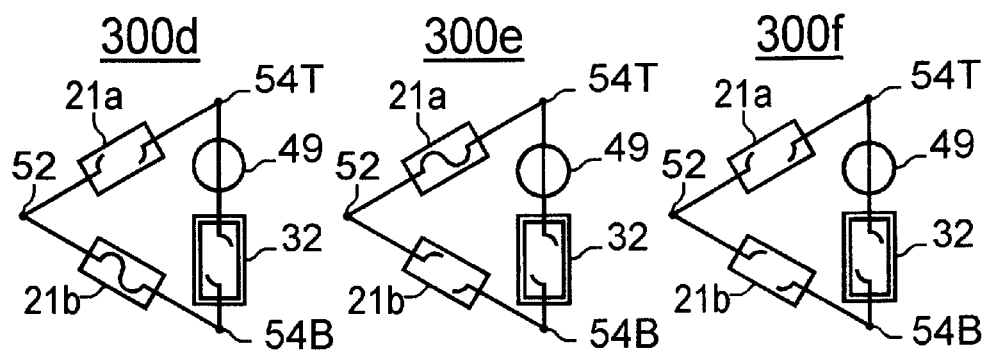

FIG. 9d shows the contact structure in the fourth programmed state, wherein internal contact terminal 52 is connected, through fuse 21b, to bottom external contact 54B, bottom and top external contacts 54B and 54T are electrically isolated from one another.

FIG. 9e shows the contact structure in the fifth programmed state, wherein internal contact terminal 52 is connected, through fuse 21a, to top external contact 54T; bottom and top external contacts 54B and 54T are electrically isolated from one another.

FIG. 9f shows the contact structure in the sixth programmed state, wherein internal contact terminal 52, bottom contact 54B and top contact 54T are all isolated from one another.

Figure 10:
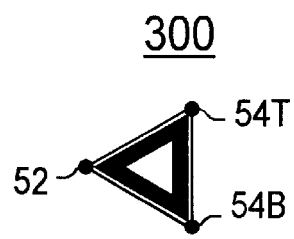
Figure 11A:
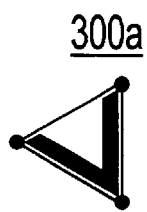
Figure 11B:
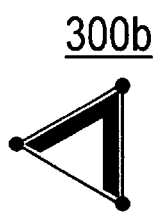
Figure 11C:
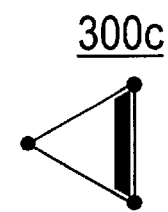
Figure 11D:
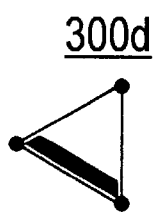
Figure 11E:
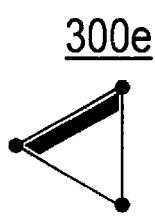
Figure 11F:
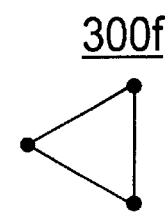

FIG. 10 is a schematic diagram showing the simplified symbol used herein to represent the unprogrammed contact structure shown in detail in FIG. 8.

FIGS. 11a–f are schematic diagrams showing the simplified symbols used herein to represent the contact structure of the current invention, in its six allowed programmed states. The symbols shown in FIGS. 11a–f correspond to the detailed programmed states shown in FIGS. 9a–f, respectively.

Figure 12A:
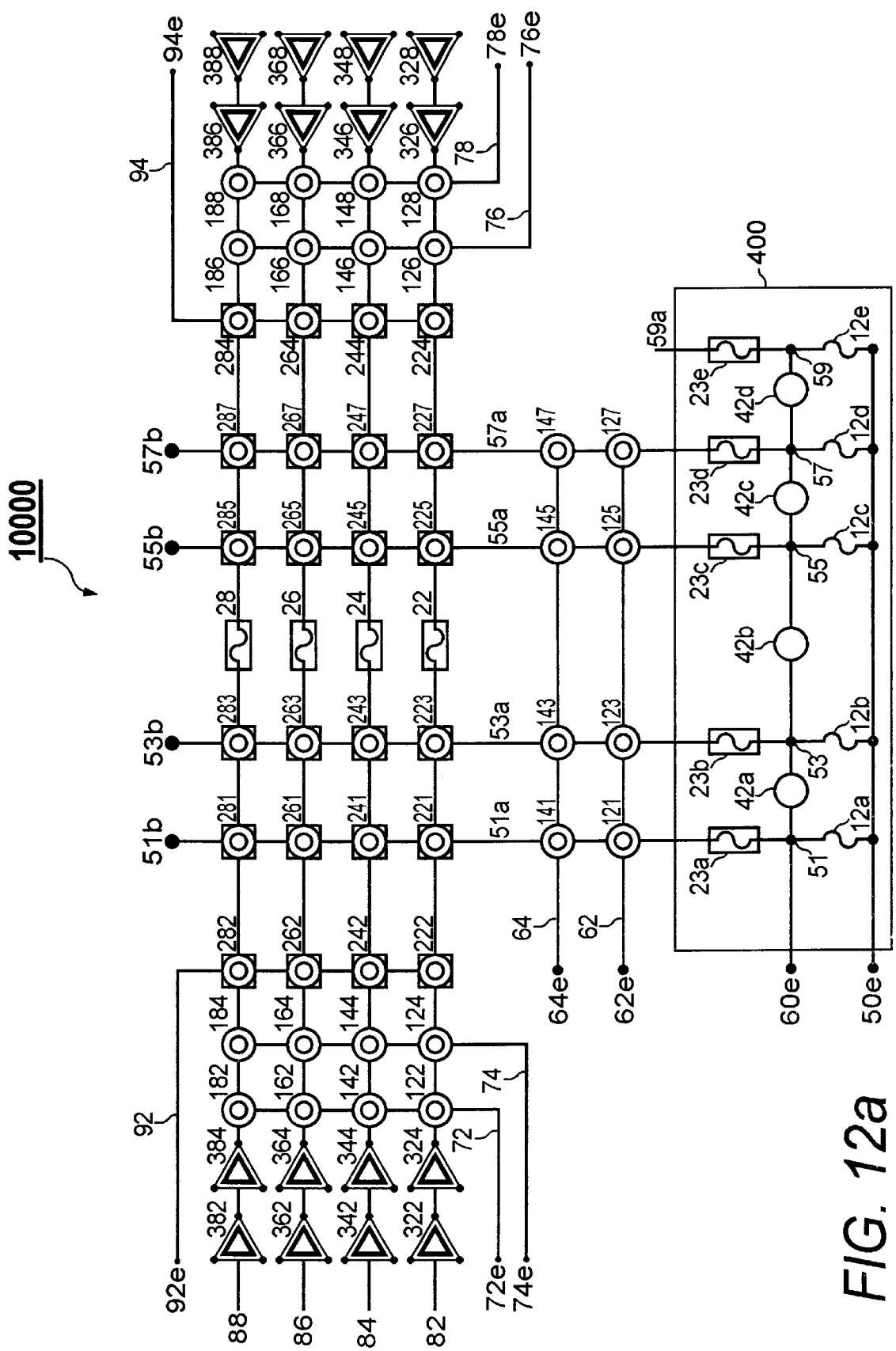

FIG. 12a is a schematic diagram showing a small programmable interconnection matrix 10000 of the present invention. This example matrix incorporates four internal contact points which may be programmably connected through the matrix to the top and/or bottom contacts of sixteen provided external contact structures. Matrix 10000 requires an external means (such as a conductive foil attached to the package external contacts prior to programming) to short the matrix conductors together for ESD protection.

Figure 12B:
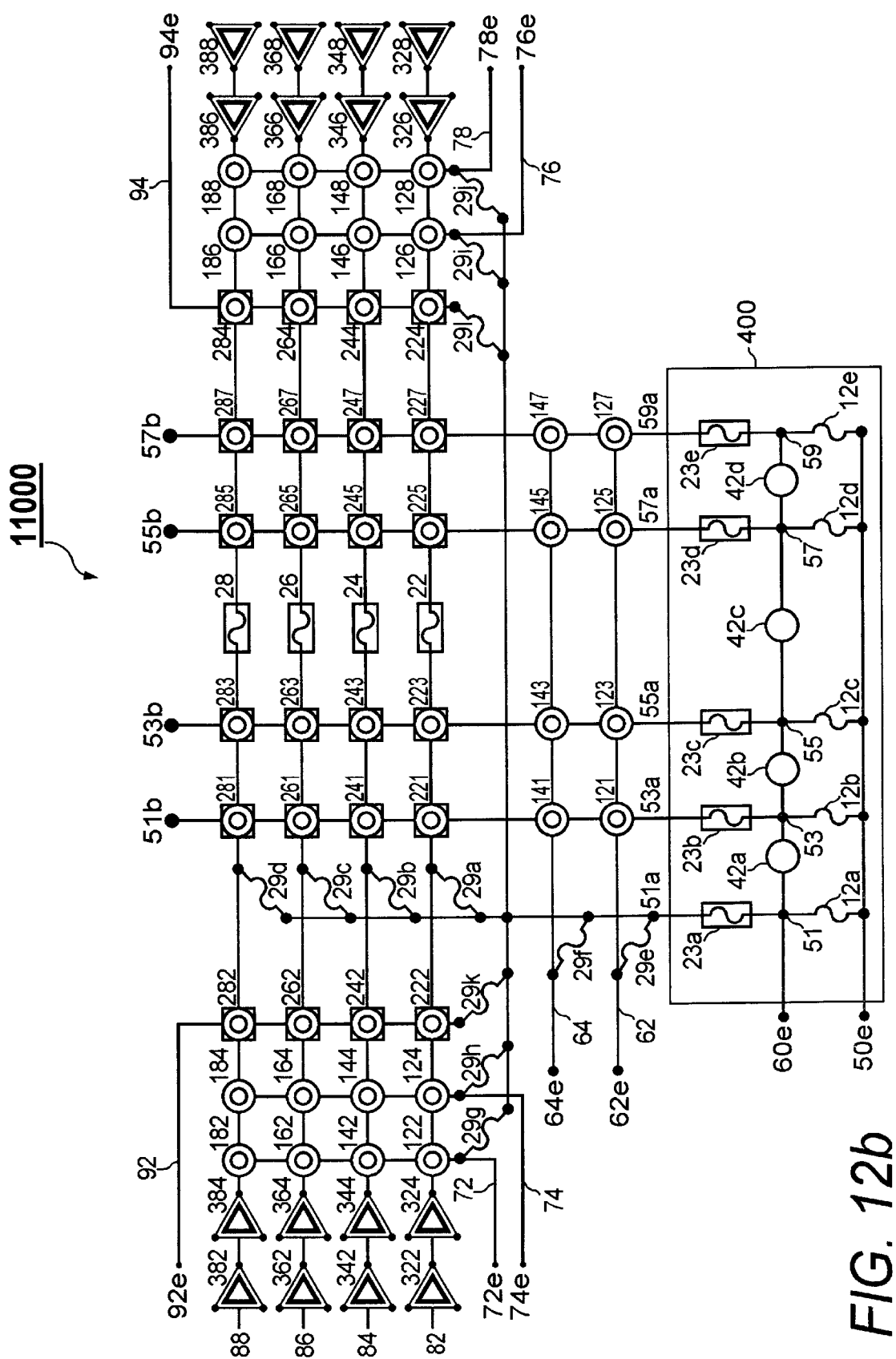

FIG. 12b is a schematic diagram showing a slightly-modified programmable interconnection matrix 11000 of the present invention. Matrix 11000 is protected against ESD damage by fuse elements shorting the matrix conductors together prior to programming; this form might be used if no external means to short the matrix conductors were available. Otherwise, matrix 11000 is functionally equivalent to matrix 10000.

Figure 13:
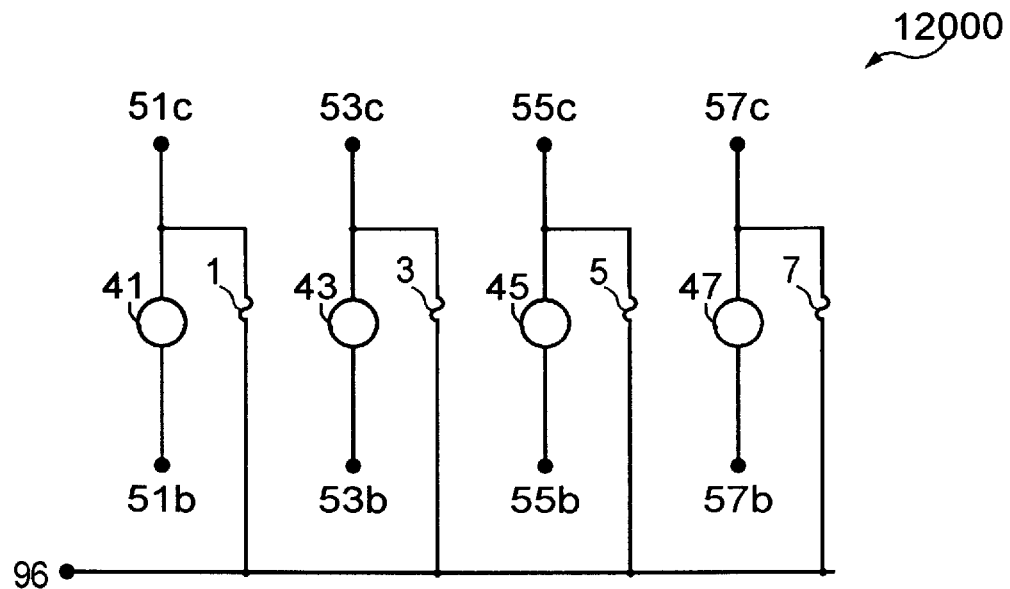

FIG. 13 is a schematic diagram of an optional "die isolation structure" 12000 of the present invention, which provides a means of isolating the die contact points from the package internal contact points during the programming of matrix 10000. This addition to the architecture of FIG. 12a allows programming of the architecture after package assembly, including mounting of the integrated circuit die into the die cavity, electrical connection of the die, and sealing the package.

Figure 14:
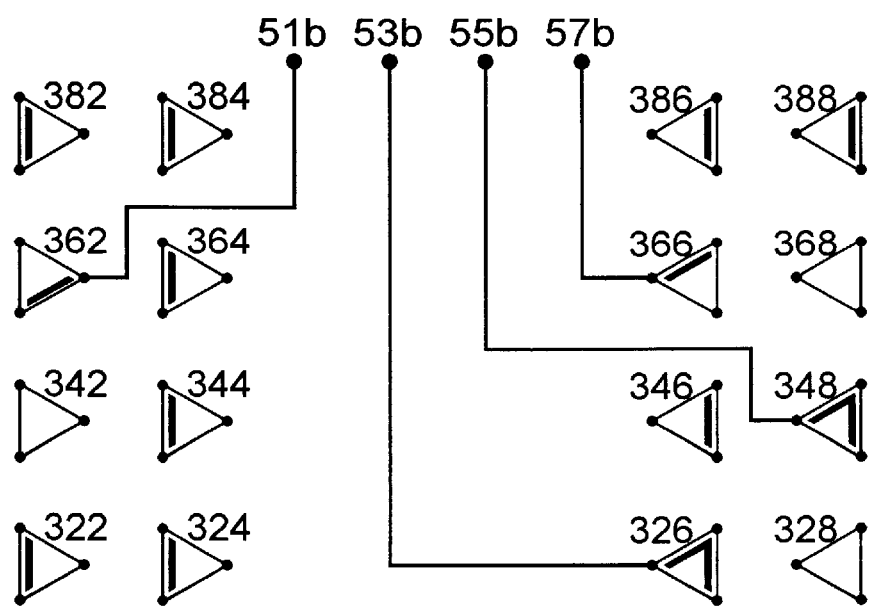

FIG. 14 is a schematic diagram showing one possible desired final configuration of the interconnection matrix of FIG. 12a.

FIGS. 15a–e are schematic diagrams of the architecture of FIG. 12a, in progressive intermediate programmed states.

Figure 15A:
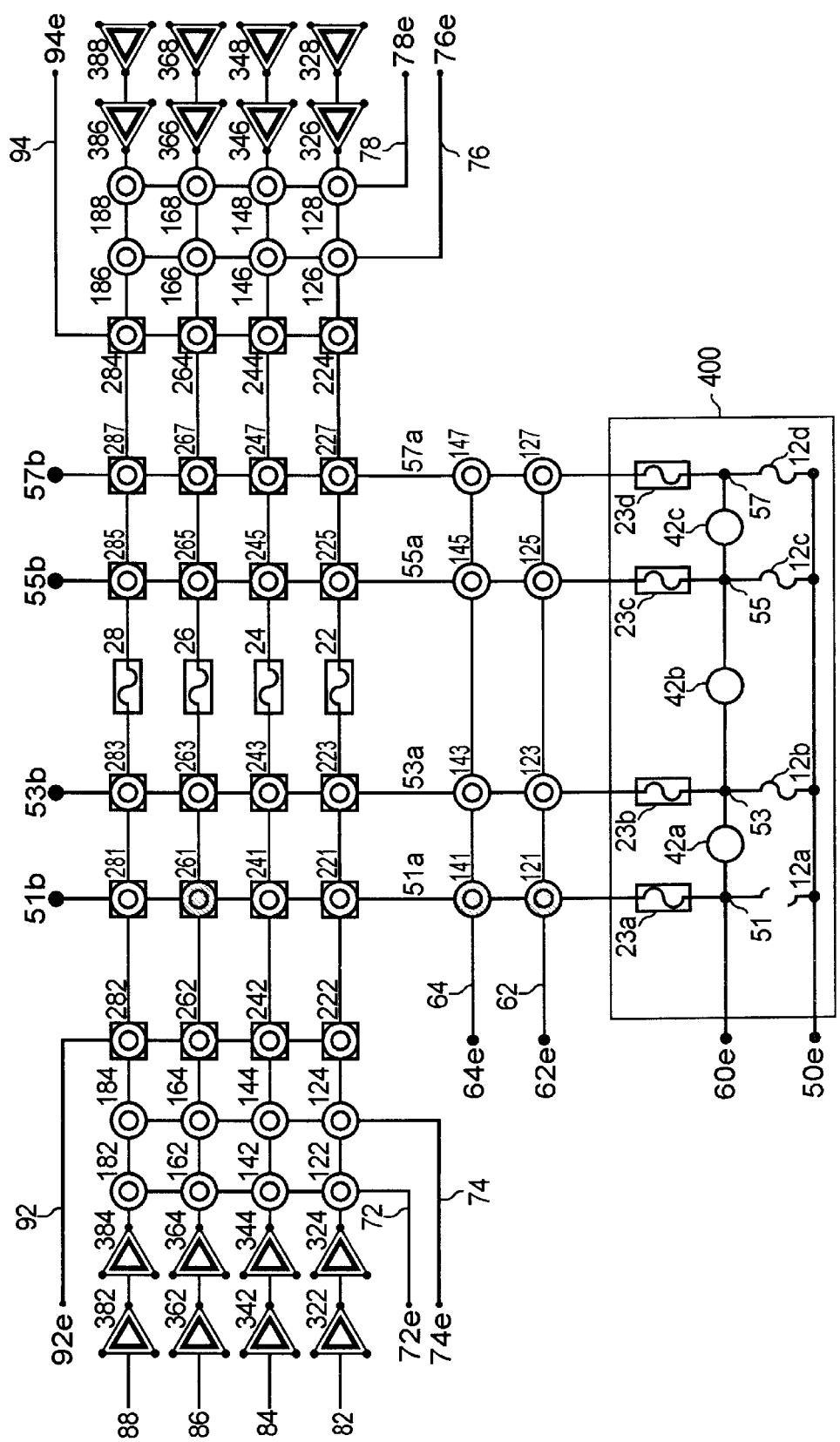
Figure 15B:
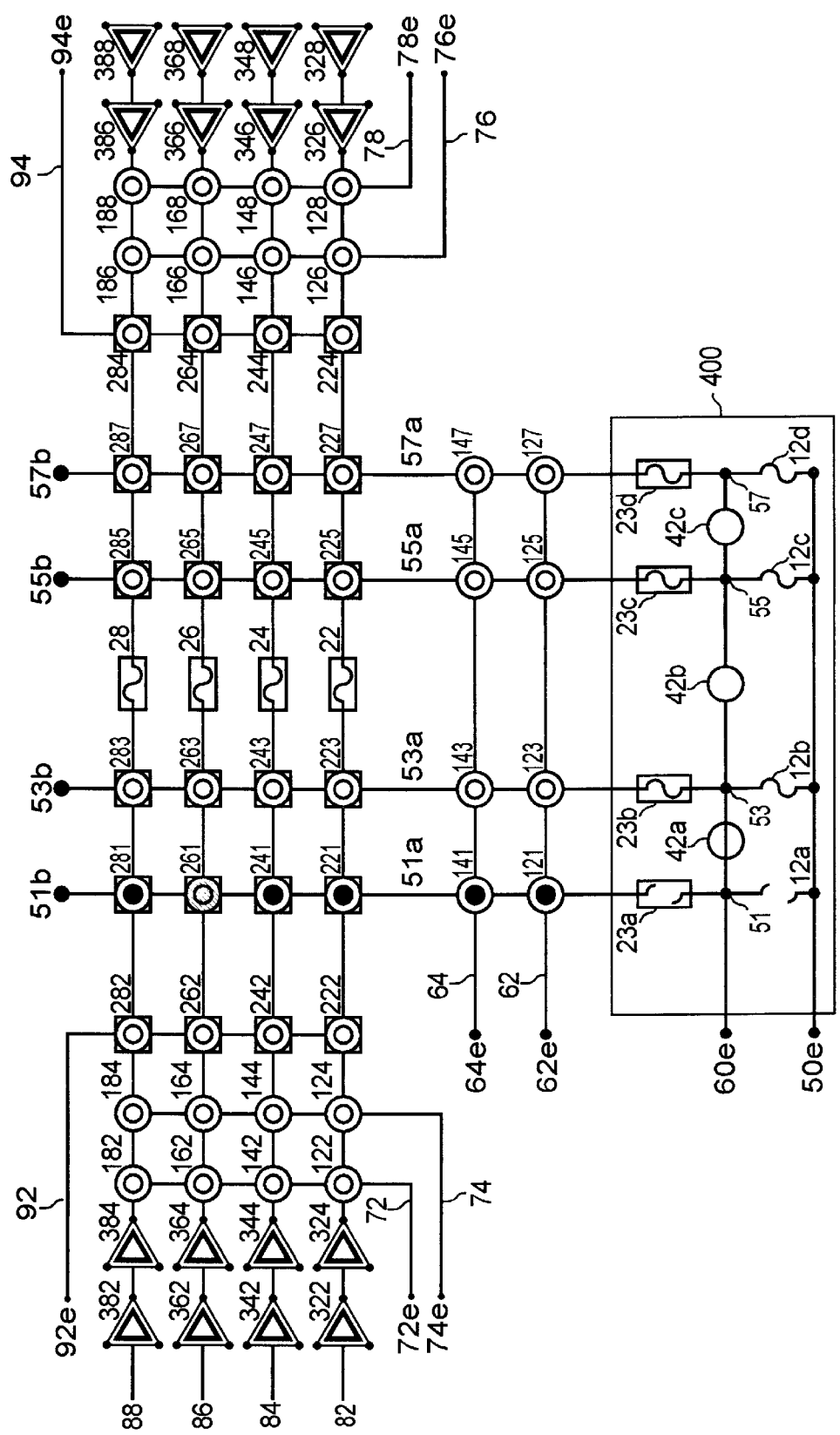
Figure 15C:
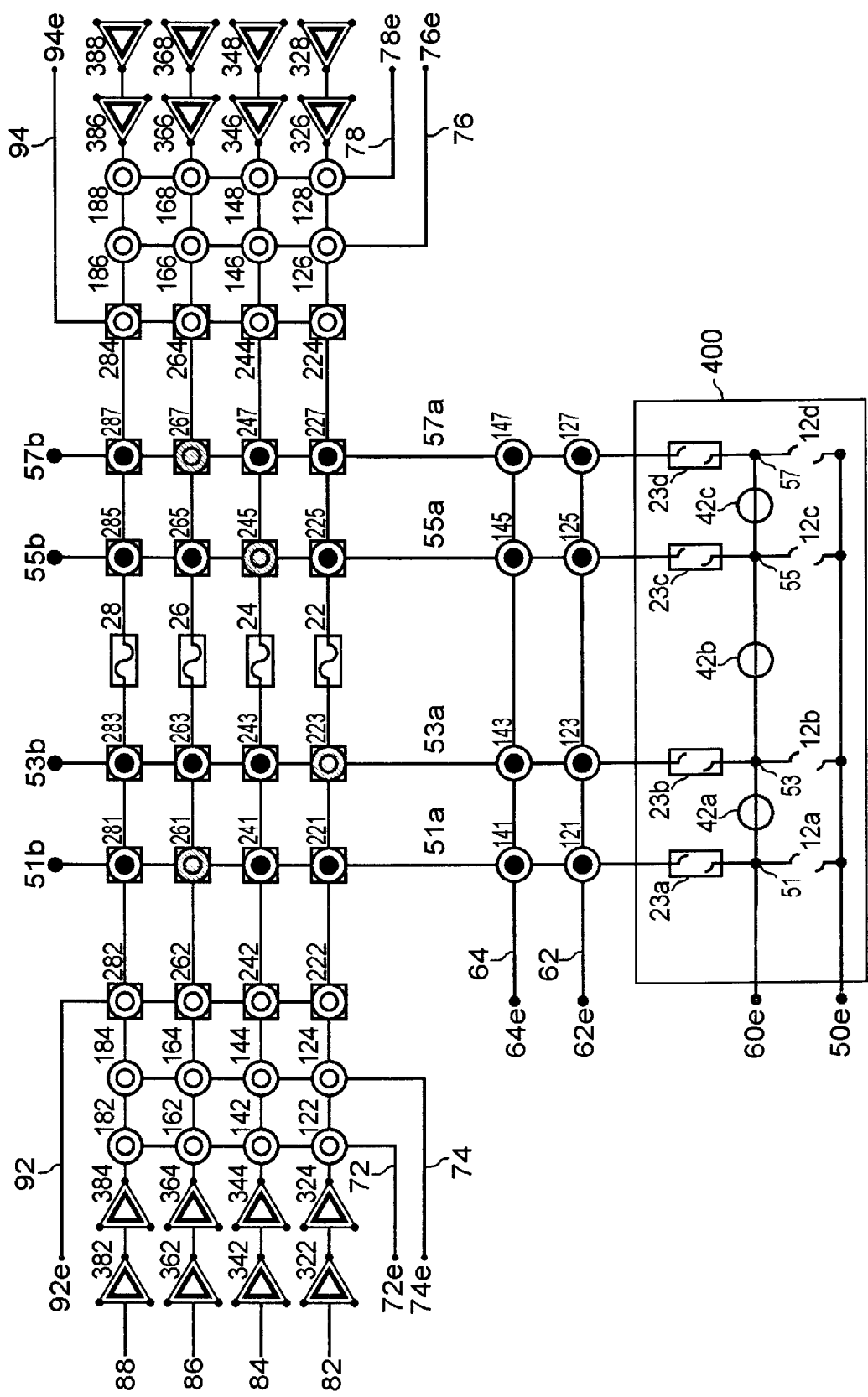
Figure 15D:
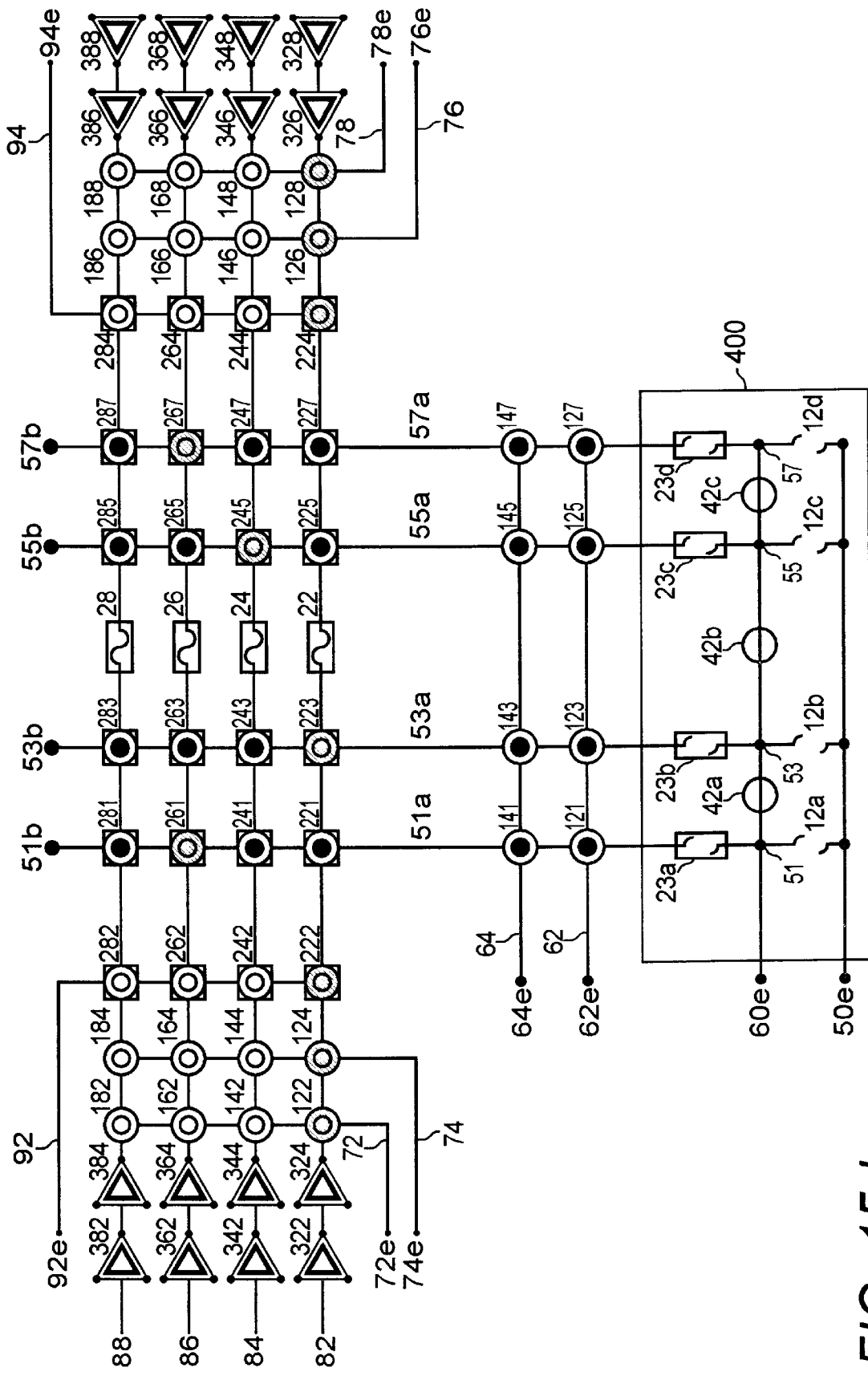
Figure 15E:
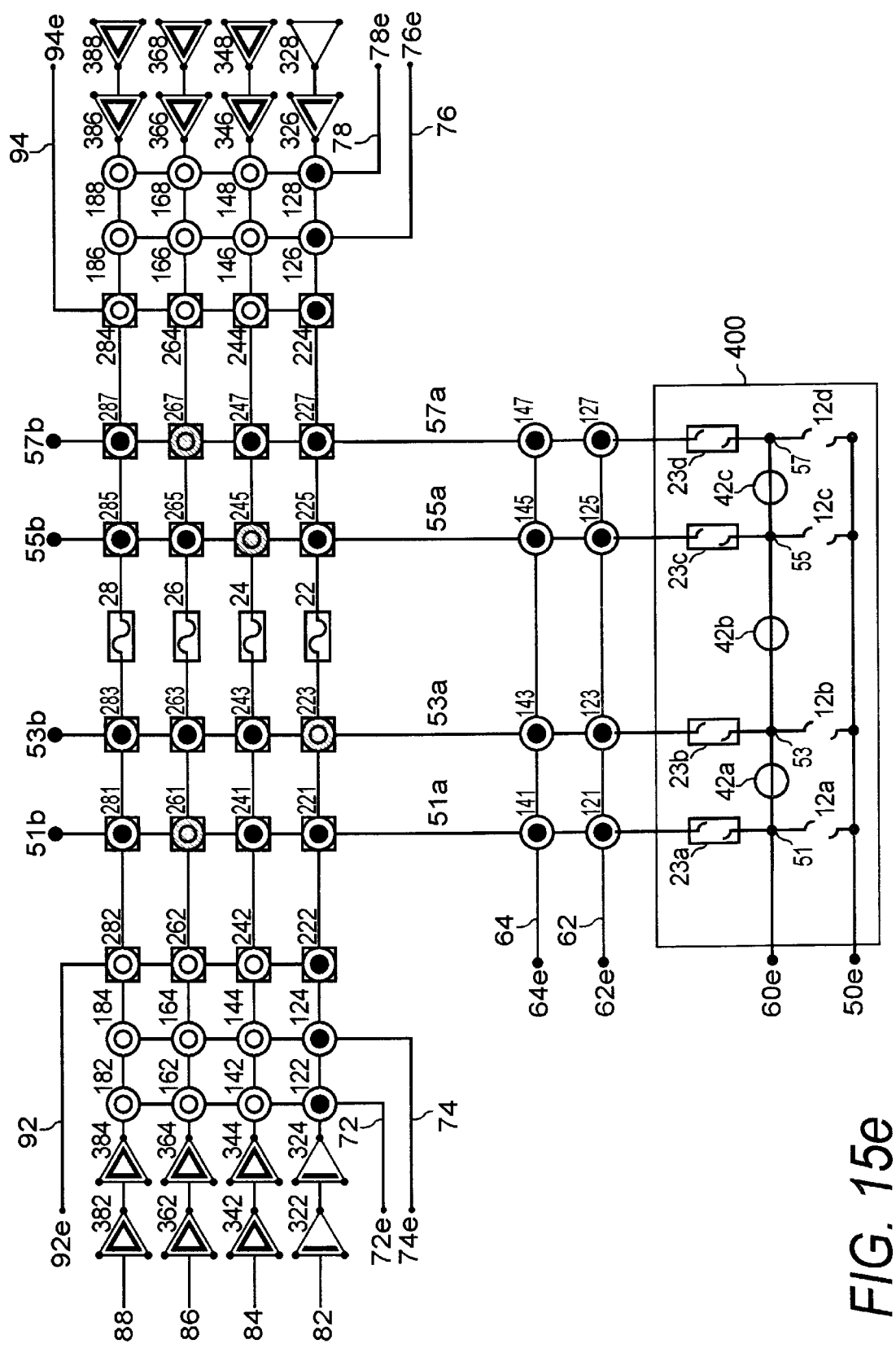
Figure 15F:
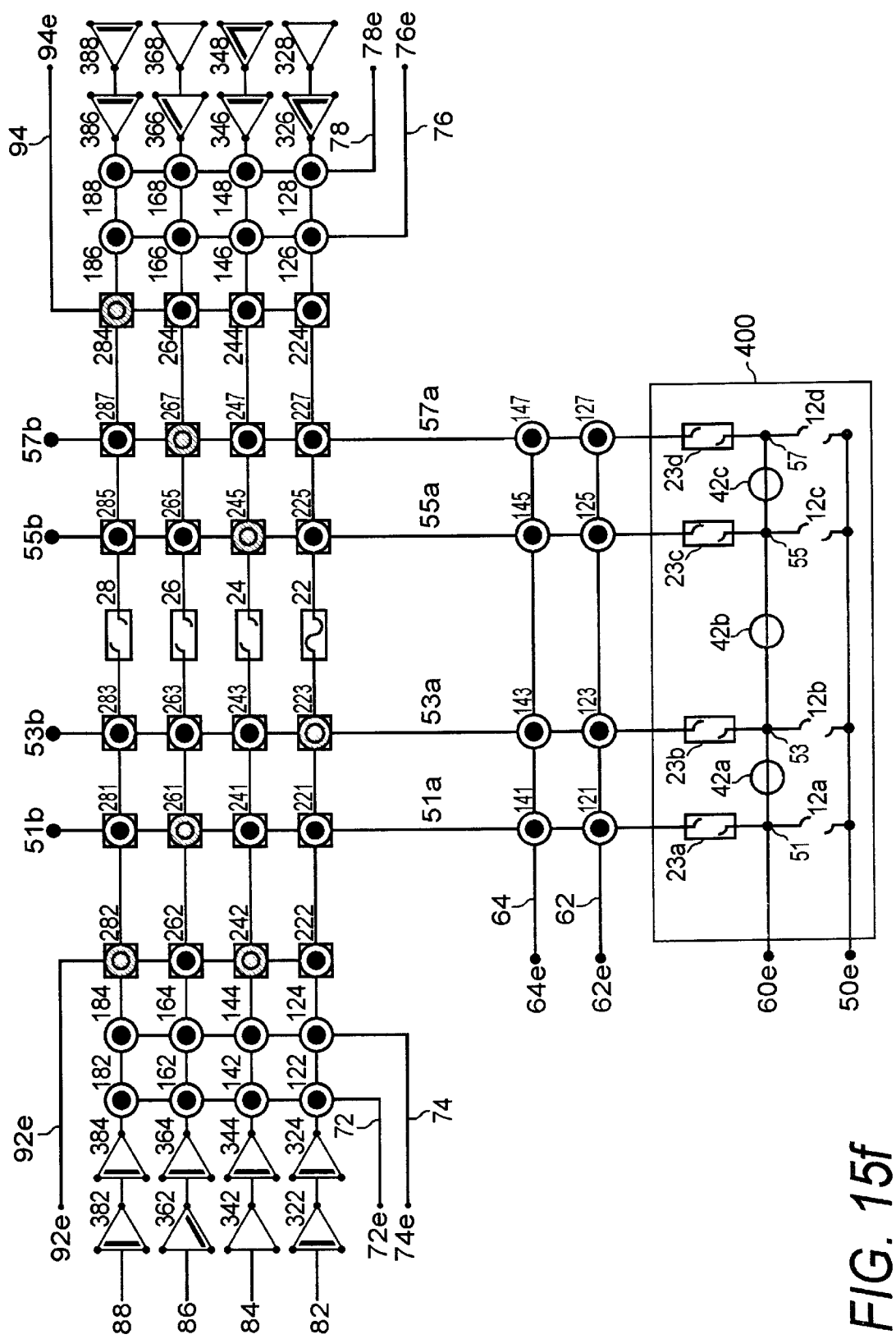

FIG. 15f shows the architecture in the final programmed state, when the desired connectivity of FIG. 14 has been attained.

REFERENCE NUMERALS IN DRAWINGS 1,3,5,7
   Tiny fuses, in die isolation structure 12000, which connect die-attach contact points 51c, 53c, 55c, 57c, in a "die-included" programming scheme, to sixth conductor 96
2
   Tiny fuse element in: (2a) initial (shorted) state; and (2b) programmed (open) state
10
   Small fuse element in: (10a) initial (shorted) state; and (10b) programmed (open) state
12a,b,c,d,e
   First fuse elements in single ladder network 396
14a,b,c
   Second fuse elements in assisted double-ladder 398. Fuses 14b,c control the voltages of intermediate antifuse terminal connections 66,68; optional ESD fuse 14a connects the second and third ladder control terminals of ladder 398 prior to programming
16a,b,c
   First fuse elements in double-ladder 397
20
   Large fuse element in: (20a) initial (shorted) state; and (20b) programmed (open) state
21a,b
   Large fuse elements connecting top and bottom contacts 54T and 54B in contact structure 300 to their associated internal contact terminal 52
22,24,26,28
   Large fuse elements, segmenting first conductors 82,84, 86,88 in matrix 10000
23a,b,c,d,e
   Segmentation fuses, added to single ladder 396 to form segmented ladder 400
29a,b,c,d,e, f,g,h,i,j,k,l
   "ESD" fuse elements included in matrix 11000 which connect first; third; fourth; and fifth conductors 82,84, 86,88; 62,64; 72,74,76,78; and 92,94, respectively, to ESD rail 51 before programming is initiated
30
   Trunk fuse element in: (30a) initial (shorted) state, and (30b) programmed (open) state
32
   Trunk fuse element connecting top and bottom contacts 54T and 54B of contact structure 300
40
   Antifuse element in: (40a) initial (open-circuit) state; and (40b) programmed (shorted) state
41,43,45,47
   Antifuses elements in die isolation structure 12000, which connect package internal contact points 51b, 53b,55b, 57b, in a "die-included" programming scheme, to die-attach terminals 51c,53c,55c, 57c, respectively
42a,b,c,d
   Antifuse elements in fuse/antifuse ladder network 396
44a,44b, 46a,46b
   Antifuse elements in double-ladder network 397
49
   Antifuse element linking top and bottom contacts of contact structure 300
50e
   First "ground" control terminal of fuse/antifuse ladder network 396
52
   Common "internal contact terminal" of contact structure 300
51,53,55,57,59
   Plurality of slave terminals of ladder 396
51a,53a,55a,57a,59a
   Plurality of second conductors of segmented ladder 400
51b,53b,55b,57b
   Terminals of matrix 10000—package internal contact points
51c,53c,55c,57c
   Die-attach contact points for making electrical connections to die in package, such as bondpads or solder bumps, which are isolated from package internal contact points 51b,53b,55b,57b by antifuses 41, 43, 45, 47 in die-isolation structure 12000
54B,54T
   Bottom and top external contacts, respectively, of contact structure 300
60e
   Second "master" control terminal of fuse/antifuse ladder network 396
62,64
   Third conductors, used as segmentation assist rails in programming second conductors controlled by a ladder of the present invention

62e,64e
  Third terminals, controlling third conductors 62,64
66,68
  Intermediate antifuse terminal connections between pairs of antifuses in double-ladder 397
69
  First conductor or connect rail of programmable SAW transducer 2000
69e
  Second SAW terminal of programmable SAW transducer 2000, controlling first conductor 69
72,74,76,78
  Fourth conductors, used as assist rails to help program first conductors 82,84,86,88 in programmable interconnection matrices 10000,11000
72e,74e,76e,78e
  Fourth terminals controlling assist rails 72,74,76,78
82,84,86,88
  First conductors in programmable interconnection matrices 10000,11000
92,94
  Fifth conductors in programmable interconnection matrix 10000, used as assist rails during programming and as "ground" rails after programming
92e,94e
  Fifth terminals controlling assist rails 92,94
96
  Sixth conductor, used as a "die protection rail" in die-isolation structure 12000 when the die is attached to the architecture before programming
96e
  Sixth terminal controlling die protection rail 96 in die-isolation structure 12000
100
  Small three-state interconnection elements in: (100A) initial (open) state; (100B) first programmed (shorted) state; (100C) second programmed (open) state
121,123,125,127,129, 141,143,145,147,149
  Small three-state elements, linking segmentation assist rails 62,64 to second conductors 51a,53a,55a,57a,59a, respectively
122,142,162,182 124,144,164,184
  Small three-state elements in programmable interconnection matrix 10000, linking assist rails 72,74 to first conductors 82,84,86,88
126,146,166,186 128,148,168,188
  Small three-state elements in programmable interconnection matrix 10000, linking assist rails 76,78 to first conductors 82,84,86,88
200
  Large three-state element in: (200A) initial (open) state; (200B) first programmed (shorted) state; (200C) second programmed (open) state
211,213,215,217,219
  Large three-state elements in programmable SAW transducer 2000, linking first conductor 69 to second conductors 51a,53a,55a,57a,59a
221,223,225,227, 241,243,245,247, 261,263,265,267, 281, 283,285,287
  Large three-state elements in programmable interconnection matrix 10000, which may be selectively programmed to connect ones of second conductors 51a, 53a,55a,57a to ones of first conductors 82,84,86,88
222,242,262,282 224,244,264,284
  Large three-state elements in programmable interconnection matrix 10000, linking ground assist rails 92,94 to first conductors 82,84,86,88
300
  Contact structure of the current invention, including a top-surface external contact 54T, a bottom surface external contact 54B, and an internal contact terminal 52
300a
  Programmed contact structure with internal contact terminal 52 connected to bottom contact 54B, and bottom contact 54B connected to top contact 54T
300b
  Programmed contact structure with internal contact terminal 52 connected to top contact 54T, and bottom contact 54B connected to top contact 54T
300b
  Programmed contact structure with internal contact terminal 52 connected to top contact 54T, and bottom contact 54B connected to top contact 54T
300c
  Programmed contact structure with internal contact terminal 52 isolated, and bottom contact 54B connected to top contact 54T
300d
  Programmed contact structure with internal contact terminal 52 connected to bottom contact 54B
300e
  Programmed contact structure with internal contact terminal 52 connected to top contact 54T
300f
  Programmed contact structure with internal contact terminal 52, bottom contact 54B, and top contact 54T all isolated from one another
322,342,362,382 324,344,364,384 326,346,366,386 327, 348,368,388
  External contact structures in programmable interconnection matrix 10000, which may be programmably connected in one of six configurations to first conductors 82,84,86,88
396
  ESD-protected sequentially-connecting fuse/antifuse single ladder network
397
  ESD-protected basic double-ladder network
398
  ESD-protected assisted double-ladder network
400
  ESD-protected, segmented ladder network, formed by adding fuses 23a–e and second conductors 51a–59a to single ladder 396
450e
  First "ground" ladder control terminal of double ladder 397
451,453,455
  Plurality of slave terminals in double ladders 397
460e
  Second "master" ladder control terminal of double ladder 397
470e
  Third ladder control terminal of ESD-protected assisted double ladder 398, connected to terminal 460e and intermediate antifuse terminal connections 66,68 by fuses 14a,b,c

490,492
  First and second terminals of prior-art SAW transducer
491,493,495,497,499
  Metal fingers or "taps" of example prior-art SAW transducer
500e,600e,700e
  First, second, and third ladder control terminals of hierarchical ladder 4000
650e,660e
  First and second control terminals of segmented ladder 6400
750e,760e
  First and second control terminals of segmented ladder 7400
850e,860e
  First and second control terminals of segmented ladder 8400
2000
  Programmable SAW transducer of the present invention
4000
  Hierarchical fuse/antifuse ladder network of the present invention, combining several smaller single ladders 6400,7400,8400
6400,7400,8400
  First, second, and third segmented ladder networks
10000
  Small example of a programmable interconnection matrix of the present invention, suitable for incorporation into a stackable, programmable IC package
11000
  Modified version of interconnection matrix 10000, with an ESD rail incorporated to ensure that no unprogrammed antifuses or three-state elements experience voltage disturbances prior to programming
12000
  Small architecture modification to matrix 10000 which allows a package to be programmed even after a die is inserted into the package and connected to the package internal contact points Glossary of Unusual Technical Terms
Antifuse—Two terminal device which, when unprogrammed, does not electrically connect its two terminals together, but which does connect them together when programmed (typically by a programming process including at least a step of applying a programming voltage Vpp, characteristic of the antifuse manufacturing process, across its two terminals)
ASIC—Application Specific Integrated Circuit
CPU—Central Processing Unit
ESD—Electrostatic Discharge
EPROM—Electrically Programmable Read Only Memory
FPGA—Field Programmable Gate Array
IC—Integrated Circuit
PC—Personal Computer
SAW—Surface Acoustic Wave
"Single" Ladder—Ladder network wherein a single antifuse separates each slave terminal from the next
"ESD-protected" Ladder—Ladder network with a programmable, initially-shorted element connected between its first and second control terminals
"Double" Ladder—Ladder network wherein a pair of series-connected antifuses separates each slave terminal from the next
"Assisted" Ladder—Ladder network wherein each slave terminal is separated from the next by two or more antifuses in series, (so one or more intermediate antifuse terminal connection between these antifuses is formed), wherein one or more additional "intermediate assist" ladder control terminals, and second fuses linking the intermediate antifuse terminal connections to the intermediate assist terminal(s), control the voltages of these intermediate antifuse terminal connections during programming; an assisted ladder, despite its being a double, triple, or N-tuple ladder, may still be programmed without requiring voltages greater than Vpp
Hierarchical Ladder—Ladder network wherein each rung contains at least two antifuses in series, wherein at least one fuse element has been replaced by a further ladder network

DETAILED DESCRIPTION

Description—FIGS. 1a–g—Basic Building Blocks: Electrically-Programmable Elements The embodiments of the present invention described herein employ three different basic types of electrically programmable interconnection elements. All of these interconnection elements are passive, i.e., they do not employ active semiconductor devices.

The first basic type of interconnection element used is a fuse element. A fuse is a programmable structure with two terminals, which initially electrically connects its terminals together, but which, when program med, electrically disconnects them from one another. Typically, a fuse element is programmed by passing a predetermined current through it for a time sufficient to open the fuse.

In the following descriptions and embodiments, four distinct fuse elements are defined. These fuses will normally be fabricated using the same technology, but in general may be of different sizes and thus programmable using different programming currents. In a presently-preferred embodiment, the smallest fuse element, hereinafter called the "tiny fuse", programs at a current $$I_{prog}^{tiny}.$$

FIG. 1a shows the schematic symbols used for a tiny fuse 2; unprogrammed (shorted) small fuse 2a may be programmed by passing current $$I_{prog}^{tiny}$$

through it for a predetermined time, which results in programmed (open) small fuse 2b. Another fuse element, hereinafter called the "small fuse", programs at a current $$I_{prog}^{small}.$$

FIG. 1b shows the schematic symbols used for a small fuse 10; unprogrammed (shorted) small fuse 10a may be programmed by passing current $$I_{prog}^{small}$$

through it for a predetermined time, which results in programmed (open) small fuse 10b. The next fuse element, hereinafter called the "large fuse", programs at a current $$I_{prog}^{large}.$$

FIG. 1c shows the schematic symbols used for a large fuse 20; unprogrammed (shorted) large fuse 20a may be programmed by passing current $$I_{prog}^{large}$$

through it for a predetermined time which results in programmed (open) large fuse 20b. According to a presently-preferred embodiment, current $$I_{prog}^{large}$$

is always larger in magnitude than current $$I_{prog}^{small}.$$

A final fuse element, hereinafter called the "trunk fuse", programs at a current $$I_{prog}^{trunk}.$$

FIG. 1d shows the schematic symbols used for a trunk fuse 30; unprogrammed (shorted) trunk fuse 30a may be programmed by passing current $$I_{prog}^{trunk}$$

through it for a predetermined time, which results in programmed (open) large fuse 30b. The current $$I_{prog}^{trunk}$$

may be larger in magnitude than $$I_{prog}^{large}.$$

but in general the two currents are not related by any architecture-required rule. For ease of discussion, programming of any of these fuse elements by passing the appropriate current through it for a predetermined time will hereinafter be referred to as "blowing" the fuse. Programming of the various fuses included in the presently-preferred embodiment of the current invention is characterized by these several programming currents associated with the various fuse types:

$$I_{prog}^{tiny}, I_{prog}^{small}, I_{prog}^{large}, \text{ and } I_{prog}^{trunk}.$$

The second basic type of interconnection element used is an antifuse element. An antifuse is a programmable structure with two terminals, which initially does not electrically connect its terminals together, but which, when programmed, permanently electrically connects its terminals to each other. Typically, an antifuse is programmed through a predetermined electrical process including at least a step wherein a predetermined voltage Vpp is applied across the terminals of the antifuse, where Vpp is a characteristic of the antifuse manufacturing process. Although there is variation in any antifuse manufacturing process, there must be such a characteristic Vpp which is the highest voltage that is applied across the terminals of any antifuse during a programming sequence, and such that it is guaranteed that this voltage is sufficient to initiate programming of any correctly-functioning antifuse. Also, in a matrix of programmable antifuses, it is commonly assumed that the variations in antifuse characteristics are constrained so that the application of a voltage +/−Vpp/2 will be guaranteed not to initiate the programming of any correctly-functioning antifuse. The architectures of the current invention are no exception to this rule. The particular electrical programming process used to program the antifuses herein is beyond the scope of the current invention, and it will be assumed herein only that the antifuses contained in the described programmable structures are manufactured so that. 1) any antifuse can be programmed by the application of an electrical process including a step of applying a voltage of at most Vpp across its terminals; 2) that no other step of the antifuse programming process requires the application of a voltage exceeding Vpp, and; 3) that the application of voltages not exceeding +/−Vpp/2 across the terminals of any unprogrammed antifuse will leave the antifuse unchanged, in its initial unprogrammed state. For simplicity, the electrical antifuse programming process will be referred to hereinafter simply as a "predetermined shorting process" or "antifuse shorting process", with characteristic programming voltages of Vpp (guaranteed antifuse programming) and Vpp/2 (guaranteed antifuse non-programming).

Only one antifuse type is needed in the present invention; this antifuse element is designed so that any programming current needed to program any of the fuses described herein can pass through a single, properly programmed (shorted) antifuse, without damaging the antifuse. FIG. 1e shows the schematic symbols used for an antifuse 40; unprogrammed (open) antifuse 40a may be programmed using a predetermined shorting process, which results in programmed (shorted) antifuse 40b.

The third basic type of interconnection element used is a two-terminal, three-state element, electrically equivalent to a fuse element and an antifuse element in series, which may in fact be a composite element formed of a fuse and an antifuse connected in series. Such an element has three states; its initial (open) state (equivalent to a state where said fuse and said antifuse are both still unprogrammed), a first (shorted) programmed state (equivalent to a state where said antifuse has been programmed, but said fuse is still unprogrammed); and a second (open) programmed state (equivalent to a state where said antifuse and said fuse have both been programmed). In other words, this programmable "three-state" interconnection element is initially open, but can be shorted using a predetermined shorting process equivalent to an antifuse shorting process, and may be permanently opened again by passing a specified current through it for a predetermined length of time, equivalent to blowing the appropriate fuse element.

FIG. 1f shows the schematic symbols used for a "small three-state element" 100, electrically equivalent to a small fuse element in series with an antifuse element. An unprogrammed (open) small three-state element 100A may be programmed a first time by a predetermined antifuse shorting process; the result is programmed (shorted) small three-state element 100B. Shorted small three-state element 100B can be reprogrammed by applying a small-fuse blowing process, which results in re-programmed (permanently open) small three-state element 100C.

FIG. 1g shows the schematic symbols used for a "large three-state element" 200, electrically equivalent to a large fuse element in series with an antifuse element. An unprogrammed (open) large three-state element 200A may be programmed a first time by a predetermined antifuse shorting process; the result is programmed (shorted) large three-state element 200B. Shorted large three-state element 200B can be reprogrammed by applying a large-fuse blowing process, which results in re-programmed (permanently open) large three-state element 200C.

For ease of discussion, programming of any three-state element to the first programmed state by a predetermined shorting process will hereinafter be referred to as "shorting" the element, and programming the element to the second programmed state by passing the appropriate current through it for a predetermined time will be referred to as "blowing" the element.

Description—How to Combine These Building Blocks into Programmable Networks

At this point, all of the most basic building blocks of the present invention, the programmable elements, have been defined. It is necessary at this point to discuss programming techniques in a matrix containing both antifuses and fuses of different sizes.

The primary limits imposed on programmable architectures by including antifuses have already been mentioned above—prior to and during programming, it must be ensured that: 1) a voltage Vpp can be applied across the terminals of the appropriate antifuse when its programming is desired, without violating any other design criteria; and 2) that no voltage exceeding Vpp/2 is ever applied, during any programming step, across the terminals of any unprogrammed antifuse whose programming is not yet desired. In a row/column matrix containing antifuses or three-state elements connecting the rows and columns at each intersection of a row and column, applying the antifuse-shorting process in accordance with these limitations is fairly straightforward; the user simply applies a voltage of +/−Vpp to the appropriate row (or column) and a voltage of ground to the appropriate column (or row); all other rows and columns are held at +/−Vpp/2 (same polarity as the applied Vpp). Then a voltage of Vpp is present at the intersection of the appropriate row and column, and no more than +/−Vpp/2 is present at any other intersection. Of course, care must be taken to ensure that no other unwanted and unprogrammed antifuse also "sees" this same voltage during any antifuse shorting step, due to other connections already made in the programming sequence; therefore the first of these criteria (ability to apply Vpp across the appropriate terminals without violating rule 2) is mainly a limit on the possible arrangements of the programmable elements, even at intermediate states during the programming sequence.

During fuse programming, the appropriate current is forced through the matrix conductors by connecting a current source to the correct terminals at each appropriate step in the programming sequence. After the fuse blows (and the current through the fuse therefore drops to zero) the voltage across the fuse terminals will in general rise to the compliance of the current source. Since there may be unprogrammed antifuses or three-state elements also present in the array, the compliance of the current source should in general therefore be limited to +/−Vpp/2 when an antifuse may be present in parallel with the fuse terminals; or else it should be limited to +/−Vpp when an antifuse will not be present in parallel with the fuse terminals (since antifuses may still share at least one terminal with one of the fuse terminals), with other unrelated rows/columns again tied to +/−Vpp/2 with the same polarity as the current source. These requirements will ensure that no unprogrammed antifuse is exposed to a voltage exceeding +/−Vpp/2 during fuse-blowing processes. However, it should be remembered that the compliance of said current source must be sufficient to ensure the appropriate programming current is seen at the fuse terminals. The combination of these requirements creates a rather complex limitation on the maximum resistance of any possible fuse-programming path; this resistance (which must include the resistances of the appropriate lengths of the various conductors as well as any unprogrammed fuses and programmed antifuses in any potential path) times the necessary current flowing through the path, must never exceed the available voltage compliance (or else the required current will not flow).

Further, in a matrix it is generally necessary to program a fuse of either type by flowing currents through other fuses, which are not to be damaged. Due to the unique way in which trunk fuses and tiny fuses are used in the current invention, these fuses are not included in the following discussion. In general, since trunk fuses are connected only between an associated pair of top and bottom external contacts with only an antifuse in series, no current is supplied through other fuses in order to blow a trunk fuse, trunk fuse blowing will be discussed separately, in the discussions surrounding FIGS. 15a–f. And tiny fuses, which will always be smaller than small fuses, are never used to supply current for blowing other fuses, and are themselves blown only through connections which would be sufficient even to blow a small fuse; tiny fuse blowing will be described later in the discussion surrounding FIG. 13. The following discussion explains only how large or small fuses (or large or small three-state elements) may be blown as desired in a programmable matrix environment.

In order to discuss how this is accomplished, some definitions are needed. A given fuse type is designed to blow, or program to the open condition, when a current $I_{prog}$ flows whose duration exceeds a specified programming time $T_{prog}$. The same fuse is able to withstand a second current $I_{carry}$ without damage for a second specified time $T_{carry}$.

In a real-world situation, there will be process variations in fuses, so that not all fuses are exactly the same. In general, a group of fuses of the same type, if blown with the specified current $I_{prog}$, will have a distribution of programming times near the specified value of $T_{prog}$. Some fuses will blow in a time less than $T_{prog}$, and some will take longer. For a group of fuses, a second specified time $T_{carry}$ is defined to be the longest of the programming times in this distribution. In practice, a value for $T_{carry}$ is specified by the designer, and programming is performed by applying $I_{prog}$ to fuses for time $T_{carry}$, and fuses falling outside this limit (not programming correctly in time $T_{carry}$) will be "out-of-spec". Also, for a group of fuses, the current $I_{carry}$ is chosen to be the maximum current that the weakest "in-spec" fuse can withstand for the time $T_{carry}$ without damage. With these definitions, any fuse in the group will program if a current $I_{prog}$ flows through it for a time $T_{carry}$. It can also be seen from this that $T_{carry} > T_{prog}$. Also, since the current $T_{carry}$ must be withstood, without damage, for a time greater than the typical time required to blow an average fuse, the current $I_{carry}$ must be less than $I_{prog}$. If currents flows through other fuses during a fuse-programming event, none will be damaged if the current through these other fuses does not exceed their specified $I_{carry}$. With these definitions in mind, we make the further definition of a "gang factor" Z:

$$Z = I_{prog}/I_{carry} \qquad 1)$$

In other words, a "gang" of Z fuses, in parallel, each passing a current $I_{carry}$, can together pass sufficient current $I_{prog}$ to blow a selected single fuse, without damaging the fuses in the gang, if provision is made in the programming circuitry to assure that the programming current is divided equally among the gang.

It is convenient in a matrix environment including fuse elements of two different sizes to be able to program the smaller fuse by passing the entire current through the larger fuse. This restriction is assumed for the preferred embodiment of the current invention presented here This means that the small fuse programming current equals the large fuse carry current:

$$I_{prog}^{small} = I_{carry}^{large} = I_{prog}^{large} / Z^{large} \quad 2)$$

With this design criterion, it is of interest to determine how a large fuse will be blown. From Eqns. 1 and 2, we can show that:

$$I_{carry}^{small} = I_{prog}^{small} / Z^{small} = I_{prog}^{large} / (Z^{small} * Z^{large}) \quad 3)$$

From Eqn. 1, it can be seen that a single large fuse can be blown by a "gang" of $Z^{large}$ large fuses. From Eqn. 3, it is clear that within this gang of large fuses, a gang of $Z^{small}$ small fuses may be substituted in place of a single large fuse. If no large fuses are used at all, a total of $Z^{small}*Z^{large}$ small fuses may be used to pass the current required to program a single large fuse; and if the currents through the small fuses are balanced so that each small fuse current does not exceed $$I_{carry}^{small},$$

no damage will occur.

In practice, $Z^{small}$ and $Z^{large}$ are approximately equal; values from less than 2 to 4 or more have been reported. Also, in reality, it may be difficult to perfectly balance the currents through each fuse in a gang, so a somewhat larger gang is normally used than is required in order to provide a safety factor.

For simplicity, however, the presently-preferred embodiments depicted in the figures herein assume a value of 2 for both $Z^{small}$ and $Z^{large}$, with perfect current balancing. In this case, a large fuse can be blown through a minimum of 2 large fuses, 4 small fuses, or 1 large fuse and 2 small fuses. This particular case is used for illustration only, and is not intended to be limiting. Those of ordinary skill in the art can readily see that for a given large fuse, a small fuse can be designed which can be safely blown by passing the current through a large fuse, without damaging the large fuse. Once these two fuse designs are established, a designer can use the above analysis to determine a method for blowing large fuses which will not damage other fuses in the current paths, regardless of the actual values of $Z^{small}$ and $Z^{large}$, by assuring that a sufficient number of fuses are available during the programming sequence. This is mostly a matter of providing a sufficient number of assist rails; for example, if a group of N small fuses, each attached to one of N assist rails, are to be used to replace a single large fuse in blowing another large fuse, then we know N must be equal to or greater than $Z^{small}$, with ideal current balancing, to ensure that the small fuses will not be damaged. So in the embodiments described hereinafter, with $Z^{small}=2$, each time that assist rails are used to substitute small fuses (or small three-state elements) for a large fuse in a gang, two assist rails are included.

In the above discussion, all opening processes are referred to as blowing fuses; however, the opening processes for shorted small and large three-state elements are equivalent to the small and large fuse blowing processes, respectively. Remember that a small three-state element is electrically equivalent to an antifuse in series with a small fuse, and a large three-state element is electrically equivalent to an antifuse in series with a large fuse. Also, a design restriction was previously made that each shorted antifuse is required to withstand any of the fuse-programming currents without damage. Therefore, in this analysis, a shorted small three-state element may be substituted for a small fuse, and a shorted large three-state element may be substituted for a large fuse.

One further terminology issue with regards to programming should be brought up at this point. Normally, programming of a fuse/antifuse matrix will require a "programming apparatus" with at least three terminals, and with a reprogrammable means (such as an array of relays) to connect these terminals to the pluralities of conductors within the array, in various patterns. A minimum of three terminals are required because, in general, two "programming" terminals are required to connect to the terminals of the particular programmable element which is being programmed at a particular step in the programming process; and at least one "non-programming" terminal is also required, which is connected to the remaining terminals of those programmable elements which have one terminal connected to a programming terminal through the matrix, but which are not to be programmed at this particular step.

As an example, consider a row/column array of unprogrammed three-state programmable elements, where the three-state elements are connected from the rows to the columns at their intersections; thus the terminals of each programmable three-state element are its row conductor and its column conductor, Consider that it is desired first to short the three-state element at the intersection of a given row R and column C. Then the antifuse might be programmed by connecting the conductor of row R to the first programmer terminal, connecting the conductor of column C to the second programmer terminal, and connecting all other row and column conductors (i.e. the remaining terminals of all other three-state elements) to the third (non-programming) programmer terminal. Then, defining the voltage applied to the first programmer terminal as ground, shorting the desired three-state element require an antifuse programming procedure to be applied to the second programming terminal, including at least a step where the voltage rises to Vpp. If the voltage applied to the third (non-programming terminal) is held at Vpp/2 during this entire programming procedure, it is easy for those of ordinary skill in the art to see that no other three-state programmable element will experience a voltage exceeding Vpp/2. If both row and column conductor of an element are connected to the third programmer terminal, then it will experience a voltage of 0 v; those three-state elements who share row R with the three-state element being programmed will experience a voltage of magnitude Vpp/2; and those three-state elements who share column C with the three-state element being programmed will also experience a voltage of magnitude Vpp/2. Clearly, only the desired three-state element will be programmed using this arrangement.

During programming of a fuse element in an array of fuses and antifuses, a similar situation will occur. One programming terminal may be considered ground, and the other is generally connected to a current source, whose compliance cannot exceed Vpp (recalling the restriction imposed by the antifuses above). Thus again a situation is obtained wherein the third, nonprogramming terminal is best held at Vpp/2 during programming operations, to ensure that no voltage exceeding +/−Vpp/2 is experienced at any other row/column intersection. In general, the voltage applied to the third non-programming terminal will be set to an intermediate value approximating the average of the voltages of the first and second terminals.

There are various improvements and modifications that might be made to such a simple programming apparatus; for example, improvements might be made to ensure proper current balancing when using gangs of fuses to blow other fuses, or improved circuitry might be included to make programming of fuses and antifuses quicker and more reliable. However, the actual design of such a programming apparatus is beyond the scope of the current invention. The details of the actual fuse and antifuse programming procedures are also beyond the scope of the current invention, beyond the already-presented points that an antifuse shorting procedure will always include at least a step of applying a voltage Vpp across the terminals of the antifuse, and that a fuse-programming procedure will always include a step of passing a current $I_{prog}$, characteristic of this fuse, through the fuse element.

During the discussions of the present invention included hereinafter, it is sufficient to use the following simplified model of a real-world programming apparatus, wherein it is assumed that: 1) the programming apparatus has three terminals; 2) of these, the first and second terminals are programming terminals to be connected to the various terminals of a programmable array in such a way that the programming signals applied across these first and second programming terminals are connected to the terminals of the fuse, antifuse, or three-state element to be programmed; 3) if an unblown fuse or shorted three-state element links two conductors at any time in the programming sequence, and this element is neither being programmed or acting as part of a fuse "gang" to blow another fuse element in a programming event, then both of these conductors must be connected to the same programmer terminal during this programming event so that no current will flow through the fuse or shorted three-state element, 4) if an unblown fuse or shorted three-state element is acting as part of a fuse "gang" to blow another fuse, then the gang must consist of a sufficient number of such fuse elements or shorted three-state elements (as previously discussed) so that no gang element will be damaged; and 5) the third terminal is a "non-programming terminal" which, if connected to one terminal of an unprogrammed antifuse or three-state element, and the other terminal of this same unprogrammed element is connected to either programming terminal, then this unprogrammed element will be protected against programming even while a programming procedure is applied. (This third programmer terminal is to be connected to conductors in the array in such a way that it is electrically connected to at least one terminal of each unprogrammed antifuse or three-state element which is not being programmed during each programming event)

Any configurable structure to be programmed with such a programming apparatus must have a design and a programming sequence which together ensure that the requirements of assumptions 3), 4) and 5) are never in conflict.

Those of ordinary skill in the art will realize the following descriptions of the present invention is illustrative only and not in any way limiting. Other embodiments than those presented will readily suggest themselves to such skilled persons.

Figure 2:
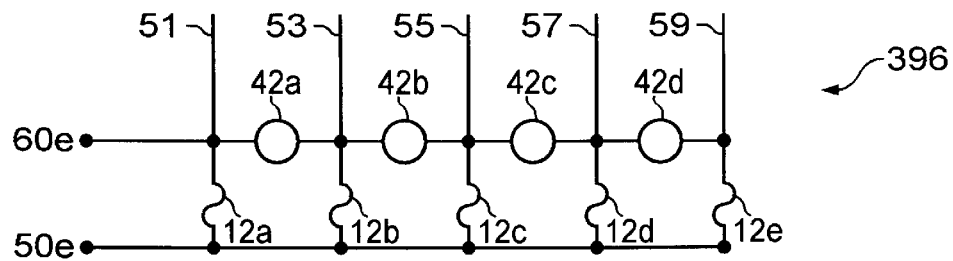

Description of ESD-Protected Single Ladder—FIG. 2

FIG. 2 shows a schematic diagram of a single fuse/antifuse ladder network 396 of the present invention. Ladder 396 comprises a first ground or common ladder terminal 50e, and a plurality of slave terminals 51,53,55,57,59, which are each individually electrically connected to ground terminal 50e through first fuse elements 12a–e, respectively, and which are chained together, each linked to the next by one of a plurality of antifuses 42a,b,c,d; a second master ladder terminal 60e is connected to slave terminal 51. This arrangement essentially shorts out any voltage across each antifuse prior to programming, protecting them from inadvertent premature programming due to static electricity or other stray voltage disturbances. Ladder 396 may be used to sequentially connect master terminal 60e to slave terminals 51–59. First and second control terminals 50e and 60e and slave terminals 51–59 form the terminals of the ladder, where terminals 50e and 60e are the programming and control terminals, and terminals 51–59 are "rung" terminals which may be advantageously attached to other electrical circuitry such as programmable interconnect matrices, and then accessed sequentially through master terminal 60e as the ladder is programmed. Ladder 396 is made especially small for illustrative purposes, but its size is not to be considered limiting. Those of ordinary skill in the art will realize that many more slave terminals can be added to a properly-designed ladder 396.

Optional fuse 12a is provided in ladder 396 for ESD protection; it is not needed if it can be ensured through other means that programming voltages will not occur across terminals 60e and 50e until programming is desired. Including fuse 12a makes ladder 396 an "ESD-protected" single ladder. According to a presently-preferred embodiment, including a fuse in this position for ESD protection is advantageous; hereinafter all ladders described will also be ESD-protected ladders.

Referring to FIG. 2, a ladder 396 has a first ground or common ladder control terminal 50e. Slave terminals 51, 53, 55, 57, and 59 are initially connected to ground terminal 50e by fuses 12a, 12b, 12c, 12d, and 12e, respectively. A second master ladder control terminal 60e is connected directly to slave terminal 51. Slave terminal 51 is connected to slave terminal 53 by antifuse 42a. Slave terminal 53 is connected to slave terminal 55 by antifuse 42b. Slave terminal 55 is connected to slave terminal 57 by antifuse 42c. Slave terminal 57 is connected to slave terminal 59 by antifuse 42d.

Operation of Single Ladder—FIG. 2

Single ladder 396 functions by allowing master terminal 60e to be connected to each of slave terminals 51–59, in sequence. This is accomplished as follows. During this entire programming sequence, it is assumed that first ladder terminal 50e is grounded. Initially, first and second terminals 50e and 60e are connected by fuse 12a. Blowing fuse 12a by passing current $$I_{prog}^{small}$$

between terminals 60e and 50e disconnects master terminal 60e from ground terminal 50e, while leaving the connection between master terminal 60e and slave terminal 51 intact. At this point, slave terminal 51 is accessible through master terminal 60e, but is isolated from the remainder of slave terminals 53–59 by antifuse 42a. Any voltage may be applied to master terminal 60e (and thus to slave terminal 51) as long as it does not exceed +/−Vpp/2 which might program antifuse 42a. This means that in this state, programming signals suitable for programming a fuse/antifuse interconnect matrix can be routed to slave terminal 51 through master terminal 60e, without affecting remaining slave terminals 53–59 (which are still grounded to ground terminal 50e through fuses 12b–e). After the user is done using this connection to slave terminal 51, they can proceed to connect master terminal 60e to slave terminal 53 by shorting antifuse 42a and blowing fuse 12b. This may be accomplished by first applying an antifuse shorting sequence between terminals 60e and 50e (antifuse 42a is connected between these two terminals at this stage); after antifuse 42a is shorted, it connects master terminal 60e to slave terminal 53 as desired. However, slave terminal 53 is still shorted to ground terminal 50e at this point through fuse 12b, so the user must disconnect these two terminals by passing current $$I_{prog}^{small}$$

between terminals 60e and 50e, blowing fuse 12b. At this point, slave terminal 53 is connected to master terminal 60e through antifuse 42a, but is isolated from ground terminal 50e and slave terminals 55–59 (although it is connected to slave terminal 51). After the user is done using this connection to slave terminal 53, they can proceed to connect master terminal 60e to slave terminal 55 by shorting antifuse 42b and blowing fuse 12c, using the same procedures outlined above for connecting to slave terminal 53, and applying the programming signals between second and first terminals 60e and 50e, as before. At this point, slave terminal 55 is connected to master terminal 60e through antifuses 42a–b, but is isolated from ground terminal 50e and slave terminal 57–59 (although it is connected to slave terminals 51–53). After the user is done using this connection to slave terminal 55, they can proceed to connect master terminal 60e to slave terminal 57 by shorting antifuse 42c and blowing fuse 12d, using the same procedures outlined above for connecting to slave terminal 53, and applying the programming signals between second and first terminals 60e and 50e, as before. At this point, slave terminal 57 is connected to master terminal 60e through antifuses 42a–c, but is isolated from ground terminal 50e and slave terminal 59 (although it is connected to slave terminals 51–55), After the user is done using this connection to slave terminal 57, they can proceed to connect master terminal 60e to slave terminal 59 by shorting antifuse 42d and blowing fuse 12e, using the same procedures outlined above for connecting to slave terminal 53, and applying the programming signals between second and first terminals 60e and 50e, as before. At this point, slave terminal 59 is connected to master terminal 60e through antifuses 42a–d, but is isolated from ground terminal 50e (although it is connected to slave terminals 51–57).

Figure 3A:
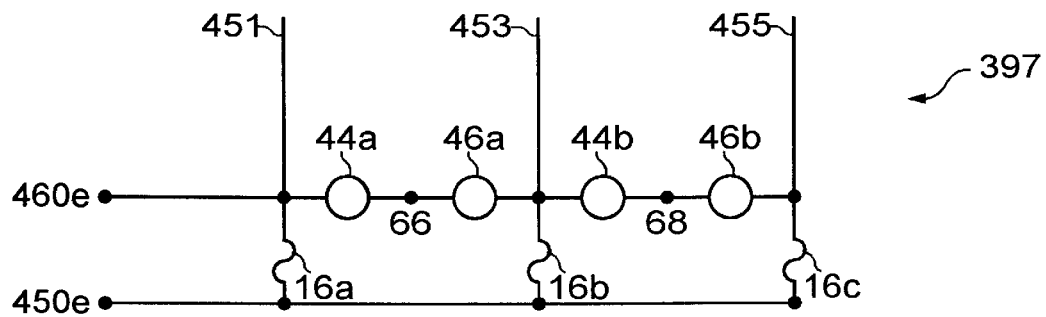
FIG. 3a is a schematic diagram of an ESD-protected double-ladder network 397, similar in concept to single ladder 396.

Description of Double Ladder—FIG. 3a

FIG. 3a shows a schematic diagram of a basic fuse/antifuse "double ladder" 397 of the present invention. Although for simplicity the example depicted in FIG. 3a has only three slave terminals, this double ladder network is essentially identical to the single fuse ladder 396 of FIG. 2, except that each antifuse is replaced by two antifuses in series. As before, double ladder 397 has a first ground terminal 450e. Initially, second master terminal 460e and slave terminals 451,453,455 are all connected to ground terminal 450e through first fuse elements 16a–c. This arrangement essentially shorts out any voltage across each antifuse prior to programming, protecting them from inadvertent premature programming due to static electricity or other stray voltage disturbances. Basic double ladder 397 may be used to sequentially connect master terminal 460e to slave terminals 451,453,455. First and second terminals 450e and 460e and slave terminals 451,453,455 form the terminals of the ladder, where terminals 450e and 460e are the programming and control terminals, and terminals 451, 453,455 are the rung terminals which may be advantageously attached to other electrical circuitry such as programmable interconnect matrices, and then accessed sequentially through terminal 460e as the ladder is programmed. Basic double ladder 397 may be programmed in the same manner as single ladder 396 of FIG. 2, with the modification that the antifuse shorting process must now include a step wherein a voltage 2*Vpp is applied across the two terminals (and thus the two terminals of the antifuse-pairs).

Referring to FIG. 3a, a double ladder 397 has a ground terminal 450e. Slave terminals 451, 453 and 455 are initially connected to ground terminal 450e by fuses 16a, 16b, and 16c, respectively. Master terminal 460e is connected directly to slave terminal 451. Slave terminal 451 is connected to slave terminal 453 by antifuses 44a and 46a, which are connected in series by an intermediate antifuse terminal connection 66. Slave terminal 453 is connected to slave terminal 455 by antifuses 44b and 46b, which are also connected in series by intermediate antifuse terminal connection 68. Note that intermediate antifuse terminal connections 66 and 68 are essentially floating in this structure; their voltage is determined prior to programming primarily by small leakage currents through the antifuses. This arrangement is not ideal if static charges or other stray electrical disturbances are present which may couple to intermediate antifuse terminal connections 66 and 68, potentially causing unwanted programming of the antifuses if the voltages on these floating nodes exceeds Vpp.

Operation of Double Ladder—FIG. 3a

Basic double ladder network 397 is essentially the same invention as the single ladder 396 shown in FIG. 2. Those of ordinary skill in the art will see that a ladder can always be built with a chain of N antifuses in series replacing each single antifuse of FIG. 2; and that it can be programmed using the same procedures used to program ladder 396 with the exception of the antifuse programming process, which must then include a step of applying a voltage N*Vpp across the two end terminals of each chain of N series-connected antifuses.

The limitations of basic double ladder 397 are also similar to those of single ladder 396, with the important difference that it can withstand higher voltages without programming; at each intermediate state when one of slave terminals 451, 453 and 455 is connected to master terminal 460e, voltages of up to +/−Vpp can be applied across second first terminals 460e and 450e without programming the next two antifuses (rather than Vpp/2 as in single ladder 396). This difference is instrumental in providing a method for connecting several ladders together into a composite structure in a way that has superior electrical properties when compared to a single ladder with the same total number of slave terminals (to be discussed further below in the explanations of FIG. 5).

Figure 3B:
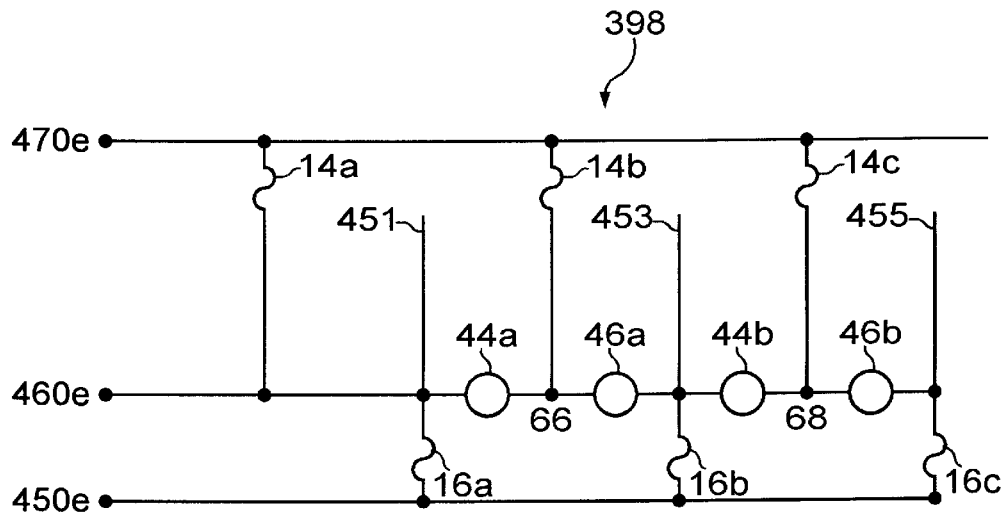
FIG. 3b is a schematic diagram of an ESD-protected assisted double-ladder network 398, formed by adding a third "intermediate assist" ladder control terminal and a plurality of second fuses to double-ladder 397. This form is particularly useful in creating ladder hierarchies.

Description of Assisted Double Ladder—FIG. 3b

The assisted double ladder network 398 is shown in schematic form in FIG. 3b. Note that ladder 398 incorporates a basic double ladder network 397, to which a third "intermediate assist" ladder control terminal 470e has been added. Third ladder terminal 470e is connected to master terminal 460e, and to intermediate antifuse terminal connections 66 and 68, by fuses 14a, 14b and 14c, respectively. Fuse 14a is optional and only serves to provide ESD protection to the ladder prior to programming; if other means are available to keep the ladder terminals shorted prior to programming, then fuse 14a can be omitted (in which case the network is merely an "assisted double ladder" network). This assisted ladder arrangement is again programmable using voltages not exceeding Vpp, at the expense of additional programming terminal 470e. Intermediate antifuse terminal connections 66 and 68 are no longer floating prior to programming; they are controlled by third ladder terminal 470e through fuses 14b–c, and the overall connectivity now shorts out any voltage across each antifuse individually prior to programming, protecting them from inadvertent premature programming due to static electricity or other stray voltage disturbances. Initially, master terminal 460e and slave terminals 451,453,455 are all connected to ground terminal 450e through first fuse elements 16a–c; third ladder terminal 470e and intermediate antifuse terminal connections 66,68 are also connected to ground terminal 450e through fuses 14a–c. Assisted double ladder 398 may be used to sequentially connect master terminal 460e to slave terminals 451,453,455. First, second, and third ladder programming terminals 450e, 460e, 470e and slave terminals 451,453,455, respectively, form the terminals of the ladder, where terminals 451,453,455 are rung terminals which may be advantageously attached to other electrical circuitry such as programmable interconnect matrices, and then accessed sequentially through terminal 460e as the ladder is programmed.

Referring to FIG. 3b, an assisted double ladder 398 has a first ground terminal 450e. Slave terminals 451, 453 and 455 are initially connected to ground terminal 450e by first fuses 16a, 16b, and 16c, respectively. Master terminal 460e is connected directly to slave terminal 451. Slave terminal 451 is connected to slave terminal 453 through antifuses 44a and 46a, which are connected in series by intermediate antifuse terminal connection 66. Slave terminal 453 is connected to slave terminal 455 through antifuses 44b and 46b, which are connected in series by intermediate antifuse terminal connection 68. Second small fuses 14b and 14c connect intermediate antifuse terminal connections 66,68 to third ladder terminal 470e, which in turn is connected to master terminal 460e by optional ESD-protection second fuse 14a.

Operation of Assisted Double Ladder—FIG. 3b

Programming ESD-protected assisted double ladder 398 of FIG. 3b is similar but not identical to programming single ladder 396 of FIG. 2. Ladder 398 functions by allowing master terminal 460e to be connected to each of slave terminals 451, 453, and 455, in sequence. This is accomplished as follows. During this entire programming sequence, it is assumed that first ladder control terminal 450e is grounded. Initially, first and second terminals 450e and 460e are connected by fuse 16a, and second and third ladder terminals 460e and 470e are connected by fuse 14a. Fuses 14a and 16a must both be blown to connect master terminal 460e to slave terminal 451 while disconnecting it from first and third ladder terminals 450e and 470e (the first desired state). Fuse 14a is blown first. By connecting master terminal 460e to ground, the user can ensure that no current will flow through fuse 16a, since both of its terminals are now grounded. Then fuse 14a may be blown by passing current $$I_{prog}^{small}$$

between terminals 470e and 460e, disconnecting master terminal 460e from third ladder terminal 470e, while leaving the connection between master terminal 460e and slave terminal 451 intact. Next, third ladder terminal 470e is held at Vpp/2 while leaving ground terminal 450e grounded. Maintaining these voltages, the user must pass a current $$I_{prog}^{small}$$

between terminals 460e and 450e, by raising master terminal 460e from ground toward Vpp until current $$I_{prog}^{small}$$

flows. This programming step places a voltage of +/−Vpp/2 or less across each antifuse, which will not program them. This step disconnects master terminal 460e from ground terminal 450e by blowing fuse 16a, resulting in the desired first programmed state.

At this point, slave terminal 451 is accessible through master terminal 460e, but is isolated from first and third ladder terminals 450e and 470e, and from the remainder of slave terminals 453 and 455 by antifuse 44a. In this state, maintaining third ladder terminal 470e at Vpp/2, any voltage between ground and Vpp may be applied to master terminal 460e (and thus to slave terminal 451) without programming any of the elements of assisted double ladder 398. In fact, if the voltage applied to third ladder terminal 470e is allowed to follow the voltage applied to master terminal 460e with half the magnitude, then any voltage between −Vpp and Vpp can be applied to master terminal 460e in this state (with the voltage on third ladder terminal 470e ranging between −Vpp/2 and Vpp/2, in concert). This allows assisted double-ladder 398 to be used to route programming signals sufficient to program single ladders or fuse/antifuse matrices programmable with voltages of magnitude up to Vpp, as will be described later.

After the user is done using this connection from master terminal 460e to slave terminal 451, they can proceed to connect master terminal 460e to slave terminal 453 by shorting antifuses 44a and 46a, and blowing fuses 14b and 16b. First, antifuse 44a must be programmed. With ground terminal 450e grounded and third ladder terminal 470e held at Vpp/2, antifuse 44a can be programmed by an antifuse shorting process which includes a step of applying −Vpp/2 to master terminal 460e. This connects master terminal 460e to intermediate antifuse terminal connection 66, through shorted antifuse 44a. Next, intermediate antifuse terminal connection 66 must be disconnected from third ladder terminal 470e by blowing fuse 14b. Third ladder terminal 470e must first be connected to ground. Then fuse 14b may be blown by passing current $$I_{prog}^{small}$$

between terminals 460e and 470e, disconnecting master terminal 460e and intermediate antifuse terminal connection 66 from third ladder terminal 470e. Next, antifuse 46a must be shorted. Again holding third ladder terminal 470e at Vpp/2, an antifuse shorting process may be applied between master terminal 460e and ground terminal 450e, including at least a step of applying a voltage Vpp to master terminal 460e. Now master terminal 460e is connected to slave terminal 453 through shorted antifuses 44a and 46a, but it is also still connected to ground terminal 450e through fuse 16b. Next, third ladder terminal 470e is held at Vpp/2, while leaving ground terminal 450e grounded. Maintaining these voltages, the user must pass a current $I_{prog}^{small}$ between terminals 460e and 450e, by raising master terminal 460e from ground toward Vpp until current $I_{prog}^{small}$ flows. This programming step places a voltage of +/−Vpp/2 or less across each antifuse, which will not program them. This step disconnects master terminal 460e from ground terminal 450e by blowing fuse 16b, resulting in the desired second programmed state; master terminal 460e is now connected to slave terminal 453 (and slave terminal 451) but isolated from first and third ladder terminals 450e and 470e and remaining slave terminal 455.

After the user is done using this connection from master terminal 460e to slave terminal 453 they can proceed to connect master terminal 460e to slave terminal 455 by shorting antifuses 44b and 46b, and blowing fuses 14c and 16c. First, antifuse 44b must be programmed. With ground terminal 450e grounded and third ladder terminal 470e held at Vpp/2, antifuse 44b can be programmed by an antifuse shorting process which includes a step of applying −Vpp/2 to master terminal 460e. This connects master terminal 460e to intermediate antifuse terminal connection 68, through shorted antifuses 44a, 46a and 44b. Next, intermediate antifuse terminal connection 68 must be disconnected from third ladder terminal 470e by blowing fuse 14c. Third ladder terminal 470e must first be connected to ground. Then fuse 14c may be blown by passing current $I_{prog}^{small}$ between terminals 460e and 470e, disconnecting master terminal 460e and intermediate antifuse terminal connection 68 from third ladder terminal 470e. Next, antifuse 46b must be shorted. Again holding third ladder terminal 470e at Vpp/2, an antifuse shorting process may be applied between master terminal 460e and ground terminal 450e, including at least a step of applying a voltage Vpp to master terminal 460e. Now master terminal 460e is connected to slave terminal 455 through shorted antifuses 44a,46a,44b and but it is still connected to ground terminal 450c through fuse 16c. Next, third ladder terminal 470e is held at Vpp/2, while leaving ground terminal 450e grounded. Maintaining these voltages, the user must pass a current $I_{prog}^{small}$ between terminals 460e and 450e, by raising master terminal 460e from ground toward Vpp/2 until current $I_{prog}^{small}$ flows. This step disconnects master terminal 460e from ground terminal 450e by blowing fuse 16c, resulting in the desired third programmed state; master terminal 460e is now connected to slave terminal 455 (and slave terminals 451, 453) but isolated from first and third ladder terminals 450e and 470e.

Description of Segmented Single Ladder—FIG. 4a

In the basic ladder networks discussed so far, each slave terminal remains permanently connected to the ladder's master terminal, once it has been connected. As must be obvious to those of ordinary skill in the art, it may be desirable upon occasion to add an ability to break the connection between each rung conductor and its slave terminal after this connection has been used.

FIG. 4a shows a schematic diagram of a sequential-connect/disconnect fuse/antifuse (segmented) ladder 400 of the present invention. As can be seen from FIG. 4a, segmented ladder 400 incorporates single ladder 396, but adds fuses 23a–e, linking each slave terminal to one of the second conductors, to provide a means of disconnecting each second conductor from master terminal 60e after use. Initially, all terminals are shorted to ground terminal 50e through first fuse elements 12a–e and second fuse elements 23a–e. This protects all antifuses in ladder 400 from inadvertent premature programming due to static electricity or other stray voltage disturbances. In ladder 400, slave terminals 51–59 are connected, through second fuse elements 23a–e to second conductors 51a,53a,55a,57a,59a so that said second conductors may be disconnected from the ladder by programming these fuses. Second conductors 51a,53a,55a,57a, 59a may be advantageously attached to other electrical circuitry such as programmable interconnect matrices, and then, through ladder 400 and slave terminals 51–59, accessed sequentially through terminal 60e as the ladder is programmed.

Although elements 12a–e are small fuses and fuses 23a–e are large fuses in this embodiment, the operational principles of ladder 400 are not changed by changing the sizes of these fuse elements. Also, ladder 400 is made especially small for illustrative purposes, and its size is not to be considered limiting. Those of ordinary skill in the art will realize that many more slave terminals can be added to a properly-designed ladder 400.

Referring now to FIG. 4a, a segmented ladder 400 has a ground or common first ladder control terminal 50e. Slave terminals 51, 53, 55, 57, and 59 are initially connected to ground terminal 50e by fuses 12a, 12b, 12c, 12d, and 12e, respectively. A second "master" ladder control terminal 60e is connected directly to slave terminal 51. Slave terminal 51 is connected to slave terminal 53 by antifuse 42a. Slave terminal 53 is connected to slave terminal 55 by antifuse 42b. Slave terminal 55 is connected to slave terminal 57 by antifuse 42c. Slave terminal 57 is connected to slave terminal 59 by antifuse 42d. Slave terminals 51,53,55,57,59 are connected, through fuses 23a–e, respectively, to disconnectable second conductors 51a,53a,55a,57a,59a.

Operation of Segmented Single Ladder—FIGS. 4a, 4b, 4c

The programming of the segmented ladder network 400 depicted in FIG. 4a is quite simple. As described above, all other terminals in the ladder are initially shorted to first "ground" terminal 50e through first fuse elements 12a,b,c, d,e and second fuse elements 23a,b,c,d,e. During the entire programming procedure, it may be assumed that ground terminal 50e is held at ground potential.

First and second control terminals 50e, 60e, and slave terminals 51,53,55,57,59 form the terminals of the ladder, but for the segmented single ladder, the connectivity of the second conductors is of more interest than that the slave terminals themselves, especially due to their disconnectability. For example, one sees that the first desired "rung" on the ladder is achieved when the only second conductor connected to master terminal 60e is 51a. To achieve this state, the first programming step is to disconnect master terminal 60e from ground terminal 50e. This is accomplished by programming fuse 12a to the open state. One terminal of fuse 12a is ground terminal 50e, and the other terminal is slave terminal 51, which is directly connected to master terminal 60e. Thus, by passing a programming current $$I_{prog}^{small}$$

through first and second terminals 50e, and 60e, small fuse 12a may be opened, and master terminal 60e is disconnected from ground terminal 50e. At this point, master terminal 60e is directly connected to terminal 51, which is connected through fuse 23a to second conductor 51a, i.e., the first desired connection is now in place. Any electrical operations that are to be done in this configuration are now performed.

If it is desired to disconnect second conductor 51a from master terminal 60e after performing these operations, fuse 23a must next be blown. With ladder 400 in this state, one terminal of fuse 23a is connected to master terminal 60e, but the other terminal is connected only to second conductor 51a; a designer must provide another means for electrically connecting to second conductors 51a, 53a, 55a, 57a, and 59a if fuses 23a,b,c,d,e are to be blown. Providing these means is not particularly difficult, however; in each state wherein master terminal 60e connects to one of the second conductors, this same connection may be used to help attach other conductors to the second conductors by programming other provided programmable elements, for example on assist rails. Ways of providing these separate means to access second conductors 51a–59a will be shown in the embodiments following the present discussion.

For the remainder of this discussion of segmented ladder 400, it is assumed that master terminal 60e is to be connected to and then disconnected from each of second conductors 51a, 53a, 55a, 57a, and 59a, in turn. It is also assumed that some separate means of accessing second conductors 51a, 53a, 55a, 57a, and 59a is provided at appropriate times to allow for programming of fuses 23a,b,c,d,e.

Continuing now with the programming of ladder 400, fuse 23a is programmed by passing a current $$I_{prog}^{large}$$

from master terminal 60e to second conductor 51a, effectively disconnecting master terminal 60c from second conductor 51a.

The second rung of the ladder requires that the only second conductor connected to master terminal 60e is 53a. To achieve this state, antifuse 42a must next be programmed to its shorted state This is accomplished by an antifuse programming process including a step in which a voltage Vpp is applied across the two terminals of antifuse 42a, slave terminals 51 and 53. But at this point, terminal 53 is still connected to ground terminal 50e, and terminal 51 is connected only to master terminal 60e. Thus, the antifuse programming process is applied across first and second terminals 50e and 60e, in such a way that voltage Vpp is applied to master terminal 60e, and ground terminal 50e is left grounded. At this point in the sequence, master terminal 60e is connected through terminal 51, shorted antifuse 42a, terminal 53, and fuse 23b, to second conductor 53a, as desired. However, slave terminal 53, master terminal 60e and second conductor 53a are still connected to ground terminal 50e through fuse 12b. Thus, we next program fuse 12b, as fuse 12a was programmed, by passing a programming current $$I_{prog}^{small}$$

through first and second terminals 50e and 60e. After fuse 12b is opened, master terminal 60e is connected only second conductor 53a, as desired. Note that blown fuse 23a now isolates these terminals from second conductor 51a. This state of ladder 400 is shown schematically in FIG. 4b.

After any desired electrical operations are again performed, fuse 23b is programmed to the open state as was fuse 23a, in this case blowing the fuse through terminal 60e and second conductor 53a.

Next, we want the only second conductor connected to master terminal 60e to be 55a. This is accomplished by programming antifuse 42b (to connect terminal 60e to terminal 55), and then programming fuse 12c (to disconnect terminal 55 from ground terminal 50e). Antifuse and fuse programming processes, respectively, are applied as before to first and second terminals 50e and 60e. After programming antifuse 42b and fuse 12c, master terminal 60e is connected only to second conductor 55a as desired, through terminal 51, shorted antifuse 42a, terminal 53, shorted antifuse 42b, terminal 55, and fuse 23c.

After any desired electrical operations in this state are performed, master terminal 60e and second conductor 55a are disconnected by programming fuse 23c through terminal 60e and second conductor 55a.

Next, we want the only second conductor connected to master terminal 60e to be 57a. This is accomplished by programming antifuse 42c (to connect terminal 60e to terminal 57), and then programming fuse 12d (to disconnect terminal 57 from ground terminal 50e). Antifuse and fuse programming processes are applied as before to first and second terminals 50e and 60e. After programming antifuse 42c and fuse 12d, master terminal 60e is connected only to second conductor 57a as desired, through terminal 51, shorted antifuse 42a, terminal 53, shorted antifuse 42b, terminal 55, shorted antifuse 42c, terminal 57, and fuse 23d.

After any desired electrical operations in this state are performed, master terminal 60e and second conductor 57a are disconnected by programming fuse 23d through terminal 60e and second conductor 57a.

The final desired connection, between master terminal 60e and second conductor 59a, is made by programming antifuse 42d (to connect terminal 60e to terminal 59), and then programming fuse 12e (to disconnect terminal 59 from ground terminal 50e). Antifuse and fuse programming processes are applied as before to first and second terminals 50e and 60e. After programming antifuse 42d and fuse 12e, master terminal 60e is connected only to second conductor 59a as desired, through terminal 51, shorted antifuse 42a, terminal 53, shorted antifuse 42b, terminal 55, shorted antifuse 42c, terminal 57, shorted antifuse 42d, terminal 59, and fuse 23e. This state of ladder 400 is shown schematically in FIG. 4c.

After any desired electrical operations are performed, master terminal 60e and second conductor 59a are disconnected by programming fuse 23e through terminal 60e and second conductor 59a.

Description: Method of Combining Ladders

One thing that must be apparent to a careful reader in the above descriptions is the increasing length of the connection "chain" between master terminal 60e and each successive slave terminal, as programming progresses. Even in segmented ladder 400 of FIG. 4a, with only five rungs, the connection between terminal 60e and the last rung is made through four antifuses (42a,b,c,d) in series. In a larger ladder, for example a ladder with 50 rungs, the connection between the ladder's master terminal and last rung terminal must be made through 49 antifuses in series. At some point, as more rungs are added to the ladder networks of FIG. 2 or 4a, the resistance of the antifuses in series will begin to interfere with the programming of the ladder network. This point will depend on the characteristic resistance $R_{short}^a$ of the programmed antifuses, the maximum programming current $I_{prog}^{max}$ that must pass through the string of antifuses, and the maximum voltage Vmax that can be allowed to occur across the programming terminals. Generally, it should be assumed that there will be some voltage Vmax which limits the voltage that can occur across the programming terminals of a ladder. For example, as discussed earlier in the section on design criteria, the maximum voltage developed by passing currents through any path for fuse programming should not exceed Vpp/2 if there is any possibility that this voltage may appear across the terminals of an unprogrammed antifuse. Alternately, there may be a compliance limit imposed by the programming circuitry used to program the ladder. Those of ordinary skill in the art can then appreciate that there will be a maximum number M of rungs which may be accessed by a ladder network such as that shown in FIG. 4a. This limiting value M can be expressed as:

$$M < V_{max} / \{I_{prog}^{max} * R_{short}^a\} + 1 \qquad 4)$$

Normally, $I_{prog}^{max}$ (probably the programming current of the largest fuse programmed through the ladder) and $R_{short}^a$ will be characteristic values of the technology used.

One typical value of Vmax is Vpp if a ladder network is used to program a network including antifuses, where the antifuses are designed to program at Vpp. As discussed earlier, the antifuses are also required to withstand Vpp/2 without programming. Other conductors in the external network can then be held at Vpp/2 when programming is not desired of antifuses connected between this conductor and terminals 50e or 60e; since terminal 50e is grounded and terminal 60e does not exceed Vpp, no such antifuse will experience a voltage across its terminals outside the range −Vpp/2 to +Vpp/2, and thus will not program. Hereinafter, it is assumed that the maximum voltage Vmax that may occur in all programming operations is no more than Vpp (relative to a ground terminal, which is assumed to be the lowest voltage on any conductor during all programming operations), which only occurs during an antifuse-programming operation.

However, if a designer requires a ladder which connects to more than M rung terminals, it would be advantageous to have a method for connecting a plurality of ladders together, each with M (or less) rungs. These ladders might then be connected in such a way that the master terminal could be connected to each rung of each ladder, in a given sequence, without any connection being made through more than the maximum M antifuses in series. Assisted double ladder 398 of FIG. 3b provides such a method.

Description of Hierarchical Assisted Ladder—FIG. 5

FIG. 5 shows such a way to combine several ladders 6400,7400,8400 together to make a longer hierarchical assisted ladder 4000. Ladders 6400,7400,8400 may be simple ladders like ladder 396 of FIG. 2, or segmented ladders like ladder 400 of FIG. 4a. In fact, ladders 6400, 7400,8400 may even be assisted ladders like 398 (with additional third ladder terminal(s) not shown but present for use at the appropriate programming steps). Further, ladders 6400,7400,8400 may even be other hierarchical ladders (again with third ladder terminal(s) equivalent to 700e not shown but present for use at the appropriate programming steps), in which case ladder 4000 is simply the highest level of a multiply-hierarchical assisted ladder. For simplicity, it will be assumed hereinafter that ladders 6400,7400,8400 are segmented single ladders like ladder 400 of FIG. 4a.

It is useful to discuss the choice of an "assisted" ladder (including a third ladder terminal) for all presented hierarchical ladders. As one of ordinary skill in the art will see, it is possible to create hierarchical ladders and even multiply-hierarchical ladders without resorting to the use of third ladder terminals, basing them upon basic double-ladders like 397 rather than assisted ladder 398. For example, an array of segmented ladders 400 can be connected together by a basic double-ladder network 397 merely by replacing each of fuses 16a,b,c with a segmented ladder 400. As double ladder 397 is programmed, its master terminal 460e will be connected in turn to each of its slave terminals 451,453,455 which are now connected to master terminal 60e of each segmented ladder 400; and each segmented ladder 400 can be sequenced when its master terminal 60e is connected to double-ladder master terminal 460e (since the programming signals of segmented ladders 400 never exceed Vpp, and the antifuse-pairs of ladder 397 should withstand Vpp without programming). When programming of each ladder 400 is finished, the next state of ladder 397 can be achieved, as previously discussed, by programming steps including an applied voltage of 2*Vpp.

However, as previously discussed, the intermediate antifuse terminal connection in each antifuse pair is essentially floating in an unassisted double-ladder 397, making this network more susceptible to ESD damage than assisted ladder 398. Also, these networks, although somewhat simpler in construction, require ever-increasing voltages to program as the levels of hierarchy increase. The 2-level hierarchy just described required a maximum voltage of 2*Vpp to program; a 3-level hierarchical unassisted ladder would require quadruple antifuses in series with three floating nodes in each rung, and a programming voltage of 4*Vpp; and in general a N-level hierarchical ladder would require $2^N$ antifuses in series with $2^N-1$ floating nodes per rung, and a maximum programming voltage of Vpp*$2^N$. At some level of hierarchy, the geometrically-increasing number of required antifuses in an unassisted ladder may even offset the complexity of the assisted ladder's linearly-increasing number of third ladder terminals and associated fuses, and the unassisted ladder may even become more complex than the equivalent assisted ladder. With the increasing risk of ESD damage and these exponentially-increasing requirements when using an unassisted ladder hierarchy, the presently-preferred embodiment of ladder hierarchy is based entirely on assisted ladders, with their more-reliable ESD performance and only linearly-increasing number of required terminals.

Returning now to FIG. 5, only the external terminals of ladders 6400,7400,8400 are shown. For example, ladder 6400 has first and second ladder control terminals 650e and 660e which are equivalent to terminals 50e and 60e, respectively, of FIG. 4a. Ladder 6400 also has rung terminals 651, 653, 655, 657 and 659. Likewise, ladder 7400 has first and second programming terminals 750e and 760e, and rung terminals 751, 753, 755, 757, and 759. Also, ladder 8400 has first and second programming terminals 850e and 860e, and rung terminals 851, 853, 855, 857, and 859. Hierarchical assisted ladder 4000 is capable of sequentially connecting its double-ladder master terminal 600e to all of the rung terminals 651, 653, 655, 657, 659, 751, 753, 755, 757, 759, 851, 853, 855, 857, 859, in this sequence. In effect, hierarchical ladder 4000 now has a total of fifteen rungs.

Looking closely at FIG. 5, a careful reader can see that ladder 4000 is merely an example of an assisted double ladder network 398 of FIG. 3b, now used to connect several small ladders 6400,7400,8400 together. Terminal 500e of hierarchical assisted ladder 4000 corresponds to terminal 450e of FIG. 3b; terminal 600e of ladder 4000 corresponds to terminal 460e of FIG. 3b; terminal 700e of hierarchical assisted ladder 4000 corresponds to terminal 470e of FIG. 3b.

The only real difference here is that each fuse of 16a–c of FIG, 3b has been replaced by one of small ladders 6400, 7400,8400.

Referring now to FIG. 5, it can be seen that ground terminal 500e of hierarchical assisted ladder 4000 is common to ladders 6400,7400,8400 and is shorted to their respective ground terminals 650e,750e,850e. Master terminal 600e of hierarchical assisted ladder 4000 is connected directly to slave terminal 451 of ladder 4000. Slave terminals 451,453,455 of hierarchical assisted ladder 4000 are connected to master terminals 660e,760e,860e of small ladders 6400,7400,8400, respectively, and are initially connected through the unprogrammed ladders 6400,7400,8400 to ground terminal 500e, since all terminals in an unprogrammed ESD-protected ladder are initially connected together. Slave terminal 451 is connected to slave terminal 453 by antifuses 44a and 46a, which are connected in series by intermediate antifuse terminal connection 66. Slave terminal 453 is connected to slave terminal 455 by antifuses 44b and 46b, which are connected in series by intermediate antifuse terminal connection 68. Second fuses 14a, 14b, and 14c connect third ladder terminal 700e to master terminal 600e and intermediate antifuse terminal connections 66 and 68, respectively. Of these, optional fuse 14a is used only to short third ladder terminal 700e to master terminal 600e ESD protection prior to programming; it may be omitted if these terminals are connected together by other means prior to programming.

Operation of Hierarchical Assisted Ladder—FIG. 5

As might be expected, programming of hierarchical assisted ladder 4000 is the same as programming the assisted double ladder 398 of FIG. 3b, interleaved with the programming of single ladders at appropriate points in the programming sequence. Third ladder terminal 700e is used to keep antifuses 44a,b and 46a,b from inadvertently programming and interfering with the individual functionings of ladders 6400,7400,8400. Third ladder terminal 700e is held at Vpp/2 during all programming steps of individual single ladders 6400,7400,8400, and at all times during programming except when it is desired to connect programming terminal 600e of hierarchical assisted ladder 4000 to one of ladders 6400,7400,8400. As discussed above, holding intermediate antifuse terminal connections 66 and 68 at Vpp/2 ensures that antifuses 44a,b and 46a,b will not program while programming signals of ground (on terminal 500e) and up to Vpp (on terminal 600e) are applied, since intermediate antifuse terminal connections 66 and 68 form one terminal of each of these antifuses, and the respective second terminals of unprogrammed antifuses 44a,b and 46a,b are connected either directly or through fuse elements to terminals 500e and 600e. Holding third ladder terminal 700e at Vpp/2 also holds terminals 66 and 68 at Vpp/2, since these terminals are connected to terminal 700e through fuses 14b,c.

Referring now to FIG. 5, ESD fuse 14a initially connects third ladder terminal 700e to master terminal 600e, and must be blown as the first step of the programming sequence. This is accomplished by grounding first and second terminals 500e and 600e and then applying a fuse blowing sequence across terminals 700e and 600e. Once fuse 14a has been blown, first and second terminals 500e and 600e are connected directly to first and second programming terminals 650e and 660e of small ladder 6400, and third ladder terminal 700e can be raised to Vpp/2. Since antifuses 44a,b and 46a,b are essentially open circuits and will not program during the programming of ladder 6400, terminals 500e and 600e of hierarchical assisted ladder 4000 are initially isolated from ladders 7400,8400, and will remain so during the entire programming of ladder 6400. In this first phase, hierarchical assisted ladder 4000 essentially consists of only ladder 6400.

Programming of hierarchical assisted ladder 4000 continues with the programming of ladder 6400. During this phase of the programming, small ladder 6400 is programmed just as ladder 400 of FIG. 4a was programmed, with the following differences: ground terminal 50e is replaced by 500e, master terminal 60e is replaced by 600e, and third ladder terminal 700e is held at Vpp/2 during this entire phase. After terminal 600e has been connected and disconnected sequentially to/from rung terminals 651, 653, 655, 657, and 659 through ladder 6400, however, terminal 600e is essentially left connected only to antifuse 44a.

At this point, the user is done with first small ladder 6400 and it is time to connect to second small ladder 7400. Terminal 700e is grounded along with terminal 500e, and antifuse 44a is shorted by an antifuse process including at least a step of applying Vpp to terminal 600e. With terminals 500c and 700e still grounded, fuse 14b is also blown by applying a fuse blowing procedure across terminals 700e and 600e. Then terminal 700e is again raised to Vpp/2, and antifuse 46a is programmed by an antifuse process including at least a step of applying Vpp to terminal 600e.

At this point, terminal 600e is connected through shorted antifuses 44a and 46a to terminal 760e of ladder 7400, and all internal connections inside ladder 6400 have been disconnected. Antifuses 44b and 46b are open circuits and will not program during the programming of ladder 7400, so essentially terminals 500e and 600e of hierarchical assisted ladder 4000 are disconnected from ladders 6400,8400. In this second phase, ladder 4000 essentially consists of only ladder 7400.

Programming of hierarchical assisted ladder 4000 continues with the programming of ladder 7400. During this phase of the programming, small ladder 7400 is programmed just as ladder 400 of FIG. 4a was programmed, with the following differences: terminal 50e is replaced by 500e, terminal 60e is replaced by 600e, and terminal 700e is held at Vpp/2 during this entire phase. Terminal 600e is connected and disconnected sequentially to rung terminals 751, 753, 755, 757, and 759, respectively. At this point, terminal 700e is grounded along with terminal 500e, and antifuse 44b shorted, applying Vpp to terminal 600e. With terminals 500e and 700e still grounded, fuse 14c is also blown, and antifuse 46a is shorted, again applying Vpp to terminal 600e.

At this point, terminal 600e is connected through shorted antifuses 44a, 46a, 44b, and 46b to terminal 860e of ladder 8400. Since ladder 8400 is the last ladder in this example, terminal 700e is no longer needed and is indeed no longer connected to any other terminals in ladder 4000.

At this point, terminal 600e is connected through shorted antifuses 44a,b and 46a,b to terminal 860e of ladder 8400, and all internal connections inside ladders 6400,7400 have been disconnected. Essentially, terminals 500e and 600e of hierarchical assisted ladder 4000 are disconnected from ladders 6400,7400. In this third phase, hierarchical assisted ladder 4000 essentially consists of only ladder 8400.

Programming proceeds as before for ladder 400 of FIG. 4a. Terminal 600e is connected and disconnected sequentially to rung terminals 851, 853, 855, 857, and 859, respectively.

The fifteenth and final connection in hierarchical assisted ladder 4000 is between master terminal 600e and rung terminal 859. If a single ladder were constructed with fifteen rung terminals, this connection would be through 14 shorted antifuses. Referring to FIG. 5, we see that hierarchical assisted ladder 4000 makes the same connection through shorted antifuses 44a,b,46a,b and (referring to FIG. 4a) four shorted antifuses inside ladder 8400, for a total of 8 shorted antifuses. While this may not seem to be a great improvement, such a reduction in the number of shorted antifuses in series is much more important when combining more or larger ladders. In general, this final connection in a 2-level hierarchical assisted ladder will be through:

$$N_{antifuses}^{total} = 2*(N_{ladders} - 1) + N_{antifuses}^{ladder} \quad 5)$$

where $N_{antifuses}^{total}$ is defined as the total number of shorted antifuses in the final connection of the hierarchical assisted ladder; $N_{ladders}$ is the number of single ladders connected together by the hierarchical assisted ladder; and $N_{antifuses}^{ladder}$ is the number of antifuses in each single ladder (one less than the number of rung terminals in each single ladder).

For example, consider a large single ladder having 10000 rung terminals. How would this compare with an equivalent hierarchical assisted ladder including 100 single ladders, each of which has 100 rung terminals? It's easy to see that the final connection in the single ladder would be through 9999 antifuses, yet from Eqn. 5, the final connection in the equivalent hierarchical assisted ladder would be through only 297 antifuses. So the equivalent 2-level hierarchical assisted ladder makes this worst-case connection through over 30 times fewer shorted antifuses than the large single ladder.

And if the user was willing to further increase the level of hierarchy (and the number of programming terminals), dividing the 10000 rung terminals between, for example, 400 single ladders of 25 rung terminals each, controlled by 40 assisted double ladders of 10 rungs each, controlled by 4 assisted double ladders of 10 rungs each, controlled by a top-level 4-rung assisted double ladder (in a four-level multiply-hierarchical ladder network), those of ordinary skill in the art will realize that this final, worst-case ladder connection in a hierarchical assisted ladder of 10000 rungs might be made through a total of 24+2*9+2*9+2*3=66 antifuses, an improvement of over 150 times fewer series antifuses than the equivalent single ladder.

Description of Programmable Surface Acoustic Wave Transducer—FIGS. 6, 7a

Next, a particular embodiment using a ladder network of the present invention (it could be any segmented ladder network such as 400 or even a hierarchical assisted ladder such as 4000, wherein ladders 6400,7400,8400 are all segmented ladders), will be discussed. The ladder network is of more general utility than other aspects of the present invention, and can be useful in situations having nothing to do with configurable, stackable IC packages. The particular embodiment chosen exemplifies this, since the example chosen is a programmable SAW transducer.

A SAW (surface acoustic wave) transducer is essentially an antenna which transmits or receives SAW waves rather than electromagnetic waves; SAW transducers generally even resemble common TV antennas. A typical SAW transducer has a plurality of conductive "fingers" or "taps" located in close proximity to a surface of a piezoelectric substrate. The substrate must be piezoelectric so that when electric signals are applied to these fingers, the resultant electric fields surrounding the fingers force mechanical movement in the substrate which can couple to acoustic waves. In most substrates, acoustic (sound) waves travel in modes including bulk modes which travel radially out from a source in 3 dimensions, similar to familiar sound waves in air, and surface modes which have displacements primarily near the surface of the substrate, and travel radially out from a source in only 2 dimensions, following this surface. These surface modes are especially useful in electrical devices which couple to acoustic waves, since the acoustic energy is "confined" near the surface and thus remains easily accessible to other transducers located on this surface. SAW devices are always based on piezoelectric substrates or composite layered materials having a piezoelectric response to electric fields at the surface, and a desired surface wave mode.

The fingers of a SAW transducer are generally connected in a predetermined pattern to one of at least two terminals, to which the exciting electrical signals are applied. With proper design (including finger spacings near the wavelength of the desired acoustic wave) and with electrical signals having an appropriate frequency which matches the wavelength to the wave velocity of the desired SAW mode of the substrate, the resulting physical movements can couple to the desired mode of surface-traveling acoustic waves for this substrate. SAW transducers are used to convert or transduce electrical signals to surface acoustic waves in the substrate, or to receive and re-convert existing surface acoustic waves back to electrical signals.

Typically, SAW transducers appear in pairs on a single substrate; one common arrangement is to have a small, simple, wideband transducer, perhaps with only two fingers, facing another large transducer of complicated design. The large SAW transducer generally will have many more than two fingers, and the connections of the fingers to one of the (usually two) terminals may in general be in complicated patterns; in fact, even finger lengths may vary in concert with finger spacing, to create a SAW transducer with frequency-dependent response. The pair of transducers taken together becomes an electrical device, with an electrical signal being input into the terminals of one of the transducers, being transformed to a SAW wave, which travels along the substrate and impinges on the other transducer, resulting in a delayed electrical output taken from the terminals of the other transducer. The response of any SAW transducer to an incoming SAW wave is therefore strongly dependent on the patterns of connection of its individual fingers to its terminals, since the electrical response at the terminals is a sum of all of the electrical responses of all fingers taken together.

For example, consider a complicated transducer wherein a predetermined digital pattern of 1's and 0's has been encoded by taking each two successive fingers of the transducer as a "finger pair" and then connecting each successive finger pair to the transducer terminals according to this pattern of 1's and 0's so that: 1) if a "1" is desired, then the first finger of the pair connects to the first transducer terminal and the second finger of the pair connects to the second transducer terminal; 2) if a "0" is desired, then the first finger of the pair connects to the second transducer terminal and the second finger of the pair connects to the first transducer terminal. Thus, the phases of each successive finger pair are reversed in accordance with the aforementioned digital pattern of 1's and 0's. Those of ordinary skill in the art will realize that such a transducer will have the strongest electrical response to an incoming SAW wave train with a wave pattern corresponding to the digital pattern encoded in the transducer's finger-pair connections, so that the responses of the finger pairs all add together in phase at the time when the incoming wave aligns with the transducer.

When incorporated into an electrical device on a single substrate facing a simple, wideband SAW transducer as described above, this arrangement provides an electrical device which may be configured with a predetermined digital pattern to respond preferentially to an input electrical signal which has a corresponding digital phase-reversal pattern. One of ordinary skill in the art will see that a matched pair of identically-configured devices such as these forms (along with a pair of antennae active in the same frequency range, a transmitter and a receiver) the basis for a secure means of communication with high signal/noise ratio and extremely-high noise immunity: i.e., signals produced from the first device (in the transmitter) will have the exact phase-reversal pattern which is encoded into the second device (in the receiver), for maximum response; and any other (noise) signals in the environment will in general be random and lack this matching phase-reversal pattern. And since surface acoustic wave modes generally have a range of wavelengths with nearly the same wave velocity, such a device might even have varying finger spacings, so that the pattern passing from the transmitter to the receiver is not even easily recognizable as such a digitally-encoded phase-reversal signal. The "camouflage" provided by the variations in frequency of the different bits of the digital signal, although automatically decoded by the matching device in the receiver, is difficult to decipher if the design of the SAW devices at each end are not known.

Although the various details of SAW transducer design are relatively involved, these design criteria are well-understood in the prior art, and SAW transducers are currently commercially-exploited products, however, the details of SAW transducer design are beyond the scope of the present invention. For the purposes of this discussion, it is enough to note that: 1) SAW transducers have a number of conductive fingers, disposed in proximity to a piezoelectric substrate, with spacings corresponding to those of a desired SAW mode of the substrate in a desired frequency range; 2) these fingers are generally connected to one of at least two terminals; and 3) the response of the SAW transducer is dependent upon the pattern in which the SAW fingers are attached to its terminals.

As already discussed, prior-art SAW transducers generally have two terminals, one of which is hard-wired to each conductive finger; a simple example of such a prior-art SAW transducer is shown schematically in FIG. 6. Referring to FIG. 6, first SAW terminal 490 is connected to fingers 491, 495, and 499. Second SAW terminal 492 is connected to fingers 493 and 497. This simple alternating pattern is not to be considered limiting but is merely an example of the type of pattern of connections which might be made between the conductive fingers of a SAW transducer and its terminals. Although not shown in the (schematic) drawing of FIG. 6, it is implied that the fingers are disposed in proximity to a piezoelectric substrate with spacings appropriate for a desired SAW mode. The particular substrate and mode are not important for the present invention; the methods disclosed here are intended to be applicable for any substrate and any surface mode.

FIG. 7a shows a schematic diagram of a programmable SAW transducer 2000 of the present invention, which incorporates segmented ladder 400 to provide programmability at a cost of three additional external connections: terminals 50e, 62e and 64e, used only during programming. Terminals 60e and 69e are also used during programming, but after programming they form the required first and second SAW terminals, respectively, of the programmed transducer, corresponding to SAW terminals 490 and 492 of FIG. 6. Second conductors 51a,53a,55a,57a,59a of ladder 400 are now extended into a series of parallel conductive tracks which form the fingers of SAW transducer 2000, corresponding to fingers 491,493,495,497,499 of FIG. 6, respectively. Thus these second conductor numbers (51a,53a,55a,57a,59a) will be used interchangeably in the following discussions to designate these second conductors, fingers or tracks. It is assumed that fingers 51a,53,55,57a,59a are disposed in proximity to a piezoelectric substrate with appropriate spacings, identical to those of fingers 491, 493, 495, 497, 499 of FIG. 6.

As can be seen from FIG. 7a, segmented ladder 400 is supplemented by the addition of two "segmentation assist" rails 62,64 with their terminals 62e,64e and their included small three-state programmable elements 121,123,125,127, 129 and 141,143,145,147,149, respectively. First conductor 69 and its associated large three-state programmable elements 211, 213, 215, 217, 219 connect to second terminal 69e of the programmable SAW transducer and provide a means of connecting fingers 51a,53a,55a,57a,59a to this second transducer terminal. When it is desired to connect one of fingers 51a–59a to the first transducer terminal after programming, the appropriate one of fuses 23a–e is simply left unblown after programming. Assist rails 62,64 and first conductor 69 provide the separate means of accessing second conductors 51a–59a in order to be able to disconnect fuses 23a–e of ladder 400 when desired, as described in the discussions of FIG. 4a; they form programming means whereby fuses 23a–e may be blown.

As discussed previously with regard to preconfigured SAW devices, it is possible to build a SAW device configured with a predetermined digital finger-connection pattern so that it responds preferentially to an input electrical signal with a corresponding digital phase-reversal pattern; programmable SAW transducer 2000 of the present invention takes this concept a step further, since it can be configured with such a digital finger-connection pattern in the field by programming it electrically through terminals 50e, 60e, 62e,64e and 69e.

Since transducer 2000 includes a segmented ladder 400, first and second terminals 50e and 60e play the same roles in programming as in the discussions of FIGS. 4a–c. After programming is completed, master terminal 60e of ladder 400 forms the first SAW terminal of SAW transducer 2000, corresponding to SAW terminal 490 of FIG. 6, and terminal 69e forms the second SAW terminal of transducer 2000, corresponding to SAW terminal 492 of FIG. 6. Again, SAW transducer 2000 includes five fingers only for simplicity, but this should not be considered limiting, those of ordinary skill in the art will see that programmable transducers with many more fingers might be built and programmed using the same techniques disclosed here. In fact, if many fingers are required, a larger hierarchical assisted ladder 4000 (like that shown in FIG. 5, where its required third ladder terminal(s) are also required), comprising a plurality of smaller segmented ladders connected together, may be substituted for ladder 400.

Referring now to FIG. 7a, it is apparent that programmable transducer 2000 includes a segmented ladder 400 as described earlier, with its slave terminals 51–59 initially connected to its ground terminal 50e by small fuses 12a–e, connected to second conductors 51a–59a by large fuses 23a–e, respectively, and linked each to the next by antifuses 42a–d. As before, said ladder has a first ground ladder terminal 50e, and a second master ladder terminal 60e which is connected to slave terminal 51; if a larger combined ladder 4000 like that shown in FIG. 5 is substituted, there may be one or more intermediate assist terminals as well. Third conductors or segmentation assist rails 62 and 64, with their terminals 62e and 64e, respectively, intersect and are connected to fingers 51a,53a,55a,57a,59a by small three-state elements at their respective intersections. Specifically, small three-state element 121 is connected between third conductor 62 and finger 51a. Small three-state element 123 is connected between third conductor 62 and finger 53a. Small three-state element 125 is connected between third conductor 62 and finger 55a. Small three-state element 127 is connected between third conductor 62 and finger 57a. Small three-state element 129 is connected between third conductor 62 and finger 59a. Small three-state element 141 is connected between third conductor 64 and finger 51a. Small three-state element 143 is connected between third conductor 64 and finger 53a. Small three-state element 145 is connected between third conductor 64 and finger 55a. Small three-state element 147 is connected between third conductor 64 and finger 57a. Small three-state element 149 is connected between third conductor 64 and finger 59a. First conductor 69 is connected to and controlled by the opposing terminal 69e of SAW transducer 2000, and is connected to fingers 51a,53a,55a,57a, and 59 by large three-state elements 211,213,215,217, and 219, respectively.

Operation of Programmable Surface Acoustic Wave Transducer—FIGS. 6, 7a, 7b

Programming of SAW transducer 2000 is quite similar to the programming of segmented ladder 400 of FIG. 4a, with the additional restrictions imposed by the presence of rails 62,64 and 69. The basic plan of programming is as follows. As before, at each intermediate stage of the programming sequence of the segmented ladder 400, master terminal 60e is temporarily connected to a finger 5xa, where x is one of 1,3,5,7,9 so that 5xa is one of 51a,53a,55a,57a, or 59a. Once this connection is made, finger 5xa can further be connected to third conductors 62 and 64 by shorting small three-state elements 12x and 14x, and then to first conductor 69 by shorting large three-state element 21x. Once rails 62,64 and 69 are attached, there are four connections to finger 5xa: one from master terminal 60e through one of large fuses 23a–e, two connections through small three-state elements 12x and 14x, and one through large three-state element 21x. The user selects which of the two large elements is desired to remain after programming, and then uses the "gang" formed by this desired large element in parallel with the two small elements 12x and 14x to blow the undesired large element. Then the user can blow small elements 12x and 14x, individually, by passing the small-fuse blowing current through the desired remaining large element. This leaves the finger with a single connection, through a large programmable element, to the desired one of the two SAW terminals of programmable transducer 2000.

A detailed programming sequence for example transducer 2000 follows; this sequence details how a user might configure programmable transducer 2000 to match the connection pattern shown in the prior-art SAW transducer of FIG. 6. As before, ground terminal 50e may be considered to be at ground potential during the entire programming sequence. To begin with, the user must program ladder 400 to its first intermediate state, with master terminal 60e connected to finger 51a but isolated from the other fingers and from ground terminal 50e. This may be done as before by blowing fuse 12a, with the fuse blowing current imposed between second and first terminals 60e and 50e; the only difference now is that the user must also decide at this point what conditions are to be applied to terminals 62e,64e and 69e. With ground terminal 50e considered as ground, assume that the voltage on terminal 60e rises above ground toward Vpp in order to apply the fuse current. Then it is apparent that the safest condition to apply to terminals 62e, 64e and 69e (in order to ensure that programmable elements 121,141,211 do not program when terminal 60e approaches Vpp) is to apply a voltage of Vpp/2 to terminals 62e,64e and 69e before blowing fuse 12a. Then 60e can be raised from ground as high as Vpp without the voltage across elements 121,141, 211 ever exceeding the range +/−Vpp/2. Actually, the requirements of antifuse 42a of ladder 400 ensure that terminal 60e will not exceed +/−Vpp/2 during the programming of fuse 12a; so terminals 62e,64e and 69e could also be held at ground if this is preferred. However, when programming the antifuses of ladder 400, a voltage of Vpp does appear on terminal 60e (referenced to terminal 50e), so we continue with the assumption that terminals 62e,64e and 69e will be held at Vpp/2 during this programming event. With this assumption, all the other three-state elements along rails 62,64 and 69 will experience a voltage of Vpp/2 as well under this condition, since fingers 53a,55a,57a,59a are still connected to terminal 50e at this point. So, with this condition, fuse 12a may be blown without any concern about inadvertently programming any of the three-state elements connected along rails 62,64 and 69.

Now ladder 400 has achieved its first intermediate state with terminal 60e connected to finger 51a but isolated from the other fingers. In this state, as discussed earlier, voltages of up to +/−Vpp/2 may be applied to terminal 60e (and thus routed to second conductor 51a), referenced to an assumed ground on terminal 50e, without disturbing the programmable elements within ladder 400. Terminals 60e, 62e, 64e and 69e are now all raised to Vpp/2, which again will cause nothing to program. Next, in order to short three-state elements 121, 141 and 211, respectively, the voltage of each of terminals 62e,64e and 69e may temporarily be dropped individually, in sequence, to −Vpp/2, as parts of three separate antifuse shorting procedures including at least a step of applying a voltage of Vpp across the terminals of each respective three-state element; after each shorting procedure, the appropriate terminal can be floated.

At this point, finger 51a is connected to master terminal 60e through a ladder 400 connection including fuse 23a, to first conductor 69 through shorted large three-state element 211 (which in this shorted state is electrically equivalent to a large fuse), and to third conductors 62 and 64 through shorted small three-state elements 121 and 141. To program finger 51a (first finger of transducer 2000) to be connected after programming to terminal 60e (first terminal of transducer 2000), it is necessary to next blow large three-state element 211 by passing current $$I_{prog}^{large}$$

through element 211 without affecting elements 121, 141 and fuse 23a. As discussed in the programming section above, it is possible to blow a single large fuse by passing the current through a gang consisting of one large and two small fuses in parallel. So if terminals 62e,64e and 60e are connected in parallel, and current $$I_{prog}^{large}$$

is passed from terminal 69e through element 211 to terminals 62e,64e and 60e, then element 211 will be blown without damaging elements 121, 141 and fuse 23a, and finger 51a will be disconnected from first conductor 69 as desired. If we still consider that terminal 50e is ground during this programming event, it is best if the voltage applied to terminals 62c,64e,60e, connected together, is allowed to vary from 0v in one direction and the voltage applied to rail 69 varies in the other direction, so that the voltage applied to induce the fuse current to flow is symmetric around ground.

To simplify the discussion, we begin at this point to use the terminology of a "programming apparatus" or programmer defined briefly in the programming section above; in this parlance the last event (blowing large three-state element 211) is described by saying: that the first programmer terminal may be attached to terminal 69e; that the second programmer terminal is attached to terminals 62e, 64e, 60e; that terminal 50e is connected to the third programmer terminal; and a large fuse programming procedure is performed. As previously discussed, it is assumed in the discussion of the small examples contained herein that perfect current balancing is always attained, and that the programming apparatus provides for protection against undesired premature programming of anti fuses and three-state elements in the array. Although the definitions of which potential is considered ground may be altered by this alternate description, ground is only a reference after all and nothing significant is changed by this. The description in terms of connections to the appropriate terminals of a programming apparatus is simply a convenient shorthand. This method of description will be used hereinafter for the further discussions of the programming of SAW transducer 2000 and the more-complicated structures following.

After large element 211 is blown, assist rails 62 and 64 are no longer required for finger 51a. After attaching terminals 62e and 60e,64e to the first and second programmer terminals, respectively, and terminals 50c,69e to the third programmer terminal, a small fuse blowing procedure is applied, disconnecting element 121. Finally, attaching terminals 64c and 60e to the first and second programmer terminals, respectively, and terminals 50e,62e, 69e to the third programmer terminal, a small fuse blowing procedure is applied, disconnecting element 141. The programming of finger 51a is complete.

In order to proceed to the second intermediate state of ladder 400 within transducer 2000, antifuse 42a must next be shorted. Connecting terminals 50e and 60e to the first aid second programmer terminals, respectively, and connecting terminals 62e,64e,69e to the programmer's third terminal, an antifuse shorting procedure may be applied to short antifuse 42a. Leaving the connections to the programming apparatus the same, a small fuse blowing procedure may be performed next, blowing fuse 12b. Now ladder 400 has achieved its second intermediate state, with terminal 60e connected to finger 53a and isolated from fingers 55a,57a, 59a. Note that terminal 60e also has a permanent desired connection to finger 51a through unblown fuse 23a; however, this will not cause any concerns during programming because all antifuses and three-state elements along finger 51a are already programmed. Effectively, finger 51a is merely attached as a "stub" to terminal 60e with no further affect in the programming sequence.

From here, the user proceeds to attach assist rails 62,64 and first conductor 69 to finger 53a, by shorting three-state elements 123,143 and 213. First, the user connects the first and second programmer terminals to terminals 62e and 60e, respectively, and connects the third programmer terminal to terminals 50e,64e,69e, an antifuse shorting procedure shorts element 123. Next, the user connects the first and second programmer terminals to terminals 64e and 60e,62e, respectively, (since element 123 is now shorted terminals 60e and 62e must be attached to the same programmer terminal) and connects the third programmer terminal to terminals 50e,69e; an antifuse shorting procedure shorts element 143. Finally, the user connects the first and second programmer terminals to terminals 69e and 60e,62e,64e, respectively, and connects the third programmer terminal to terminal 50e; an antifuse shorting procedure shorts element 213. Assist rails 62,64 and first conductor 69 are now connected to finger 53a, as desired.

Referring to FIG. 6, we see that it is desired to leave finger 53a permanently connected to first conductor 69 through shorted large three-state element 213; this means we must next blow large fuse 23b. Attaching the first programmer terminal to terminal 60e, the second programmer terminal to terminals 62e, 64e, 69e, and the third programmer terminal to terminal 50e, and applying a large fuse programming procedure blows fuse 23b.

After large fuse 23b is blown, assist rails 62 and 64 are no longer required for finger 53a. After attaching terminals 62e and 69e,64e to the first and second programmer terminals, respectively, and terminals 50e, 60e to the third programmer terminal, a small fuse blowing procedure is applied, disconnecting element 123. Finally, attaching terminals 64e and 69e to the first and second programmer terminals, respectively, and terminals 50e,62e,60e to the third programmer terminal, a small fuse blowing procedure is applied, disconnecting element 143. Finger 53a is left connected (through shorted large three-state element 213) as a stub to first conductor 69. The programming of finger 53a is complete.

In order to proceed to the third intermediate state of ladder 400 within transducer 2000, antifuse 42b must next be shorted. Connecting terminals 50e and 60e to the first and second programmer terminals, respectively, and connecting terminals 62e, 64e, 69e to the programmer's third terminal, an antifuse shorting procedure may be applied to short antifuse 42b. Leaving the connections to the programming apparatus the same, a small fuse blowing procedure may be performed next, blowing fuse 12c. Now ladder 400 has achieved its third intermediate state, with terminal 60e connected to finger 55a and isolated from fingers 53a,57a, 59a. Note that terminal 60e also has a permanent desired connection to finger 51a through unblown fuse 23a, and terminal 69e has a permanent desired connection to finger 53a (through shorted large three-state element 213); however, this will not cause any concerns during programming because all antifuses and three-state elements along fingers 51a, 53a are programmed. Effectively, fingers 51a and 53a are merely attached as stubs to terminals 60e and 69e, with no further affect in the programming sequence.

From here, the user proceeds to attach assist rails 62,64 and first conductor 69 to finger 55a, by shorting three-state elements 125,145 and 215. First, the user connects the first and second programmer terminals to terminals 62e and 60e, respectively, and connects the third programmer terminal to terminals 50e,64c,69e; an antifuse shorting procedure shorts element 125. Next, the user connects the first and second programmer terminals to terminals 64c and 60e,62e, respectively, (since element 125 is now shorted, terminals 60e and 62e must be attached to the same programmer terminal) and connects the third programmer terminal to terminals 50e, 69e; an antifuse shorting procedure shorts element 145. Finally, the user connects the first and second programmer terminals to terminals 69 and 60e,62e,64e, respectively, and connects the third programmer terminal to terminal 50e; an antifuse shorting procedure shorts element 215. Assist rails 62,64 and first conductor 69 are now connected to finger 55a, as desired.

Referring to FIG. 6, we see that it is desired to leave finger 55a permanently connected to master terminal 60e through unprogrammed large fuse 23c; this means we must next blow large three-state element 215. Attaching the first programmer terminal to terminal 69e, the second programmer terminal to terminals 62e, 64e, 60e, and the third programmer terminal to terminal 50e, and applying a large fuse programming procedure blows element 215.

After large three-state element 215 is blown, assist rails 62 and 64 are no longer required for finger 55a. After attaching terminals 62e and 60e,64e to the first and second programmer terminals, respectively, and terminals 50e and 69e to the third programmer terminal, a small fuse blowing procedure is applied, disconnecting element 125. Finally, attaching terminals 64e and 60e to the first and second programmer terminals, respectively, and terminals 50e,62e and 69e to the third programmer terminal, a small fuse blowing procedure is applied, disconnecting element 145. Finger 55a is left connected (through unblown large fuse 23c) as a stub to master terminal 60e. The programming of finger 55a is complete.

In order to proceed to the fourth intermediate state of ladder 400 within transducer 2000, antifuse 42c must next be shorted. Connecting terminals 50e and 60e to the first and second programmer terminals, respectively, and connecting terminals 62e,64e,69e to the programmer's third terminal, an antifuse shorting procedure may be applied to short antifuse 42c. Leaving the connections to the programming apparatus the same, a small fuse blowing procedure may be performed next, blowing fuse 12d. Now ladder 400 has achieved its fourth intermediate state, with terminal 60e connected to finger 57a and isolated from finger 59a.

From here, the user proceeds to attach assist rails 62,64 and first conductor 69 to finger 57a, by shorting three-state elements 127,147 and 217. First, the user connects the first and second programmer terminals to terminals 62e and 60e, respectively, and connects the third programmer terminal to terminals 50e,64c,69e; an antifuse shorting procedure shorts element 127. Next, the user connects the first and second programmer terminals to terminals 64e and 60e,62e, respectively, (since element 127 is now shorted, terminals 60e and 62e must be attached to the same programmer terminal) and connects the third programmer terminal to terminals 50e,69e, an antifuse shorting procedure shorts element 147. Finally, the user connects the first and second programmer terminals to terminals 69e and 60e,62e,64e, respectively, and connects the third programmer terminal to terminal 50e, an antifuse shorting procedure shorts element 217. Assist rails 62,64 and first conductor 69 are now connected to finger 57a, as desired.

Referring to FIG. 6, we see that it is desired to leave finger 57a permanently connected to first conductor 69 through shorted large three-state element 217; this means we must next blow large fuse 23d. Attaching the first programmer terminal to terminal 60e, the second programmer terminal to terminals 62e, 64e, 69e, and the third programmer terminal to terminal 50e, and applying a large fuse programming procedure blows fuse 23d.

After large fuse 23d is blown, assist rails 62 and 64 are no longer required for finger 57a. After attaching terminals 62e and 69e,64e to the first and second programmer terminals, respectively, and terminals 50e, 60e to the third programmer terminal, a small fuse blowing procedure is applied, disconnecting element 127. Finally, attaching terminals 64e and 69e to the first and second programmer terminals, respectively, and terminals 50e,62c,60e to the third programmer terminal, a small fuse blowing procedure is applied, disconnecting element 147. Finger 57a is left connected (through shorted large three-state element 217) as a stub to first conductor 69. The programming of finger 57a is complete.

In order to proceed to the fifth and final intermediate state of ladder 400 within transducer 2000, antifuse 42d must next be shorted. Connecting terminals 50e and 60e to the first and second programmer terminals, respectively, and connecting terminals 62e,64e,69e to the programmer's third terminal, an antifuse shorting procedure may be applied to short antifuse 42d. Leaving the connections to the programming apparatus the same, a small fuse blowing procedure may be performed next, blowing fuse 12e. Now ladder 400 has achieved its fifth intermediate state, with terminal 60e connected to finger 59a.

From here, the user proceeds to attach assist rails 62,64 and first conductor 69 to finger 59a, by shorting three-state elements 129,149 and 219. First, the user connects the first and second programmer terminals to terminals 62e and 60e, respectively, and connects the third programmer terminal to terminals 50e,64e and 69e; an antifuse shorting procedure shorts element 129. Next, the user connects the first and second programmer terminals to terminals 64e and 60e,62e, respectively, (since element 129 is now shorted, terminals 60e and 62e must be attached to the same programmer terminal) and connects the third programmer terminal to terminals 50e,69e; an antifuse shorting procedure shorts element 149. Finally, the user connects the first and second programmer terminals to terminals 69e and 60e,62e,64e, respectively, and connects the third programmer terminal to terminal 50e; an antifuse shorting procedure shorts element 219. Assist rails 62,64 and first conductor 69 are now connected to finger 59a, as desired.

Referring to FIG. 6, we see that it is desired to leave finger 59a permanently connected to master terminal 60e through unprogrammed large fuse 23e; this means we must next blow large three-state element 219. Attaching the first programmer terminal to terminal 69e; the second programmer terminal to terminals 62e, 64e, 60e, and the third programmer terminal to terminal 50e, and applying a large fuse programming procedure blows element 219.

After large three-state element 219 is blown, assist rails 62 and 64 are no longer required for finger 59a. After attaching terminals 62e and 60e,64e to the first and second programmer terminals, respectively and terminals 50e,69e to the third programmer terminal, a small fuse blowing procedure is applied, disconnecting element 129. Finally, attaching terminals 64e and 60e to the first and second programmer terminals, respectively, and terminals 50e,62e and 69e to the third programmer terminal, a small fuse blowing procedure is applied, disconnecting element 149. Finger 59a is left connected (through unblown large fuse 23e) as a stub to master terminal 60e. The programming of finger 59a is complete.

FIG. 7b is a schematic representation of programmable transducer 2000 of the present invention after programming is complete. Remember that terminals 60e and 69e correspond to first and second SAW terminal 490 and 492, and fingers 51a, 53a, 55a, 57a, 59a correspond to fingers 491, 493,495,497,499 of FIG. 6. Note that the connectivity of programmed transducer 2000 in FIG. 7b matches the connectivity of the example prior-art SAW transducer shown in FIG. 6; fingers 51a,55a,59a are connected to first SAW terminal 60e by unblown fuses 23a,23c,23e, and fingers 53a,57a are connected to second SAW terminal 69 through shorted three-state elements 213,217, exactly as desired.

Thus, in its final programmed state, programmable SAW transducer 2000 of FIG. 7b has the same connections as prior-art transducer of FIG. 6, and would perform identically to the prior-art SAW transducer. And although this programming sequence is rather involved to describe in words, it might be performed very quickly (probably in less than a second for this small example) by an appropriate computer-controlled programming apparatus. A large custom-wired SAW transducer 2000 could easily be configured, perhaps in minutes or less, in the field with an appropriate programmer, as compared to weeks or months if a custom-wired prior-art SAW transducer is to be designed, laid out on a CAD system, masks made and finally fabricated using plate micro-photolithography in a fab.

Even the requirements for a programming apparatus suitable for programming SAW transducer 2000 are relatively simple. Since transducer 2000 has only five programming terminals 50e,60e,62e,64e,69e, the "reprogrammable means to connect the three programming terminals to the pluralities of terminals" of a programmer for the programmable transducer need only be of order 3 (programmer terminals) by 5 (programming terminals of transducer 2000), so a relay matrix employed as this reprogrammable means need only include oil the order of 15 relays.

Description of Programmable Contact Structures—FIGS. 8, 9a–f, 10, 11a–f

Those of ordinary skill in the art will realize that the following descriptions of the next aspect of the present invention are illustrative only and not in any way limiting. Other embodiments than those presented will readily suggest themselves to such skilled persons.

The present invention also provides a programmable external contact structure for use in a stackable, planar IC package. Ideally, matched pairs of external contacts of the stackable package are aligned on opposing top and bottom faces of the package; each upper or top contact is directly over its corresponding lower or bottom contact. The top and bottom contacts are linked together by an antifuse and "trunk" fuse in series; and both the top and bottom contacts are each connected to a plurality of common package-internal "internal contact terminals" by large fuse elements, where each contact terminal is connected to said top contact by one fuse element and to said bottom contact by one fuse element. The programmable contact structure of the present invention allows a user to selectively connect an internal contact terminal, at least one of which is associated with each such external contact pair, to either the top contact, the bottom contact, or to neither. The contact structure further allows the user to independently connect the top contact to the bottom contact.

For simplicity, the contact structures discussed hereinafter will have only three terminals: a top contact, a bottom contact, and a single common internal contact terminal. Thus, the symbols used to illustrate the contact structure are triangular. However, the described embodiments are illustrative only and not in any way limiting, those of ordinary skill in the art will see that each contact structure could just as easily be connected to two or more internal contact terminals by further fuse elements. Or, a contact structure could have more than one top/bottom contact pair sharing a single internal contact terminal; however, this situation is adequately represented by just using two three-terminal contact structures with their contact terminals connected together or to a common conductor (as will be shown in the example matrix below).

The situation involving multiple internal contact terminals in a single contact structure is not so easily representable by three-terminal contact structures, and might prove useful in providing greater routability, and so should be considered. This increased routability would be gained by allowing one net to use a top contact, and a different net to use the associated bottom contact, within a single contact structure (with multiple internal contact terminals). At the current state of the art, the minimum lateral spacing between contact structures is likely to be limited by the minimum lateral spacing between associated top/bottom contact-pairs rather than any number of internal contact points, since the via required to link top/bottom contact-pairs must run from top surface to bottom surface of the package; so it is advantageous to use as few top/bottom contact-pairs as possible while maintaining the same level of routability. Therefore, a contact structure with two or more internal contact structures would be of interest. The symbols used might be diamond-shaped (for 2 internal terminals) or some more-complicated arrangement for more than 2 internal terminals. Of course, the number of possible programmed states increases as the number of internal terminals increases. For example, the described three-terminal embodiment, with only one internal contact terminal, already has 5 states which are electrically unique (these are enumerated in the discussions of FIG. 9 below). With two internal contact terminals c1 and c2 (and top and bottom contacts t & b), this goes up to 13 unique states, which are: 1) no connections; 2) only t-b connected; 3) t-b-c1 connected; 4) t-b-c2, 5) t-b-c1-c2; 6) t-c1; 7) t-c2; 8) t-c1-c2; 9) b-c1, 10) b-c2; 11) b-c1-c2; 12) t-c1 & b-c2; 13) t-c2 & b-c1. Of these, only the last two states make it worthwhile to have more than one internal terminal; these two states imply that two different nets enter the package through this single contact structure. Using three-terminal contact structures each with a single internal contact terminal) there is no way to accomplish this; so there is some advantage to having more than one internal contact terminal in a contact structure.

With three internal terminals, there are at least 33 unique states. Clearly, although there is an advantage in providing more than one internal terminal per contact structure, the discussions will be greatly complicated by including them in the described embodiments. Since the principles involved are adequately demonstrated without getting into this level of complexity, the embodiments presented hereinafter will all be based on the simplest form, a three-terminal contact structure with a single internal contact terminal.

The three-terminal form of the programmable contact structure of the present invention allows five unique programmed states, with the single common contact terminal electrically connected to: 1) both top and bottom contacts; 2) only the top contact; 3) only the bottom contact; 4) neither contact (but with top and bottom contacts connected); or 5) neither contact (with top and bottom contacts disconnected).

FIG. 8 shows a three-terminal contact structure 300 of the present invention. Each contact structure comprises a bottom contact 54B and a corresponding top contact 54T, connected together by an antifuse element 49 in series with a trunk fuse element 32. Top contact 54T is further connected by a large fuse element 21a to common "internal contact terminal" 52. Similarly, bottom contact 54B is connected to contact terminal 52 by large fuse element 21b. Programming of the contact structure is accomplished by programming the fuse elements and antifuse elements through terminals 52, 54B, and 54T.

FIG. 9 shows contact structure 300 in its possible programmed states.

In FIG. 9a, programmed contact structure 300a has its terminals 52, 54B, and 54T all shorted together. Fuse 21a has been opened by connecting terminals 52,54B together to the first terminal of a programming apparatus, connecting terminal 54T to the second terminal, and applying a large fuse programming process to fuse 21a. Subsequently, antifuse 49 has been shorted by applying an antifuse programming process with the terminal connections unchanged.

FIGS. 9a–f show programmed contact structure 300b, a similar state in which terminals 52, 54B, and 54T are shorted together in a different manner. Fuse 21b has been opened, rather than fuse 21a, by connecting terminals 52,54T and 54B to the first and second terminals of a programming apparatus, respectively, and then applying a large fuse programming process to fuse 21b. Subsequently, antifuse 49 has been shorted by applying an antifuse programming process with the terminal connections unchanged State 300b is electrically equivalent to state 300a, and generally only one of these two programmed states is needed. States 300a and 300b are used in intermediate packages within a net (neither the topmost or bottommost package included in a given net), where a net "trunk" is passing through the package, and where a branch connection is also desired within this same package.

FIG. 9c shows programmed contact structure 300c, a state in which upper contact 54T is connected to lower contact 54B, and both are isolated from contact terminal 52. Fuses 21a and 21b are both opened, and antifuse 49 is shorted. Fuse 21a has been opened by connecting terminals 52 and 54B together to the first terminal of a programming apparatus, connection terminal 54T to the second terminal, and applying a large fuse programming process to fuse 21a. Subsequently, antifuse 49 has been shorted by applying an antifuse programming process, leaving the terminal connections unchanged. Fuse 21b has then been opened by connecting terminal 52 to the first terminal of a programming apparatus, connecting terminal 54T to the second terminal, and applying a large fuse programming process to fuse 21b. State 300c is used in intermediate packages within a net (neither the topmost or bottommost package included in a given net), where a trunk is passing through the package, but no branch connection is desired within this same package.

FIG. 9d shows programmed contact structure 300d, a state in which contact terminal 52 is connected only to bottom contact 54B. Fuse 21a is opened, antifuse 49 is shorted and trunk fuse 32 is opened. Fuse 21a has been opened by connecting terminals 52 and 54B together to the first terminal of a programming apparatus, connecting terminal 54T to the second terminal, and applying a large fuse programming process to fuse 21a. Subsequently, antifuse 49 has been shorted by applying an antifuse programming process with the terminal connections unchanged. Finally, trunk fuse 32 is opened by applying a trunk fuse programming process to fuse 32 with the terminal connections unchanged. State 300d is used in the uppermost package in a net, where a branch connection is desired, but the trunk enters the package from bottom contact 54B and does not pass through the package.

FIG. 9e shows programmed contact structure 300c, a state in which contact terminal 52 is connected only to top contact 54T. Fuse 21b is opened, antifuse 49 is shorted, and trunk fuse 32 is opened. Fuse 21b has been opened by connecting terminals 52 and 54T together to the first terminal of a programming apparatus, connecting terminal 54B to the second programmer terminal, and applying a large fuse programming process to fuse 21b. Subsequently, antifuse 49 has been shorted by applying an antifuse programming process with the terminal connections unchanged. Then, trunk fuse 32 is opened by applying a trunk fuse programming process to fuse 32 with the terminal connections unchanged. State 300e is used in the lowest package in a net, where a "root" connection is desired, but the trunk enters the package from top contact 54T and does not pass through the package.

FIG. 9f shows programmed contact structure 300f, a state in which terminals 52, 54B, and 54T are all isolated from one another. Fuses 21a and 21b are opened, antifuse 49 is shorted, and trunk fuse 32 is opened. Fuse 21a has been opened by connecting terminals 52 and 54B together to the first terminal of a programming apparatus, connecting terminal 54T to the second programmer terminal, and applying a large fuse programming process to fuse 21a. Subsequently, antifuse 49 has been shorted by applying an antifuse programming process with the terminal connections unchanged. Then, trunk fuse 32 is opened by applying a trunk fuse programming process to fuse 32 with the terminal connections unchanged. Finally, fuse 21b has been opened by connecting terminal 52 to the first terminal of a programming apparatus, connecting terminal 54B to the second programmer terminal, and applying a large fuse programming process to fuse 21b. State 300f is used when no net is desired in this location.

FIG. 10 defines a new "shorthand" symbol for contact structure 300. In general, the light triangle represents possible connections, with the terminals 52, 54B and 54T indicated by dark circles at the vertices, and heavy lines indicating actual or potential connections. The symbol shown in FIG. 10 indicates the contact structure in its initial, unprogrammed state. FIGS. 11a–f further defines new symbols for the possible programmed states, where each of the symbols illustrated in FIGS. 11a–f corresponds to a state shown in FIGS. 9a–f, respectively. If no dark line is present in a given position, then it means that no connection is currently present along this leg, and that no potential means of providing a connection exists any longer.

Description of Programmable Interconnection Architecture for Configurable Packages—FIGS. 12ab,13,14,15a–f According to a presently-preferred embodiment of the present invention, contact structures like 300 are arrayed in parallel columns along the top and bottom surfaces of a stackable package. Each top contact is placed directly above its associated bottom contact, and their associated common contact terminal is located near to this location, within the package.

For simplicity, it is useful at this point to define a shorthand nomenclature for referring to the terminals of a contact structure when a complicated network, including multiple contact structures, is being discussed. Contact structures hereinafter will always be identified by a number 3xy, where x and y are integers between 0 and 9, inclusive; for example, contact structure 300 described above conforms to this definition, with x=y=0. Using this definition, we will refer to the terminals of a particular contact structure 3xy using the following notation: 3xy.52 refers to the common contact terminal of contact structure 3xy; 3xy.54B refers to bottom contact 54B of contact structure 3xy; and 3xy.54T refers to top contact 54T of contact structure 3xy.

FIG. 12a shows a schematic diagram of a small example programmable crosspoint matrix 10000 intended for incorporation within a programmable, stackable package, based upon fuses and antifuses and particularly the architectures of the present invention. Although matrix 10000 incorporates contact structures, which are intended primarily for stackable packages, the same techniques disclosed apply to any configurable package. As those of ordinary skill in the art will see, the following descriptions might easily be modified for a standard 2-dimensional package simply by replacing (in the following descriptions) the contact structures attached to each segment of a first conductor with a single external contact attached directly to each said segment, and omitting the programming procedures for the contact structures. If course, optimization of such a 2-dimensional configurable package might be different than for a stackable package, but the same techniques and structures disclosed in the following descriptions would be applicable. Therefore, such skilled persons will realize that the following descriptions of the next aspect of the present invention are illustrative only and not in any way intended to limit the application of the present invention to stackable packages.

In matrix 10000 of FIG. 12a, contact structures 322, 342, 362, 382, 324, 344, 364, and 384 are arrayed in columns at the left side of the diagram and contact structures 326, 346, 366, 386, 328, 348, 368, and 388 are arrayed in columns near the right side of the diagram; this represents a configurable stackable planar IC package wherein these contact structures are arrayed in substantially-parallel columns adjacent to the left and right edges of said package, with the top contacts 3xy.54T of contact structures 3xy (where x and y are selected from the set {2,4,6,8}) physically located top surface of the package, and the bottom contacts 3xy.54B of these same contact structures 3xy physically located on the opposing (bottom) surface of the package.

First conductors 82, 84, 86, 88 of matrix 10000 consist of an array of substantially-parallel tracks, generally disposed in a direction perpendicular to said columns, in the plane of the package. Said first conductors are segmented near their midpoints by large fuses 22,24,26, and 28, respectively; this arrangement is rather straightforward, and it is not necessary to separately number each segment of each first conductor In the following, the particular segment will be designated merely as the left or right portion of a particular first conductor.

Each internal contact terminal 3xy.52 for x,y selected from the set {2,4,6,8} (ie. all contact terminals of the contact structures in matrix 10000) is connected to a first conductor 8x. Thus, contact terminals 322.52 and 324.52 are connected to the left half of first conductor 82, contact terminals 326.52 and 328.52 are connected to the right half of first conductor 82. Contact terminals 342.52 and 344.52 are connected to the left half of first conductor 84; contact terminals 346.52 and 348.52 are connected to the right half of first conductor 84. Contact terminals 362.52 and 364.52 are connected to the left half of first conductor 86; contact terminals 366.52 and 368.52 are connected to the right half of first conductor 86. Contact terminals 382.52 and 384.52 are connected to the left half of first conductor 88; contact terminals 386.52 and 388.52 are connected to the right half of first conductor 88.

Second conductors 51a,53a,55a,57a consist of an array of substantially-parallel conductive tracks, generally disposed in a direction substantially perpendicular to said first conductors, also in the plane of the package, and have intersections with said first conductors. Because there are no external physical contacts to these second conductors, alternate means are required whereby external programming signals may be applied to these conductors during the programming of crosspoint matrix 10000. According to a presently-preferred embodiment of the present invention, this alternate means consists of a segmented ladder 400 of the present invention, where each said second conductor is further connected to and controlled (before and during programming) by the slave terminals of ladder 400. In fact, said second conductors, connected through segmentation fuses 23a–d to slave terminals 51–57, respectively, are the same as the second conductors 51a,53a,55a,57a of ladder 400 within SAW transducer 2000 as shown in FIG. 7a. As in SAW transducer 2000, the second conductors are again extended into a series of parallel conductive tracks. Each second conductor in matrix 10000 also connects directly to a package "internal contact point". Generally, these internal contact points are terminals located physically within the package where there may be difficulty in contacting them physically during programming; however, there is no need to physically contact these terminals when using matrix 10000 based on the architectures of the present invention. The internal contact points represent terminals (such as bond pads inside a die cavity which may subsequently be connected to a semiconductor die) which are desired to be selectively connected to the various external contact points through the contact structures The architectures of the present invention specifically exempts these terminals from the necessity of physical contact, so that conductors within a package that are difficult to access may still be programmably connected to the package external contacts. In FIG. 12a, second conductor 51a terminates in a package internal contact point 51b. Second conductor 53a terminates in a package internal contact point 53b. Second conductor 55a terminates in a package internal contact point 55b. Second conductor 57a terminates in a package internal contact point 57b.

Said second conductors 51a,53a,55a,57a are also connected to first conductors 82, 84, 86, 88 by large three-state programmable interconnection elements located near said intersections between said first and second conductors, in such a way that second conductor 5ya is connected to first conductor 8x by large three-state element 2xy, where x is selected from the set {2,4,6,8} and y is selected from the set {1,3,5,7}. Said intersections are on both sides of first conductor segmentation fuses 22,24,26,28 but are all on the distal side of segmentation fuses 23a–d, in second conductors 51a,53a,55a,57a. Specifically, second conductor 51a is connected to the left segments of said first conductors as follows: to first conductor 82 by large three-state element 221, to first conductor 84 by large three-state element 241, to first conductor 86 by large three-state element 261, and to first conductor 88 by large three-state element 281. Second conductor 53a is connected to the left segments of said first conductors as follows: to first conductor 82 by large three-state element 223, to first conductor 84 by large three-state element 243, to first conductor 86 by large three-state element 263, and to first conductor 88 by large three-state element 283. Second conductor 55a is connected to the right segments of said first conductors as follows: to first conductor 82 by large three-state element 225, to first conductor 84 by large three-state element 245, to first conductor 86 by large three-state element 265, and to first conductor 88 by large three-state element 285. Second conductor 57a is connected to the right segments of said first conductors as follows: to first conductor 82 by large three-state element 227, to first conductor 84 by large three-state element 247, to first conductor 86 by large three-state element 267, and to first conductor 88 by large three-state element 287.

As always, ladder 400 is programmed by applying external programming signals to its first and second terminals 50e and 60e; so these terminals must be connected to package external contact points accessible to the programming apparatus. And of course, if ladder 400 is replaced by a hierarchical ladder, then the required third terminal(s) must also be connected to one or more package external contact point(s).

Again as in SAW transducer 2000, associated third conductors or "segmentation assist rails" 62, 64 are provided, along with their respective terminals 62e,64e, to help program connections to the second conductors. Terminals 62e, 64e must be connected to package external contacts so that rails 62,64 may be externally controlled during programming. Referring to FIG. 12a, assist rail 62 is connected to second conductor 51a by small three-state element 121, to second conductor 53a by small three-state element 123, to second conductor 55a by small three-state element 125, and to second conductor 57a by small three-state element 127. Assist rail 64 is connected to second conductor 51a by small three-state element 141, to second conductor 53a by small three-state element 143, to second conductor 55a by small three-state element 145, and to second conductor 57a by small three-state element 147.

In order to assist in programming each first conductor, fourth conductors or "assist rails" 72,74,76,78, consisting of electrically conductive tracks substantially parallel to the second conductors, are also provided in matrix 10000. Said fourth conductors are also controlled by terminals 72e,74e, 76e,78e, respectively, each of which also forms a package external contact so that these rails may be externally controlled during programming. Fourth conductors 72,74 are located near the left side of the package and intersect each first conductor to the left of segmentation fuses 22,24,26,28; and fourth conductors 76,78 are located near the right side of the package and intersect each first conductor to the right of segmentation fuses 22,24,26,28. Each fourth conductor is connected by small three-state programmable elements to each first conductor in such a way that fourth conductor 7y is connected to first conductor 8x by a small three-state element 1xy located near the intersection of first conductor 8x and fourth conductor 7y, for x,y selected from the set {2,4,6,8}. In particular, left assist rail 72 is connected to first conductor 82 by small three-state element 122, to first conductor 84 by small three-state element 142, to first conductor 86 by small three-state element 162, and to first conductor 88 by small three-state element 182. Left assist rail 74 is connected to first conductor 82 by small three-state element 124, to first conductor 84 by small three-state element 144, to first conductor 86 by small three-state element 164, and to first conductor 88 by small three-state element 184. Right assist rail 76 is connected to first conductor 82 by small three-state element 126, to first conductor 84 by small three-state element 146, to first conductor 86 by small three-state element 166, and to first conductor 88 by small three-state element 186. Right assist rail 78 is connected to first conductor 82 by small three-state element 128, to first conductor 84 by small three-state element 148, to first conductor 86 by small three-state element 168, and to first conductor 88 by small three-state element 188.

When a half-length segment of a first conductor is not connected to any contact structure after programming, it is not desirable to leave it "floating" (unconnected to any external signal). For this reason, and to further assist during programming, fifth conductors or "ground assist rails" 92 and 94, consisting of electrically conductive tracks substantially parallel to the second conductors, are also provided in matrix 10000. Fifth conductors 92,94 terminate in terminals 92e,94e which also form package external contacts so that these rails may also be externally controlled during programming. Fifth conductor 92 is located near the left side of the package and intersects each first conductor to the left of segmentation fuses 22,24,26,28; and fifth conductor 94 is located near the right side of the package and intersects each first conductor to the right of segmentation fuses 22,24,26, 28. The fifth conductors are each connected to the first conductors through large three-state interconnection elements in such a way that fifth conductor 9y is connected to first conductor 8x through large three-state element 2xy, for x selected from the set {2,4,6,8} and y selected from the set {2,4}. Specifically, left ground assist rail 92 is connected to first conductor 82 by large three-state element 222, to first conductor 84 by large three-state element 242, to first conductor 86 by large three-state element 262, and to first conductor 88 by large three-state element 282. Similarly, right ground assist rail 94 is connected to first conductor 82 by large three-state element 224, to first conductor 84 by large three-state element 244, to first conductor 86 by large three-state element 264, and to first conductor 88 by large three-state element 284. After programming, any segment of a first conductor which is not connected to a contact structure is left electrically connected to a ground assist rail. Advantageously, ground assist rails 92 and 94 may then be connected to ground after programming (when the packaged IC is used).

As described in the discussions surrounding the programmable SAW transducer of FIG. 7ab, ladder 400 allows successive connection of terminal 60e to each slave terminal, in a predetermined sequence. Although only four slave terminals are required small example matrix 10000, ladder 400 could include more slave terminals: as shown in FIG. 12a, it has five conductors including a (redundant) slave terminal 59, so that ladder 400 might be identical with ladder 400 of FIGS. 4abc or 7ab. In programming matrix 10000, ladder 400 is used to sequentially connect terminal 60e to only second conductors 51a, 53a, 55a, and 57a.

According to a presently-preferred embodiment of the present invention, matrix 10000 is programmed by inserting a package containing matrix 10000 into a socket with contact points that match the external contact points of the package, such that this socket matingly connects to said external contact points of the package. As discussed previously, an appropriate programming apparatus includes a reprogrammable means (such as an array of relays) to connect its three terminals to the pluralities of conductors controlling an array, in appropriate user-selected patterns. In considering the programming of a configurable package including matrix 10000, this means that the three terminals of an appropriate programmer must be connectable as needed to any of these various socket connections, and therefore to the external contact points of a configurable package inserted in the socket. The socket must therefore have socket contacts which mate with the package external contact points, including at least the following contact points: 1) package top contacts 3*xy*.54T of contact structures 3*xy* (where x and y are selected from the set {2,4,6,8}2) package bottom contacts 3*xy*.54B of these same contact structures 3*xy*; 3) terminals 62*c*,64*e* which control third conductors or assist rails 62,64; 4) terminals 72*e*,74*e*,76*e*, 78*e* which control fourth conductors or assist rails 72,74, 76,78; 5) terminals 92*e*,94*e* which control fifth conductors or "ground assist rails" 92 and 94: and 6) ladder control terminal 50*e*,60*e*.

As before, all conductors of ladder 400 are shorted together prior to programming. This helps protects the antifuses in matrix 10000 from inadvertent programming due to static electricity or other stray voltage disturbances. It is assumed in FIG. 12*a* that shorting means (such as a removable conductive foil attached to the package external contacts of an unprogrammed package in storage) are separately provided to ensure that all external contacts of matrix 10000 are connected together externally prior to programming (so that ladder terminals 50*e* and 60*c* of ladder 400, which control the second conductors, are shorted to the first, third, fourth and fifth conductors).

However, if such external shorting means are not available, one of ordinary skill in the art can see that another internal means might easily be provided by including a conductor (as shown in FIG. 12*b*) which is connected to all first, third, fourth and fifth conductors through small fuses, effectively protecting all antifuses in the matrix from inadvertent programming due to static electricity or other stray voltage disturbances (electrostatic discharge or ESD). For completeness, a quick explanation of such a means is included here. FIG. 12*b* shows a slightly-changed matrix 11000, in which the connections of ladder 400 have been moved one column to the left, allowing second conductor 51*a* to be used as an ESD rail, connected to first conductors 82,84,86,88, third conductors 62,64, fourth conductors 72,74,76,78 and fifth conductors 92,94 through small "ESD" fuse elements 29*a,b,c,d,e,f,g,h,i,j,k,l*, respectively. With this addition, all conductors are initially connected together in matrix 11000. Since second conductor 51*a* is now used for ESD protection, second conductors 53*a*,55*a*,57*a*,59*a* take the places of second conductors 51*a*,53*a*,55*a*,57*a* from matrix 10000 of FIG. 12*a*, respectively. Programming of matrix 11000 is identical with the programming of matrix 10000, with the exception of an ESD disconnection sequence which is as follows.

First, the user should disconnect ground assist rail 94. This is done by attaching terminal 94*e* to the first programmer terminal, attaching all other external contacts to the second programmer terminal, and performing a small fuse blowing operation (with compliance of Vpp/2 or less) to blow fuse 29*l*. To disconnect ground assist rail 92, one attaches terminal 92*e* to the first programmer terminal, attaches all other external contacts to the second programmer terminal, and performs a small fuse blowing operation (with compliance of Vpp/2 or less) to blow fuse 29*k*. To disconnect assist rail 78, one attaches terminal 78*e* to the first programmer terminal, attaches all other external contacts to the second programmer terminal, and performs a small fuse blowing operation (with compliance of Vpp/2 or less) to blow fuse 29*j*. To disconnect assist rail 76, one attaches terminal 76*e* to the first programmer terminal, attaches all other external contacts to the second programmer terminal, and performs a small fuse blowing operation (with compliance of Vpp/2 or less) to blow fuse 29*i*. To disconnect assist rail 74, one attaches terminal 74*e* to the first programmer terminal, attaches all other external contacts to the second programmer terminal, and performs a small fuse blowing operation (with compliance of Vpp/2 or less) to blow fuse 29*h*. To disconnect assist rail 72, one attaches terminal 72*e* to the first programmer terminal. attaches all other external contacts to the second programmer terminal, and performs a small fuse blowing operation (with compliance of Vpp/2 or less) to blow fuse 29*g*. To disconnect assist rail 64, one attaches terminal 64*e* to the first programmer terminal, attaches all other external contacts to the second programmer terminal, and performs a small fuse blowing operation (with compliance of Vpp)/2 or less) to blow fuse 29*f*. To disconnect assist rail 62, one attaches terminal 62*e* to the first programmer terminal, attaches all other external contacts to the second programmer terminal, and performs a small fuse blowing operation (with compliance of Vpp/2 or less) to blow fuse 29*e*.

Next, the user must program ladder 400 to its first intermediate state (terminal 60*e* connected to second conductor 51*a* but isolated from second conductors 53*a*, 55*a*, 57*a*, 59*a*), in order to control ESD rail 51*a* and disconnect ESD fuses 29*a–d*. This is done by first connecting terminal 60*e* to the first terminal of a programming apparatus, connecting terminal 50*e* to the second terminal, connecting all other external contacts to the third programmer terminal; and then applying a small fuse-blowing process. Now that terminal 60*c* controls conductor 51*a*, the user may blow ESD fuses 29*a–d*. The user first blows fuse 29*a*. This is accomplished by first connecting terminal 60*e* to the first terminal of a programming apparatus, connecting terminals 32*y*.54B and 32*y*.54T (to control conductor 82) to the second terminal, and connecting the third programmer terminal to terminals 50*e*,62*e*,64*e*,92*e*,94*e*, 7*ye*, 3*xy*.54B and 3*xy*.54T (where x is selected from the set {4,6,8} and y is selected from the set {2,4,6,8}); and then applying a small fuse-blowing process. The user next blows fuse 29*b*. This is accomplished by first connecting terminal 60*e* to the first terminal of a programming apparatus, connecting terminals 34*y*.54B and 34*y*.54T (to control conductor 84) to the second terminal, and connecting the third programmer terminal to terminals 50*e*,62*e*,64,92*e*,94*e*, 7*ye*, 3*xy*.54B and 3*xy*.54T (where x is selected from the set {2,6,8} and y is selected from the set {2,4,6,8}); and then applying a small fuse-blowing process. The user next blows fuse 29*c*. This is accomplished by first connecting terminal 60*e* to the first terminal of a programming apparatus, connecting terminals 36*y*.54B and 36*y*.54T (to control conductor 86) to the second terminal, and connecting the third programmer terminal to terminals 50*e*,62*e*,64*e*,92*e*,94, 7*ye*, 3*xy*.54B and 3*xy*.54T (where x is selected from the set {2,4,8} and y is selected from the set {2,4,6,8}); and then applying a small fuse-blowing process. The user finally blows fuse 29*d*. This is accomplished by first connecting terminal 60*e* to the first terminal of a programming apparatus, connecting terminals 38*y*.54B and 38*y*.54T (to control conductor 88) to the second terminal, and connecting the third programmer terminal to terminals 50e,62e,64e,92e,94e, 7ye, 3xy.54T and 3xy.54T (where x is selected from the set {2,4,6} and y is selected from the set {2,4,6,8}); and then applying a small fuse-blowing process.

However, the means that a designer chooses to provide ESD protection for the antifuses of an array are not of particular relevance to the present invention. Therefore, in order to reduce the complexity of the already-complicated discussions concerning the programming of a matrix 10000 within a configurable package, it is assumed hereinafter that other external ESD protection means have been provided, that the matrix being programmed is matrix 10000 of FIG. 12a, and that the conductors and terminals are designated as shown in FIG. 12a. one of ordinary skill in the art can see that the same discussion would apply equally well to a matrix 11000 after ESD fuses 29a–l are blown (if conductors 53a,55a,57a,59a are substituted at the appropriate places for conductors 51a,53a,55a,57a, resprespectively). Finally, redundant unconnected second conductor 59a (and the associated programmable elements 42d,12e,23e) of ladder 400 in FIG. 12a will not be shown in FIGS. 15a–f detailing the programming of matrix 10000.

The configurable architecture of the present invention is preferably programmed at the package level; in other words, a design containing many externally-identical stacked packages, whose overall connectivity is defined by the sum of all of the packages, is programmed one package at a time. Only after each "packageful" of architecture is programmed and tested will the stack be assembled, creating the entire desired configuration.

Within each package, each internal contact point 5zb (where z is selected from the set {1,3,5,7}), through its connected second conductor 5za may be selectively connected in a final programmed state to a selected first conductor 8x by shorting large three-state element 2xz; first conductor 8x may in turn be selectively connected to the internal contact terminal 3xy.52 of a desired contact structure 3xy, terminal 3xy.52 may then be connected to either or both of its associated top and bottom contacts 3xy.54T, 3xy.54B. Furthermore, top and bottom contacts 3xy.54T, 3xy.54B of contact structure 3xy may be selectively connected together or isolated from one another; and either or both can be isolated from the associated contact terminal 3xy.52. These possibilities taken together provide a configurable architecture with tremendous power and flexibility.

With these potential configurations, each net can enter a specified package from either a top contact or a bottom contact, and be connected either to a desired internal contact point or to no internal contact point (just passing through); if desired, the signal can continue through the package, or terminate within this package. It is an important feature of the present invention that this architecture can provide significantly more contact structures in each package than are necessary for the actual required package internal contact points, this allows many signals to pass unchanged through a particular package, linking packages higher and lower in the stack, perhaps with no connection at all within this particular package. Altogether, these optional connections form a complete set, capable of interconnecting stacks of semiconductor packages and forming entire systems without the need for any additional interconnection circuitry.

Before proceeding to the programming procedures for matrix 10000, it is useful to discuss one more potential architectural modification, which makes it possible even to program a package with an IC die present in the package, already bonded to the package internal contact points Normally, if an architecture as shown in FIG. 12a is used to provide configurability to a package, it would not be possible to mount the die in the configurable package prior to programming because the voltages required to program fuse elements and especially antifuse elements might damage the die. For this reason, a slight modification to the architectures of FIG. 12ab is presented, for use when a package may be programmed with a die already inside.

FIG. 13 shows an architectural modification 12000 which allows programming of a "die-included" package. Package internal contact points 51b, 53b, 55b, and 57b are now differentiated and isolated from the die-contact points (such as bond pads) 51c, 53c, 55c, and 57c, respectively, by antifuses 41, 43, 45, and 47. The die contact points 51c, 53c, 55c, and 57c are each further connected to a "die protection rail" or sixth conductor 96 by tiny fuse elements 1, 3, 5, and 7, respectively. Sixth conductor 96 is controlled by terminal 96 which also forms a package external contact so that this rail may be externally controlled during programming. During the entire programming of matrix 10000 (as detailed below), all of the die-contact points are held at the same potential, since they are all shorted to sixth conductor 96. None of the antifuses 41, 43, 45, or 47 will be shorted, since the highest voltage difference between any two second conductors 51a,53a,55a,57a during the programming of matrix 10000 will be limited to Vpp/2; although terminal 60e (and thus the appropriate second conductor 5za selected from 51a,53a,55a,57a) is raised to Vpp referenced to terminal 50e (and thus the subsequent second conductors still connected to terminal 50e) when shorting an antifuse within ladder 400, this will not force Vpp across any two second conductors, because the appropriate one of fuses 23a–e connecting second conductor 5za to terminal 60e will always be blown before shorting the next antifuse within ladder 400. After matrix 10000 has been completely programmed as described below, each package internal contact point 51b,53b,55b,57b is connected to at least one package external contact point through a second conductor, a first conductor segment, (possibly) a first conductor segmentation large fuse and another first conductor segment, and a contact structure (including a large fuse and possibly a trunk fuse in series with a shorted antifuse)—i.e. all programmable elements in the connection path are equivalent at least to a large fuse element. Thus, to make the final connections between these internal contact points 51b,53b,55b,57b and the die-contact points (such as bond pads) 51c, 53c, 55c, and 57c, one sequentially connects the first programmer terminal to all of the external contact points linked to a particular package internal contact point; connects the second programmer terminal to sixth conductor 96 and to all of the other contacts linked to any other internal contact point, and then performs an antifuse shorting process followed by a tiny fuse blowing process, which shorts the antifuse isolating the particular package internal contact point from its associated die-contact point and then disconnects the tiny fuse linking this die-contact point to sixth conductor 96. The largest voltage difference experienced between this die-contact point and all the other die-contact points is just the voltage required to blow a tiny fuse; and, since these fuses are not part of the overall architecture, they can be made very small (perhaps much smaller than small fuses), if this is necessary to limit this voltage.

Operation of Programmable Interconnection Architecture for Configurable Packages—FIGS. 12ab,13,14,14a–f

FIG. 14 shows a schematic diagram of a possible programmed state for matrix 10000, using the architecture of the present invention. In this diagram, package internal contact point 51b is connected only to the bottom contact of contact structure 362. Package internal contact point 53b is connected to both the top and bottom contacts of contact structure 326. Package internal contact point 55b is connected to both the top and bottom contacts of contact structure 348. And package internal contact point 57b is connected only to the top contact of contact structure 366. In addition to these connection to package internal contact points, the other contact structures have been configured to pass or not pass other signals which are not connected inside this package, but may need to pass through this package. For example, contact structure 382 has its top and bottom contacts shorted together, so that a signal can pass through this package in this particular location. Similarly, contact structures 322, 324, 344, 364, 384, 346, 386, and 388 also have their top and bottom contacts shorted together. Contact structures 342,328 and 368 have their contacts isolated from one another; this means that no signals pass through this package in these locations. A method for programming matrix 10000 is discussed further below.

By comparing the desired connectivity of FIG. 14 with the architecture of FIG. 12a, one can determine the desired states of all of the programmable elements in matrix 10000 (after programming). The desired states of contact structures 322–388 can be seen explicitly, and are discussed in detail above.

The programmable three-state elements connected to assist rails 62 and 64, and assist rails 72–78 will always be blown after programming; these rails only assist with programming, but form no part of a programmed state of matrix 10000. Primary matrix interconnection elements 221–287 are programmed either shorted or blown to make the necessary required connections between the first and second conductors; in this case, element 261, 223, 245, and 267 will be shorted to make the connections shown in FIG. 14 possible. All other primary matrix interconnections will be blown.

In order to determine the desired states of segmentation fuses 22, 24, 26, and 28, one should note that segmentation fuses need to be connected (unprogrammed) only when a signal from a second conductor on one side of matrix 10000 is to be connected to a contact structure on the other side of matrix 10000. Such a signal uses both halves of a first conductor. Referring to FIG. 14, it can be seen that only second conductor 53a needs to be connected to a contact structure (326) on the other side; this signal will use the entire length of first conductor 82. Second conductors 57a and 51a are connected to their own respective half of first conductor 86, segmentation fuse 26 thus needs to be disconnected to keep these two signals isolated from one another. Second conductor 55a is connected to its own side of first conductor 84; in this case, segmentation fuse 22 should be disconnected to reduce the capacitive loading of this signal. No signal uses first conductor 88, so it is not actually important if segmentation fuse 28 is disconnected or not; in this discussion, such fuses will be disconnected.

Now the desired states of the large three-state programmable elements connected to ground assist rails 92 and 94 can be determined. These rails are not generally a primary part of the configured state of matrix 10000, but are still left connected to first conductors (or segments of first conductors) which are not connected electrically to any second conductor, in order to ground these segments and reduce second-order effects such as signal-integrity problems. As discussed above, both halves of first conductor 82 are used by the signal attached to second conductor 53a; so large three-state elements 222 and 224 must both be disconnected after programming. Only the right half of first conductor 84 is used, so large three-state element 242 will be shorted, and element 244 will be open. Both halves of first conductor 86 are used (by second conductors 51a and 57a), so large three-state elements 262 and 264 will be open after programming. Both halves of first conductor 88 are unused, therefore, large three-state elements 282 and 284 will be shorted in the final programmed state.

In the following discussion, it should be noted that a connection between two conductors through an unshorted antifuse or unshorted three-state element is not considered an electrical connection during programming; i.e. an unshorted antifuse or three-state element is to be considered an open circuit (although it is clearly a potential electrical connection that can be made at a later time). During programming of a matrix such as matrix 10000 of FIG. 12a, any programming step proceeds by: 1) connecting the first (programming) programmer terminal to all external contacts which at this stage in the process are electrically connected (by unblown fuses, shorted antifuses/three-state-elements or other electrical connection) to a first terminal of the programmable element being programmed, 2) connecting the second (programming) programmer terminal to all external contacts which at this stage are connected (by unblown fuses, shorted antifuses/three-state-elements or other electrical connection) to the other terminal of the programmable element being programmed; and 3) connecting all other external contacts of the matrix to the third (non-programming) programmer terminal. This protects all non-selected programmable elements from inadvertent programming. And although there may in general be a preferred directionality to the programming of fuses, or antifuses in particular, this is beyond the scope of the present invention and will not be considered here; it is assumed hereinafter that connecting a first group of external contacts to the first terminal of a programming apparatus and connecting a second group of external contacts to the second terminal of said programming apparatus is completely equivalent to connecting said first group to said second terminal and connecting said second group to said first terminal Those of average skill in the art will see that an appropriate programming apparatus will always allow the connections to be reversed if there is such a preferred directionality.

For simplicity, in the following discussion it is also defined that all external contacts of matrix 10000 which are not explicitly referred to in a programming step are connected to the third (non-programming) programmer terminal, by default. And as mentioned above, in the following it is assumed that the polarity of the programming process is either not important or is automatically adjusted by the programming apparatus. With these assumptions we can describe a particular programming step in the two following identical ways: 1) The first programmer terminal is attached to terminal 50e, the second programmer terminal is connected to terminal 60e, the third terminal is connected to terminals 62e, 64e,7ye, 92e, 94e, 3xy.54B, and 3xy.54T where x and y are selected from the set {2,4,6,8}, and then a small fuse programming process is applied; or 2) Terminals 50e and 60e are connected to the programming terminals and a small-fuse blowing process is applied. In general, hereinafter the second (shorter) form of description will be used.

As mentioned briefly above, third terminals 62e,64e and ladder terminals 50e and 60e are used with fuse/antifuse ladder network 400 to sequentially contact and control second conductors 51a, 53a, 55a, and 57a. In order to begin programming matrix 10000, ladder 400 is first configured to control second conductor 51a. This is performed by first connecting terminals 50e and 60e to the first and second programming terminals and applying a small fuse-blowing process to blow small fuse 12a. Note that this can be accomplished by connecting a current source with compliance of at most Vpp/2, since: 1) it is assumed that $Z^{large}=2$; 2) the design must allow a large fuse to be blown somehow without ever exceeding a maximum voltage of Vpp across the programming terminals; 3) from Eqn. 2 above, therefore $$I_{prog}^{large} = I_{prog}^{small} * 2; \text{ and}$$

and 4) thus if $$I_{prog}^{small} * 2$$

can be applied without exceeding Vpp, then $$I_{prog}^{small}$$

can certainly be applied without exceeding Vpp/2. So this step can not possibly apply a voltage exceeding Vpp/2 between any two second conductors (as required if architecture addition 12000 of FIG. 13 is to remain a viable option).

Once terminal 60e is connected to second conductor 51a and isolated from terminal 50e, assist rails 62 and 64 must also be connected to second conductor 51a. This is accomplished by 1) connecting the first and second programming terminals to terminals 60e and 62e, then applying an antifuse programming procedure to short small three-state element 121; 2) connecting the first and second programming terminals to terminals 60e,62e and 64e, then applying an antifuse programming procedure to short element 141. Note that when attaching rail 64, conductor 62 must be connected to the same terminal as terminal 60e, since they are now connected by shorted three-state element 121 which is to remain connected through this step.

At this point, there is a strong connection to second conductor 51a, consisting of a connection to terminal 60e through large fuse 23a, and connections to assist rails 62 and 64 through small three-state elements 121 and 141. The next step in the programming process is to make the desired connection of second conductor 51a to first conductor 86, through large three-state element 261. This is accomplished by connecting the first programming terminal to all external contacts presently attached to second conductor 51a, i.e. terminals 60e, 62e, and 64e; connecting the second programming terminal to both top and bottom contacts of all contact structures currently connected to first conductor 86, i.e. contact structures 362, 364, 366, and 368; and then applying an antifuse programming procedure. At this point, matrix 10000 is in the state shown schematically in FIG. 15a.

After making this desired connection, it is necessary to remove all other potential (undesired) connections from second conductor 51a. The "gang" consisting of large three-state element 261, large fuse 23a, and small three-state elements 121 and 141 is more than strong enough to blow a large fuse or large three-state element. First one connects terminals 60e, 62e, 64e, and both top and bottom contacts of the contact structures connected to the desired first conductor (86)—362, 364, 366, and 368 to the first programming terminal. Then, one connects top and bottom contacts of all contact structures connected to the first undesired potential connection between second conductor 51a and a first conductor connection (88)—i.e. 382, 384, 386,388 to the second programming terminal, and applies a large three-state element opening procedure, which might include steps like an antifuse shorting procedure and a large fuse blowing procedure. This disconnects undesired large three-state element 281 permanently. Similarly, leaving the connections to the first programming terminal alone, one connects top and bottom contacts of contact structures 342, 344, 346, and 348 to the second programming terminal, and applies a large three-state element opening procedure to permanently disconnect large three-state element 241. Finally, with the connections to the first programming terminal still unchanged, one connects top and bottom contacts of contact structures 322, 324, 326, and 328 to the second programming terminal, and applies a large three-state element opening procedure to permanently disconnect large three-state element 221. At this point, all potential matrix connections between second conductor 51a and all first conductors are in the correct final state, and all that is left is to "clean up" second conductor 51a.

"Cleaning up" second conductor 51a implies getting rid of all connections needed only for programming second conductor 51a; i.e. disconnecting ladder 400 and assist rails 62 and 64 from second conductor 51a. First, one must disconnect ladder 400 by blowing large fuse 23a. The gang of programmable elements used to perform this is formed by large three-state element 261 and small three-state elements 121 and 141. Connecting the first programming terminal to terminals 62e, 64e, and the top and bottom contacts of contact structures 362, 364, 366, and 368, and the second programming terminal to terminal 60e, one applies a large-fuse programming process to disconnect large fuse 23a. Next, one needs to disconnect assist rails 62 and 64 from second conductor 51a. Connecting the first programming terminal to terminal 64e and to the top and bottom contacts of contact structures 362, 364, 366, and 368, and the second programming terminal to terminal 62e, one applies a small-fuse programming procedure to open small three-state element 121. Then, connecting the first programming terminal to the top and bottom contacts of contact structures 362, 364, 366, and 368, and the second programming terminal to terminal 64e, one applies a small-fuse programming procedure to open small three-state element 141. At this point, second conductor 51a is completely configured in its final form.

Connecting the first and second programming terminals to terminals 50e and 60e, one applies an antifuse shorting procedure to short antifuse 42a in ladder 400. Note that fuse 23b was blown before programming antifuse 42a, so no voltage exceeding Vpp/2 was ever connected between second conductor 51a and the remaining second conductors (through their connections to terminal 50e) even when Vpp is applied across terminals 60e,50e to short an antifuse (as required if architecture addition 12000 of FIG. 13 is to remain a viable option).

This configuration is shown schematically in FIG. 15b. As can be seen from the figure, second conductor 51a is now configured and disconnected from ladder 400. In this state, ladder 400 is ready to continue on to program second conductor 53a.

Next, ladder 400 is configured to control second conductor 53a. This is done by first connecting terminals 50e and 60e to the first and second programming terminals and applying a small fuse-blowing process to blow small fuse 12b.

Once terminal 60e is connected to second conductor 53a and isolated from terminal 50e, assist rails 62 and 64 must also be connected to second conductor 53*a*. This is accomplished by 1) connecting the first and second programming terminals to terminals 60*e* and 62*e*, then applying an antifuse programming procedure to short small three-state element 123; 2) connecting the first/second programming terminals to terminals 60*e*,62*e*/64*e*, then applying an antifuse programming procedure to short element 143.

At this point, there is a strong connection to second conductor 53*a*, consisting of a connection to terminal 60*e* through large fuse 23*b*, and connections to assist rails 62 and 64 through small three-state elements 123 and 143. The next step in the programming process is to make the desired connection of second conductor 53*a* to first conductor 82, through large three-state element 223. This is accomplished by connecting the first programming terminal to all external contacts presently attached to second conductor 53*a*, i.e. terminals 60*e*, 62*e*, and 64*e*, connecting the second programming terminal to both top and bottom contacts of all contact structures currently connected to first conductor 82, i.e. contact structures 322, 324, 326, and 328, and then applying an antifuse programming procedure.

After making this desired connection, it is necessary to remove all other potential (undesired) connections from second conductor 53*a*. The "gang" consisting of large three-state element 223, large fuse 23*b*, and small three-state elements 123 and 143 is more than strong enough to blow a large fuse or large three-state element. First one connects terminals 60*e*, 62*e*, 64*e*, and both top and bottom contacts of the contact structures connected to the desired first conductor (82) i.e. 322, 324, 326, and 328 to the first programming terminal. Then, one connects top and bottom contacts of all contact structures connected to the first undesired potential connection between second conductor 53*a* and a first conductor connection (88)—i.e. 382, 384, 386,388 to the second programming terminal, and applies a large three-state element opening procedure. This disconnects undesired large three-state element 283 permanently. Similarly, leaving the connections to the first programming terminal alone, one connects top and bottom contacts of contact structures 362, 364, 366, and 368 to the second programming terminal, and applies a large three-state element opening procedure to permanently disconnect large three-state element 263. Finally, with the connections to the first programming terminal still unchanged, one connects top and bottom contacts of contact structures 342, 344, 346, and 348 to the second programming terminal, and applies a large three-state element opening procedure to permanently disconnect large three-state element 243. At this point, all potential matrix connections between second conductor 53*a* and all first conductors are in the correct final state, and all that is left is to "clean up" second conductor 53*a*.

"Cleaning up" second conductor 53*a* implies getting rid of all connections needed only for programming second conductor 53*a*; i.e. disconnecting ladder 400 and assist rails 62 and 64 from second conductor 53*a*. First, one must disconnect ladder 400 by blowing large fuse 23*b*. The gang of programmable elements used to perform this is formed by large three-state element 223 and small three-state elements 123 and 143. Connecting the first programming terminal to terminals 62*e*, 64*e*, and the top and bottom contacts of contact structures 322, 324, 326, and 328, and the second programming terminal to terminal 60*e*, one applies a large-fuse programming process to disconnect large fuse 23*b*. Next, one needs to disconnect assist rails 62 and 64 from second conductor 53*a*. Connecting the first programming terminal to terminal 64*e* and to the top and bottom contacts of contact structures 322, 324, 326, and 328, and the second programming terminal to terminal 62*e*, one applies a small-fuse programming procedure to open small three-state element 123. Then, connecting the first programming terminal to the top and bottom contacts of contact structures 322, 324, 326, and 328, and the second programming terminal to terminal 64*e*, one applies a small-fuse programming procedure to open small three-state element 143. At this point, second conductor 53*a* is completely configured in its final form.

Next, ladder 400 is configured to control second conductor 55*a*. This is performed by first connecting terminals 50*e* and 60*e* to the first and second programming terminals and applying an antifuse shorting procedure to short antifuse 42*b*, followed by a small fuse-blowing process to blow small fuse 12*e*.

Once terminal 60*e* is connected to second conductor 55*a* and isolated from terminal 50*e*, assist rails 62 and 64 must also be connected to second conductor 55*a*. This is accomplished by 1) connecting the first and second programming terminals to terminals 60*e* and 62*e*, then applying an antifuse programming procedure to short small three-state element 125; 2) connecting the first and second programming terminals to terminals 60*e*,62*e* and 64*e*, then applying an antifuse programming procedure to short element 145.

At this point, there is a strong connection to second conductor 55*a*, consisting of a connection to terminal 60*e* through large fuse 23*c*, and connections to assist rails 62 and 64 through small three-state elements 125 and 145. The next step in the programming process is to make the desired connection of second conductor 55*a* to first conductor 84, through large three-state element 245. This is accomplished by connecting the first programming terminal to all external contacts presently attached to second conductor 55*a*, i.e. terminals 60*e*, 62*e*, and 64*e*; connecting the second programming terminal to both top and bottom contacts of all contact structures currently connected to first conductor 84, i.e. contact structures 342, 344, 346, and 348; and then applying an antifuse programming procedure.

After making this desired connection, it is necessary to remove all other potential (undesired) connections from second conductor 55*a*. The "gang" consisting of large three-state element 245, large fuse 23*c*, and small three-state elements 125 and 145 is more than strong enough lo blow a large fuse or large three-state element. First one connects terminals 60*e*, 62*e*, 64*e*, and both top and bottom contacts of the contact structures connected to the desired first conductor (84), i.e. 342,344, 346, and 348 to the first programming terminal. Then, one connects top and bottom contacts of all contact structures connected to the first undesired potential connection between second conductor 55*a* and a first conductor connection (88)—i.e. 382, 384, 386,388 to the second programming terminal, and applies a large three-state element opening procedure. This disconnects undesired large three-state element 285 permanently. Similarly, leaving the connections to the first programming terminal alone, one connects top and bottom contacts of contact structures 362, 364, 366, and 368 to the second programming terminal, and applies a large three-state element opening procedure to permanently disconnect large three-state element 265. Finally, with the connections to the first programming terminal still unchanged, one connects top and bottom contacts of contact structures 322, 324, 326, and 328 to the second programming terminal, and applies a large three-state element opening procedure to permanently disconnect large three-state element 225. At this point, all potential matrix connections between second conductor 55*a* and all first conductors are in the correct final state, and all that is left is to "clean up" second conductor 55*a*.

"Cleaning up" second conductor 55a implies getting rid of all connections needed only for programming second conductor 55a; i.e. disconnecting ladder 400 and assist rails 62 and 64 from second conductor 55a. First, one must disconnect ladder 400 by blowing large fuse 23c. The gang of programmable elements used to perform this is formed by large three-state element 245 and small three-state elements 125 and 145. Connecting the first programming terminal to terminals 62e, 64e, and the top and bottom contacts of contact structures 342, 344, 346, and 348, and the second programming terminal to terminal 60e, one applies a large-fuse programming process to disconnect large fuse 23c. Next, one needs to disconnect assist rails 62 and 64 from second conductor 55a. Connecting the first programming terminal to terminal 64e and to the top and bottom contacts of contact structures 342, 344, 346, and 348, and the second programming terminal to terminal 62e, one applies a small-fuse programming procedure to open small three-state element 125. Then, connecting the first programming terminal to the top and bottom contacts of contact structures 342, 344, 346, and 348, and the second programming terminal to terminal 64e, one applies a small-fuse programming procedure to open small three-state element 145. At this point, second conductor 55a is completely configured in its final form.

Next, ladder 400 is configured to control second conductor 57a. This is performed by first connecting terminal 50e and 60e to the first and second programming terminals and applying an antifuse shorting procedure to short antifuse 42c, followed by a small fuse-blowing process to blow small fuse 12d.

Once terminal 60e is connected to second conductor 57a and isolated from terminal 50e, assist rails 62 and 64 must also be connected to second conductor 57a. This is accomplished by 1) connecting the first and second programming terminals to terminals 60e and 62e, then applying an antifuse programming procedure to short small three-state element 127; 2) connecting the first and second programming terminals to terminals 60e,62e and 64e, then applying an antifuse programming procedure to short element 147.

At this point, there is a strong connection to second conductor 57a, consisting of a connection to terminal 60e through large fuse 23d, and connections to assist rails 62 and 64 through small three-state elements 127 and 147. The next step in the programming process is to make the desired connection of second conductor 57a to first conductor 86, through large three-state element 267. This is accomplished by connecting the first programming terminal to all external contacts presently attached to second conductor 57a, i.e. terminals 60e, 62e, and 64e; connecting the second programming terminal to both top and bottom contacts of all contact structures currently connected to first conductor 86, i.e. contact structures 362, 364, 366, and 368: and then applying an antifuse programming procedure, shorting element 267.

After making this desired connection, it is necessary to remove all other potential (undesired) connections from second conductor 57a. The "gang" consisting of large three-state element 267, large fuse 23d, and small three-state elements 127 and 147 is more than strong enough to blow a large fuse or large three-state element. First one connects terminals 60e, 62e, 64e, and both top and bottom contacts of the contact structures connected to the desired first conductor (86) i.e. 362, 364, 366, and 368 to the first programming terminal. Then, one connects top and bottom contacts of all contact structures connected to the first undesired potential connection between second conductor 57a and a first conductor connection (88)—i.e. 382, 384, 386,388 to the second programming terminal, and applies a large three-state element opening procedure. This disconnects undesired large three-state element 287 permanently. Similarly, leaving the connections to the first programming terminal alone, one connects top and bottom contacts of contact structures 342, 344, 346, and 348 to the second programming terminal, and applies a large three-state element opening procedure to permanently disconnect large three-state element 247. Finally, with the connections to the first programming terminal still unchanged, one connects top and bottom contacts of contact structures 322, 324, 326, and 328 to the second programming terminal, and applies a large three-state element opening procedure to permanently disconnect large three-state element 227. At this point, all potential matrix connections between second conductor 57a and all first conductors are in the correct final state, and all that is left is to "clean up" second conductor 57a.

"Cleaning up" second conductor 57a implies getting rid of all connections needed only for programming second conductor 57a; i.e. disconnecting ladder 400 and assist rails 62 and 64 from second conductor 57a. First, one must disconnect ladder 400 by blowing large fuse 23d. The gang of programmable elements used to perform this is formed by large three-state element 267 and small three-state elements 127 and 147. Connecting the first programming terminal to terminals 62e, 64e, and the top and bottom contacts of contact structures 362, 364, 366, and 368, and the second programming terminal to terminal 60e, one applies a large-fuse programming process to disconnect large fuse 23d. Next, one needs to disconnect assist rails 62 and 64 from second conductor 57a. Connecting the first programming terminal to terminal 64e and to the top and bottom contacts of contact structures 362, 364, 366, and 368, and the second programming terminal to terminal 62e, one applies a small-fuse programming procedure to open small three-state element 127. Then, connecting the first programming terminal to the top and bottom contacts of contact structures 362, 364, 366, and 368, and the second programming terminal to terminal 64e, one applies a small-fuse programming procedure to open small three-state element 147. At this point, all second conductors 51a,53a,55a,57a are completely configured in their final forms.

At this point in the programming procedure, all second conductors have been configured, all permanent matrix connections (of primary matrix elements 2$xz$ where x is selected from the set $\{2,4,6,8\}$ and z is selected from the set $\{1,3,5,7\}$) have been configured, and ladder 400 is no longer needed. Matrix 10000 is in the state depicted in FIG. 15c. Notice that second conductors 51a and 57a are both connected to first conductor 86: these two signals must be separated by disconnecting segmentation fuse element 26. Also note that first conductor 88 is not used at all; both halves of first conductor 88 must be connected to ground rails when programming is complete.

So, next one configures first conductors 82–88. This consists of configuring segmentation fuses 22, 24, 26, and 28, and contact structures 382–384. This is performed sequentially, one first conductor at a time. In this case, a ladder network is not needed to connect to each first conductor, since there are already multiple external contacts to each first conductor (in the form of top and bottom contacts of contact structures). Thus, this configuration need not be done according to a particular sequence. This discussion will assume that first conductors will be configured in the order 82, 84, 86, and 88.

To configure first conductor 82, one first needs to attach assist rails 72–78 and ground assist rails 92 and 94 to first conductor 82. This is done by connecting top and bottom contacts of contact structures 322–328 to the first programming terminal, and then 1) connecting terminal 72*e* to the second terminal and applying an antifuse programming procedure; 2) removing terminal 72*e* from the second terminal and adding it to the first terminal, then connecting terminal 74*e* to the second terminal, and applying an antifuse programming procedure; 3) removing terminal 74*e* from the second terminal and adding it to the first terminal, connecting terminal 76*e* to the second terminal, and applying an antifuse programming procedure, 4) removing terminal 76*e* from the second terminal and adding it to the first terminal, connecting terminal 78*e* to the second terminal, and applying an antifuse programming procedure; 5) removing terminal 78*e* from the second terminal and adding it to the first terminal, connecting terminal 92*e* to the second terminal, and applying an antifuse programming procedure; and 6) removing terminal 92*e* from the second terminal and adding it to the first terminal, connecting terminal 94*e* to the second terminal and applying an antifuse programming procedure.

This state is shown schematically in FIG. 15*d*. At this point, one is ready to configure first conductor 82. If the segmentation fuse is to be blown, this would be performed next; however, referring back to FIG. 14, one can see that segmentation fuse 22 must be left intact to allow second conductor 53*a* to be connected to contact structure 326. Thus, one proceeds to configure the contact structures.

Note that the gang, present on both halves of first conductor 82, consisting of one shorted large three-state element (on a ground assist rail) and two shorted small three-state elements (on two assist rails) is sufficient in itself to blow a large fuse. Thus, the assist rails and ground assist rails are already sufficient to control each half of a first conductor. In combination with any additional selected matrix connection, plus the remaining connection through the segmentation fuse to the other half of first conductor 82, the gang formed is more than required to blow large fuses.

It is informative to point out that a compliance of Vpp/2 is required during the process of blowing the first of contact structure fuses 3*xy*.21*a,b* for each contact structure 3*xy*, since these fuses are connected in parallel with antifuses 3*xy*.49 when the first of them is blown. This restriction is more stringent than has been imposed so far; however, it is not as limiting as it might seem. Since the connections to these fuses are quite short (at least in part: one terminal of the first fuse blown is directly connected to a package contact, and up to half the fuse-blowing current can pass through only one other fuse to the opposing package contact), there is little resistive voltage drop to subtract from the compliance of the current source. If despite this the designer finds this compliance too limiting at this step, they can always replace antifuses 3*xy*.49 in contact structures 3*xy* with pairs of antifuses in series, at the expense of requiring a step of applying voltage 2*Vpp to program these antifuse pairs (required only when programming contact structures). Those of ordinary skill in the art will see that there are other design techniques that might be implemented in response to any potential problems surrounding this contact-structure compliance issue.

Referring to FIG. 14, one sees that the only desired connection between first conductor 82 and any contact structure is fuse 326.21*a* connecting contact terminal 326.52 to top contact 326.54T of contact structure 326. Thus, all other fuses 32*y*.21*a,b* connecting contact terminals 32*y*.52 to external contacts 32*y*.54T,B for y in {2,4,8} must be blown.

One begins by connecting the first programming terminal to the top and bottom contacts of contact structures 322–328 and terminals 72*e*–78*e* and 92*e*,94*e*. To configure contact structure 322, one first disconnects top contact 322.54T by moving 322.54T from the first programming terminal to the second programming terminal, and applying a large-fuse programming procedure, blowing fuse 322.21*a*. Next, one moves bottom contact 322.54B from the first programming terminal to the second programming terminal, and applies a large-fuse programming procedure, blowing fuse 322.21*b*. At this point, contact structure 322 is completely disconnected from first conductor 82, permanently.

One next configures contact structure 324. First, one connects the first programming terminal to the top and bottom contacts of contact structures 324–328 and terminals 72*e*–78*e* and 92*e*,94*e*. To disconnect top contact 324.54T, one removes 324.54T from the first programming terminal, connects it instead to the second programming terminal, and applies a large-fuse programming procedure, blowing fuse 324.21*a*. Next, one removes 324.54B from the first programming terminal, adds it instead to the second programming terminal, and applies a large-fuse programming procedure, blowing fuse 324.21*b*. At this point, contact structure 324 is completely disconnected from first conductor 82, permanently.

One next configures contact structure 328. First, one connects the first programming terminal to the top and bottom contacts of contact structures 326–328 and terminals 72*e*–78*e* and 92*e*,94*e*. To disconnect top contact 328.54T, one removes 328.54T from the first programming terminal, connects it instead to the second programming terminal, and applies a large-fuse programming procedure, blowing fuse 328.21*a*. Next, one disconnects 328.54B from the first programming terminal, adds it instead to the second programming terminal, and applies a large-fuse programming procedure, blowing fuse 328.21*b*. At this point, contact structure 328 is completely disconnected from first conductor 82, permanently.

Finally, one configures contact structure 326, which includes the desired contact. First, one connects the first programming terminal to the top and bottom contacts of contact structure 326, and terminals 72*e*–78*e* and 92*e*,94*e*. To disconnect undesired bottom contact 326.54B, one removes 326.54B from the first programming terminal, connects it instead to the second programming terminal, and applies a large-fuse programming procedure, blowing fuse 326.21*b*. Since the top contact connection is desired, this is all that is required. At this point, the first-conductor connections of contact structure 326 (and all contact structures 32*y*) are configured as desired; and both left and right segments of first conductor 82 are controlled through top contact 326.54T.

Next, one disconnects unwanted ground assist rails from first conductor 82. In this case, both ground assist rails 92 and 94 must be disconnected. First one connects terminals 72*e*–78*e* and 94*e*, and contacts 326.54T,B to the first programming terminal (it is good practice to continue using both top and bottom contacts until elements 326.32,326.49 are configured). Then, one connects terminal 92*e* to the second programming terminal, and applies a large-fuse programming procedure. This disconnects ground assist rail 92 from first conductor 82 by disconnecting large three-state element 222. Similarly, one disconnects ground assist rail 94 from first conductor 82 by connecting terminals 72*e*14 78*e* and both contacts of contact structure 326 to the first programming terminal, connecting terminal 94*e* to the second programming terminal, and applying a large-fuse programming procedure, disconnecting large three-state element 224.

Finally, one disconnects assist rails 72–78 from first conductor 82 by connecting the first programming terminal to terminals 72e–78e and to contacts 326.54T,B and then: 1) moving terminal 72e to the second programmer terminal and applying a small-fuse programming procedure, 2) moving terminal 74e to the second programmer terminal and applying a small-fuse programming procedure; 3) moving terminal 76e to the second programmer terminal and applying a small-fuse programming procedure: 4) moving terminal 76e to the second programmer terminal and applying a small-fuse programming procedure.

Now that first conductor 82 is configured, one proceeds to configure the associated top contact/bottom contact connections for contact structures 322–328. One connects the first and second programming terminals to the top and bottom contacts of contact structure 322, and applies an antifuse programming procedure. This is repeated for contact structures 324 and 326. For contact structure 328 (which is to have an open circuit between its top and bottom contacts), the first and second programming terminals are connected to the top and bottom contacts, but an antifuse shorting procedure, followed by a trunk-fuse opening procedure is performed. After all of the contact structures have been configured, the state of matrix 10000 is shown schematically in FIG. 15e.

To configure first conductor 84, one first connects assist rails 72–78 and ground assist rails 92 and 94 to first conductor 84 as before for conductor 82, substituting contact structures 342–348 (which are connected to first conductor 84) for contact structures 322–328, respectively.

Since segmentation fuse 24 of first conductor 84 does need to be blown, this is performed next; this is easily done by connecting the top and bottom contacts of contact structures 342 and 344, left assist terminals 72e and 74e, and left ground assist terminal 92e to the first programming terminal; then connecting the top and bottom contacts of contact structures 346 and 348, right assist terminals 76e and 78e, and right ground assist terminal 94e to the second programming terminal; and applying a large-fuse programming procedure to blow large fuse 24.

Next, one proceeds to configure the fuses connecting bottom and lop contacts 34y.54B,T to first conductor 84. Since segmentation fuse 24 is now disconnected, each half of first conductor 84 must be programmed independently. For the left half, first connect terminals 72e,74e and 92e, and contacts 342.54T,B and 344.54T,B to the first programming terminal. Referring to FIG. 14, one sees that there are no desired connections between first conductor 84 and contact structures 342 or 344. Thus, one singly disconnects each top and bottom contact of contact structures 342 and 344 from the first programming terminal, connects it instead to the second programming terminal, and then applies a large-fuse programming procedure to completely disconnect contact structures 342 and 344 from first conductor 84. For the right half of first conductor 84, a similar procedure is used to disconnect the top and bottom contacts of contact structure 346, and the bottom contact only of contact structure 348.

Next, one disconnects unwanted ground assist rails. In this case only ground assist rail 94 must be disconnected; the left half of conductor 84 is unused after programming and will be left attached to ground assist rail 92 so that it will not be left floating. One needs only deal with the right half of first conductor 84 for this. First one connects terminals 76e,78e and 94e and contacts 348.45T,B (only remaining contact to first conductor 84) to the first programming terminal. Then, one moves terminal 94e to the second programming terminal, and applies a large-fuse programming procedure. This disconnects ground assist rail 94 from first conductor 84 by disconnecting large three-state element 244.

Finally, one disconnects assist rails 72–78 by connecting the first programming terminal to terminals 72e–78e and 92e and contacts 348.54T,B and then 1) moving terminal 72e to the second programmer terminal and applying a small-fuse programming procedure to blow element 142: 2) moving terminal 74e to the second programmer terminal and applying a small-fuse programming procedure to blow element 144; 3) moving terminal 76e to the second programmer terminal and applying a small-fuse programming procedure to blow element 146; 4) moving terminal 78e to the second programmer terminal and applying a small-fuse programming procedure to blow element 148.

Now that first conductor 84 is configured, one proceeds to configure the top contact/bottom contact connections for associated contact structures 342–348. One connects the first and second programming terminals to the top and bottom contacts of contact structure 342, and applies an antifuse programming procedure, followed by a trunk fuse programming procedure to disconnect trunk fuse 342.32, since top and bottom contacts 342.54B and 342.54T are to be disconnected. One connects the first and second programming terminals to the top and bottom contacts of contact structure 344, and applies an antifuse programming procedure, connecting top and bottom contacts 344.54B and 344.54T. This is repeated for contact structures 346 and 348. First conductor 84 is fully configured.

To configure first conductor 86, one first connects assist rails 72–78 and ground assist rails 92 and 94 to first conductor 86 as before for conductor 82, substituting contact structures 362–368 (which are connected to first conductor 86) for contact structures 322–328.

Segmentation fuse 26 of first conductor 86 is blown just as segmentation fuse 24 was blown, substituting contact structures 362–368 for contact structures 342–348, respectively.

Next, one proceeds to configure the contact structures. Since segmentation fuse 26 is now disconnected, each half of first conductor 86 must be programmed independently. For the left half, first connect terminals 72e,74 and 92e and contacts 362.54T,B and 364.54T,B to the first programming terminal One singly disconnects each top and bottom contact of contact structures 362 and 364 (except the desired bottom contact of 362) from the first programming terminal, connects it instead to the second programming terminal, and then applies a large-fuse programming procedure. For the right half of first conductor 86, a similar procedure is used to disconnect the bottom contact of contact structure 366, and both contacts of contact structure 368.

Next, one disconnects both ground assist rails by first connecting terminals 72e–78e and 92e,94e and contacts 362.54T,B and 366.54T,B to the first programming terminal. Then, one moves terminal 92e to the second programming terminal, and applies a large-fuse programming procedure, blowing element 262. Then, one moves terminal 94e to the second programming terminal, and applies a large-fuse programming procedure, blowing element 264.

Finally, one disconnects assist rails 72–78 by connecting the first programming terminal to terminals 72e–78e and contacts 362.54T,B and 366.54T,B and then 1) moving terminal 72e to the second programmer terminal and applying a small-fuse programming procedure to blow element 162; 2) moving terminal 74e to the second programmer terminal and applying a small-fuse programming procedure to blow element 164; 3) moving terminal 76e to the second programmer terminal and applying a small-fuse programming procedure to blow element 166; 4) moving assist rail 78e to the second programmer terminal and applying a small-fuse programming procedure to blow element 168.

Now that first conductor 86 is configured, one proceeds to configure the top contact/bottom contact connections for associated contact structures 362–368, analogously to what was done for conductors 82 and 84. One connects the first and second programming terminals to the top and bottom contacts of contact structure 362, and applies an antifuse programming procedure, followed by a trunk fuse programming procedure to disconnect trunk fuse 362.32, since top and bottom contacts 362.54B and 362.54T are to be disconnected. This is repeated for contact structures 366 and 368. Finally, one connects the first and second programming terminals to the top and bottom contacts of contact structure 364, and applies an antifuse programming procedure, connecting top and bottom contacts 364.54B and 364.54T. First conductor 86 is now fully configured.

To configure first conductor 88, one first connects assist rails 72–78 and ground assist rails 92 and 94 to first conductor 88 as before for conductor 82, substituting contact structures 382–388 (which are connected to first conductor 88) for contact structures 322–328.

Since segmentation fuse 28 of first conductor 88 is to be blown, this is performed next; this is done as for first conductor 84, substituting contact structures 382–388 for contact structures 342–348.

Next, one proceeds to configure the contact structures. Since segmentation fuse 28 is now disconnected, each half of first conductor 88 must be programmed independently. For the left half, first connect terminals 72e,74e and 92e and contacts 382.54T,B and 384.54T,B to the first programming terminal. There are no desired connections between first conductor 88 and contact structures 382 or 384. Thus, one singly disconnects each top and bottom contact of contact structures 382 and 384 from the first programming terminal, connects it instead to the second programming terminal, and then applies a large-fuse programming procedure to disconnect contact structures 382 and 384 from first conductor 88. For the right half of first conductor 88, a similar procedure is used to disconnect the top and bottom contacts of contact structure 386, and the bottom contact only of contact structure 388.

Both ground assist rails will remain attached to (unused) first conductor 88 after programming, so no ground-rail disconnect procedure is required.

Finally, one disconnects assist rails 72–78 by connecting the first programming terminal to terminals 72e–78e and 92e,94e and then: 1) moving terminal 72e to the second programmer terminal and applying a small-fuse programming procedure to blow element 182; 2) moving terminal 74e to the second programmer terminal and applying a small-fuse programming procedure to blow element 184; 3) moving terminal 76e to the second programmer terminal and applying a small-fuse programming procedure to blow element 186; 4) moving terminal 78 to the second programmer terminal and applying a small-fuse programming procedure to blow element 188.

As before, one next proceeds to configure the top contact/bottom contact connections for contact structures 342–348. These are each performed just like contact structure 322, substituting 34y for 322 in those procedures, for y selected from the set {2,4,6,8}.

Now that all first conductors have been configured, matrix 10000 is in its final programmed state. This state is shown schematically in FIG. 15f. By comparing FIGS. 15f and 14, one can see that all signals are correctly connected to match the desired configuration.

If a "chip-included" scheme is being used, with the architectural addition 12000 shown in FIG. 13, this must now be programmed. In a chip-included scheme, after matrix 10000 has been programmed, internal contact points 51b,53b,55b,57b are not yet connected to die-contact points 51c,53c,55c,57c; so the connection path are not complete. At this stage, however, each internal contact point of 51b, 53b,55b,57b is connected through second conductors 51a, 53a,55a,57a and through user-selected first conductors and configured contact structures to at least one external contact; so each internal contact point is controlled through the attached external contact(s). For example, a particular antifuse 4z where z is selected from the set {1,3,5,7} may be shorted by holding sixth conductor 96 and all previously-connected die-contact points at ground potential, and then applying an antifuse programming procedure to the appropriate external contact(s). After shorting antifuse 4z, it is necessary to open the accompanying tiny fuse element z which still shorts the die-contact point to sixth conductor 96. During this fuse-blowing operation, a current must be passed through tiny fuse z; therefore a voltage difference must be present between this die-contact point and the other die-contact points that still remain shorted to conductor 96. This voltage can be small, however, since the tiny fuses 1,3,5,7 used to link die-contact points 51c,53c,55c,57c to conductor 96 may be very small fuse elements, an so do not require large currents for programming. Furthermore, the polarity of the fuse-blowing voltage can be controlled separately by the programmer for each die-contact point; so if voltages of a particular polarity are most damaging to a particular die I/O, then the user can avoid application of that polarity to that die-contact point. And since the die-contact points can be connected to the package internal contact points in any desired order, the user can select an order that protects the included die from damage. Using this technique, with a properly-chosen tiny fuse, sequence and polarity scheme, all but the most sensitive of IC dice might be mounted in a configurable package prior to programming, and yet allow a user to subsequently program the package without damaging the die.

Conclusions, Ramifications and Scope of Invention

Accordingly, the reader will see that the several architectural building blocks of the present invention act in concert, providing IC packages with programmable connections between the package external contact points (such as package pins) and package internal contact points, generally for included ICs (such as bond pads).

According to the present invention, these programmable connections are provided by a low-cost, electrically-programmable fuse/antifuse architecture incorporated within each package. Each such enclosed architecture requires no active devices and thus may be built upon a variety of substrates, for easier integration within various packages and lower cost. The described architectures provide efficient configurable, maximum flexibility is provided for the prevalent connections between the internal and external contact points, and minimal flexibility is wasted on the rare connections amongst the groups of internal and external contact points. For the special case of associated top- and bottom-contacts in a stackable package, a contact structure is also described which provides especially short, high-performance connections.

The sequentially-connecting fuse/antifuse ladder network of the present invention, incorporated within each programmable architecture, provides the connections necessary to control the inaccessible package internal contact points and their associated conductors during programming. Connections thus formed through the ladder require no active signals to maintain, and typically are of low impedance. And if a ladder is required to control a very large number of conductors so that the connection impedance does become too high, a further method of hierarchically combining smaller ladders, to make large ladders with improved electrical characteristics, is also provided.

Programming each enclosed architecture requires contact during programming with only a few added external contacts to control the described ladder network, along with the already-accessible external package pins or contacts; no contact with package internal contact points is required. According to a presently-preferred embodiment, the programming is quickly and easily performed by loading the package into a socket whose contacts are controlled by a low-cost programming apparatus, just as other field-programmable devices such as EPROMs are programmed. Such a procedure can be done, perhaps in minutes or seconds, at an end-user's facility, providing a method of configuring the connectivity of such a programmable package with extremely fast turnaround. Once programmed, each configured package retains its state indefinitely without control signals, due to the passive nature of the fuse/antifuse connections.

When the programmable IC package is one of a stacked, interconnected array of such packages, (with the top contacts of each package matably connected with the bottom contacts of the package above it), the most common programmed connections between external contact points become those linking top and bottom contact points in an associated pair. Each such connection advantageously forms part of the "trunk" of a "tree-like" net; the trunk passes vertically through the package stack. The programmable contact stricture of the present invention provides short, high-performance connections in these positions, optimizing the performance of the overall system. The contact structure also provides flexible, user-defined connections to enter the interconnection architecture and connect with user-selected package internal contact points; these are the "branches" of the tree-like nets. Using stacked packages incorporating the architectures of the current invention, each primary (trunk) net cannot be longer than the total height of the stack; each secondary (branch) connection, between the trunk and a package internal contact point, is limited to roughly the size of the package or less.

Further architectural building blocks are also possible to enhance these capabilities; for example, a means of providing ESD protection to the programmable architecture is described. Also, a structure is disclosed which, when added to the programmable architecture, allows said architecture to be programmed even after assembly, with the IC die mounted and the package sealed.

When an array of such packages is assembled, each including its required IC and programmed with the appropriate connectivity dictated by a system schematic an even more powerful aspect of the present invention becomes apparent. This is the creation of entire systems based on configurable package stacks; an entire system may thus be built without an additional interconnection substrate. And with such a system, new designs might be brought to market much quicker. Consider debugging a present-day system with its custom PC-board, randomly-placed test points to which probes are attached by hand, and assembled packaged parts, system verification is tedious, and the discovery of an error in connectivity of a package or of the PC-board layout is likely to cause days or weeks of delay before debugging can continue (due to the turnaround time for a modified PC-board or package). For a system based on the current invention, particularly with packaged parts configurable with the IC die inside, the equivalent delay would likely be minutes or hours; and the desired test-points might advantageously be routed to a standardized test fixture connected to the assembled stack, making verification easier even when no such errors are found. Surely such a methodology would result in shorter debugging cycles and reduced time-to-market for many such new systems designs.

Accordingly, the reader will see that the several electrically-programmable architectures of the present invention together provide a complete, elegant and practical means whereby stacked packages containing integrated circuits may be connected together in a compact, high-speed assembly, with a significantly-reduced characteristic distance compared to currently-available assemblies of circuits.

Although the descriptions above contains many specificities, these should not be construed as limiting the scope of the invention but as merely a means of illustrating some of the presently preferred embodiments of this invention. For example, those of ordinary skill in the art will see that different embodiments of the present invention could be presented, many of which would be far more complicated than the simple examples shown herein. To begin with, at the present state of the art, packages with hundreds or thousands of architecture terminals would likely be used, rather than the handful used in the descriptions. Using the techniques described herein, interconnection networks of great power and complexity might be constructed and programmed with external electrical connections to only to a subset of the included conductors, with the remainder of these network conductors accessible through a ladder network. Many different types of networks of stacked packages or other programmable substrates could be constructed, with requirements and limitations quite different from those described herein.

For example, modifications of the described architecture, within the scope of the present invention, might allow nets to connect different package external contacts within a package, allowing "multi-trunk" nets, linked by a branch connection. Or it might be advantageous in some situations to link package external bottom contacts to top contacts that are not directly above the bottom contacts; for example, each bottom contact might be linked with a top contact one space away, rather than Just above. This would form treelike nets with non-vertical trunks, which might have advantages in reducing average net-length or increased routability. Indeed, a modified architecture with multiply-segmented conductors might well provide improved performance and reduced size. Or contact structures with a top and bottom contact pair connected by fuse elements to more than one internal contact terminal might be a useful modification; with that arrangement, two branches would become possible within a single contact structure (e.g. one branch connecting a first internal contact terminal through the top contact to a first net running upward; a second branch connecting a second internal contact terminal through the bottom contact to a second net running downward, with top and bottom contacts unconnected).

And such interconnection networks are not limited to systems based on configurable IC packages and programmable SAW transducers. For example, the present invention might also be used to build configurable sockets for IC packages, whose input pins can be scrambled by such a programmable interconnection network, and connected to user-selected ones of the output pins. Again, only a few additional pins for the ladder network plus the already-accessible output pins could be used to program the connections. And cables whose wiring is determined by programming such a network might also be built using the architectures of the present invention. Basically, any situation wherein a configurable connectivity pattern is desired between (but not amongst) two differentiated groups of terminals, without easy access to all of the terminals involved, might benefit from the architectures of the present invention.

Further, the reader will see that, in particular, the sequentially-connecting fuse/antifuse ladder network of the present invention is of even wider-ranging utility; it simply provides a means of sequentially connecting a terminal to each of a plurality of conductors without requiring a previous physical contact to these conductors, which can be useful in a wide variety of applications. In fact, those of ordinary skill in the art will see that the sequentially-connecting ladder networks of the present invention can potentially be useful in virtually any machine wherein it may be desired to encode a permanent digital pattern, and especially if this pattern is to be read back in an analog manner. Examples might as varied as selecting a resistance or capacitance by configuring a connection pattern within an array of resistors (or capacitors), configuring potentials to fix the parameters of a machine once its specific application and desired characteristics are determined, encoding security keys, permanent passwords, identification tags or encryption blocks, etc.; the variety of potential applications of this aspect of the current invention are too many to enumerate here. Even the nature of the programmable elements themselves can be changed, from fuses and antifuses, to other programmable elements, so long as they can receive their programming signals through their two or more terminals, and as long as there is a fuse-like element which can disconnect its two initially-connected primary terminals, and an antifuse-like element which can programmably connect its two initially-disconnected primary terminals.

Thus, the scope of the invention should be determined by the appended claims and their legal equivalents, rather than by the examples given.

I claim:

1. An electrically-programmable ladder network, having a first plurality of ladder control terminals and a second plurality of ladder rung or slave terminals, providing means whereby said slave terminals, and any circuitry connected thereto, may be electrically controlled through said control terminals;
    wherein said control terminals, being advantageously fewer than said slave terminals, yet comprise at least a first ground terminal and a second master terminal;
    wherein said ladder network has an initial, unprogrammed state;
    wherein said ladder network also has a sequence of different programmed ladder states, each state defined by a different one of said slave terminals, said slave terminal being dominated by said master terminal in said state;
        wherein said slave terminal, in said state, is the one programmably connected to said master terminal most recently, whereby said slave terminal is said to be dominated by said master terminal;
            wherein said slave terminal is not connected to said ground terminal in said state;
    wherein said ladder network may be programmably changed from each said state to the next, sequentially, in response to a plurality of predetermined ladder programming signals which may be transmitted to said ladder network through said ladder control terminals;
    wherein said ladder network further comprises:
        a plurality of composite programmable networks or C-nets, each individually and separately comprising:
            an antifuse-like programmable network or A-net, itself individually and separately comprising:
                a plurality of A-net terminals including at least first and second A-net terminals, through which said programming signals may be transmitted to said A-net;
                    wherein said first and second A-net terminals are not electrically connected together through said A-net prior to programming of said A-net; and
                a first passive electrically-programmable means, responsive to ones of said programming signals, whereby at least said first and second A-net terminals may be electrically connected to one another; and
            a fuse-like programmable network or B-net, itself individually and separately comprising:
                a plurality of B-net terminals including at least first and second B-net terminals, through which said programming signals may be transmitted to said B-net;
                    wherein said first and second B-net terminals are electrically connected together through said B-net prior to programming of said B-net; and
                a second passive programmable means, responsive to ones of said programming signals, whereby at least said first and second B-net terminals may be electrically disconnected from each other;
            wherein said second A-net terminal is connected to said second B-net terminal;
        wherein said C-nets are linked together sequentially, forming a C-net chain;
            wherein said C-net chain has a first end comprising said first A-net terminal of a first of said C-nets;
            wherein the first A-net terminal of each successive C-net in said C-net chain is connected to the second A-net terminal of the preceding C-net; and
            wherein said C-net chain has a second end comprising said second A-net terminal of a last of said C-nets;
        wherein the first B-net terminal of each C-net in said C-net chain is connected to said ground terminal;
        wherein said master terminal comprises said first end of said C-net chain; and
        wherein said plurality of slave terminals comprises the second B-net terminal of each C-net in said C-net chain; whereby in each said programmed ladder state, a plurality of ladder non-programming signals, to which said ladder network is unresponsive in said state, may be freely transmitted through said master terminal to its dominated slave terminal, and thereby to said circuitry connected thereto.

2. The ladder network of claim 1:
    wherein each said slave terminal is electrically connected to said ground terminal in said unprogrammed state; and
    wherein, in each said programmed state, said defining slave terminal is programmably disconnected from said ground terminal.

3. The ladder network of claim 2:
    wherein each slave terminal, once dominated by said master terminal in the programmed state which it defines, remains connected to said master terminal thereafter; and wherein each slave terminal which has not yet been dominated by said master terminal remains connected to said ground terminal.

4. The ladder network of claim 2, further comprising:

an additional B-net, whose first B-net terminal is electrically connected to said ground terminal and whose second B-net terminal is electrically connected to said first end of said C-net chain;

wherein said plurality of slave terminals further comprises the second B-net terminal of said additional B-net;

wherein said plurality of predetermined ladder programming signals further comprises an additional ladder programming signal to which said second passive programmable means of said additional B-net is responsive;

wherein said sequence of different programmed ladder states further comprises an additional state wherein said master terminal dominates the second B-net terminal of said additional B-net;

wherein the second B-net terminal of said additional B-net is disconnected from said ground terminal;

by disconnecting the first and second B-net terminals of said additional B-net;

by transmitting said additional ladder programming signal through said control terminals to said additional B-net;

whereby said second passive programmable means of said additional B-net, being responsive to said additional ladder programming signal, is programmed; and wherein said second B-net terminal of said additional B-net, being connected to said first end of said C-net chain, is already connected to said master terminal;

such that said additional state is the first of said programmed ladder states;

whereby said slave terminals and said master terminal are all connected to said ground terminal in said unprogrammed state.

5. The ladder network of claim 4 wherein at least one of said B-nets individually and separately comprises a first fuse element having first and second fuse terminals, such that said first and second B-net terminals of said at least one B-net comprise said first and second fuse terminals, respectively.

6. The ladder network of claim 4 wherein at least one of said A-nets individually and separately comprises a first antifuse element having first and second antifuse terminals, such that said first and second A-net terminals of said at least one A-net comprise said first and second antifuse terminals, respectively.

7. The ladder network of claim 4 wherein at least one of said A-nets individually and separately comprises a plurality of second antifuse elements, each having first and second antifuse terminals;

wherein said antifuse elements are connected together in series, forming an antifuse chain;

wherein said antifuse chain has a first end comprising the first antifuse terminal of a beginning antifuse element of said antifuse elements;

wherein the first antifuse terminal of each successive antifuse in said antifuse chain is connected to the second antifuse terminal of the preceding antifuse; and wherein said antifuse chain has a second end comprising the second antifuse terminal of an ending antifuse element of said antifuse elements;

whereby a group of one or more intermediate antifuse terminal connections are formed, comprising the second antifuse terminal of each antifuse element in the antifuse chain except the ending antifuse element; and wherein said first and second A-net terminals of said at least one A-net comprise said first and second ends of said antifuse chain, respectively.

8. The ladder network of claim 7, wherein said plurality of ladder control terminals further comprises a group of one or more third intermediate assist ladder control terminals, further comprising:

a group of one or more second fuse elements, each having first and second fuse terminals;

wherein said second fuse terminal of at least one of said second fuse elements is connected to one of said intermediate antifuse terminal connections; and wherein said first fuse terminal of said at least one second fuse element is connected to one of said intermediate assist terminals.

9. The ladder network of claim 4 wherein said plurality of ladder control terminals further comprises a third intermediate assist ladder control terminal:

wherein at least one of said A-nets itself individually and separately comprises:

a pair of third antifuse elements comprising initial and final antifuse elements, each having first and second antifuse terminals; and a second fuse element having first and second fuse terminals;

wherein the second antifuse terminal of said initial antifuse element is connected to the second fuse terminal of said second fuse element;

wherein the first antifuse terminal of said final antifuse element is also connected to said second fuse terminal;

wherein said first and second A-net terminals of said A-net comprise the first terminal of said initial antifuse element and the second terminal of said final antifuse element, respectively;

wherein the first fuse terminal of each second fuse element is connected to said intermediate assist terminal.

10. The ladder network of claim 9, further comprising:

an additional second fuse element, having first and second fuse terminals, wherein said first fuse terminal of said additional second fuse element is electrically connected to said intermediate assist ladder control terminal; and wherein said second fuse terminal of said additional second fuse element is electrically connected to either the first or second ladder control terminal;

whereby said slave terminals and said first, second and third control terminals are electrically connected together in said unprogrammed state.

11. A first ladder network according to claim 4, further comprising:

a group of one or more second ladder networks according to claim 4, wherein said second ladder networks are responsive, each to its own predetermined plurality of second-ladder programming signals;

wherein one or more of the C-nets of said first ladder network are first-ladder hierarchical C-nets, each comprising one first-ladder B-net and one associated first-ladder A-net;

wherein said first-ladder B-net comprises a distinct hierarchical second ladder network selected from said one or more second ladder networks, responsive to its own distinct second-ladder programming signals;
wherein the first and second B-net terminals of said first-ladder B-net comprise the first ground and second master control terminals of said distinct hierarchical second ladder network, respectively;
whereby said first ladder network has the distinct first-ladder programmed state wherein the master terminal of said first ladder network dominates the master terminal of said second ladder network, in which state the first and second terminals of said second ladder network are connected to the first and second terminals of said first ladder network, respectively; and
wherein the ladder non-programming signals of said distinct first-ladder programmed state include said distinct second ladder programming signals;
whereby said distinct second ladder may be programmed through said first ladder control terminals when said first ladder is in said distinct first-ladder state;
whereby said master terminal of said first ladder network may dominate the master terminal and each slave terminal of each said hierarchical second ladder network; and
whereby, in each first-ladder programmed state defined by the master terminal of one of said hierarchical second ladder networks;
and in each second-ladder programmed state of said second ladder network;
a plurality of first-ladder/second-ladder non-programming signals, to which both said first ladder network and said second ladder network are unresponsive in said first-ladder/second-ladder state, may be freely transmitted through said first-ladder master terminal, routed through said first ladder network to said second-ladder master terminal, and routed through said second ladder network, to the second-ladder slave terminal defining said second-ladder state, and thereby to said circuitry connected thereto.

12. The ladder network of claim 4 wherein said circuitry connected to said slave terminals comprises a plurality of second conductors;
wherein each of said second conductors is individually and separately connected to a different one of said slave terminals;
whereby said ladder network provides control means for electrically controlling said second conductors.

13. The ladder network of claim 4 wherein said circuitry connected to said slave terminals comprises:
a plurality of second conductors comprising second electrically-conductive tracks;
a group of one or more third fuse elements;
wherein at least one of said tracks is segmented by at least one of said third fuse elements;
wherein said segmented track is broken into a plurality of track segments by a group of one or more gaps in said conductive track;
wherein each different gap in said track is connectively bridged by a different one of said fuse elements such that said track is electrically continuous;
wherein said fuse elements allow said track to be selectively broken at said gaps by programming said fuse elements;
whereby said track is said to be segmented by said fuse elements; and
a first passive programming means whereby said third fuse elements may be programmed;
whereby said ladder network provides segmentable control means for electrically controlling said segmented tracks.

14. The ladder network of claim 4 wherein said circuitry connected to said slave terminals comprises:
a plurality of second conductors comprising second electrically-conductive tracks;
a plurality of third fuse elements;
wherein each track is broken into associated first and second segments by a gap in said track;
wherein each said first segment is connected to its associated second segment through a different one of said third fuse elements;
whereby said track is segmented; and
a first passive programming means whereby said third false elements may be programmed;
whereby said ladder network provides segmentable control means for electrically controlling said plurality of segmented second conductors.

15. The ladder network of claim 4, wherein said circuitry connected to said slave terminals comprises:
a plurality of second conductors;
a plurality of third fuse elements, each having first and second fuse terminals;
wherein each said second conductor is connected to the second fuse terminal of a different one of said third fuse elements; and
wherein the first fuse terminal of each said third fuse element is connected to a different slave terminal selected from said plurality of slave terminals;
such that each second conductor is associated with and connected to a different one of said slave terminals, each through a different one of said third fuse elements; and
a first passive programming means whereby said third fuse elements may be programmed;
whereby each said second conductor, being initially grounded through its connection to said associated initially-grounded slave terminal, may in its turn be disconnected from ground, connected to and controlled by said master terminal, through said ladder network and said slave terminal;
such that said ladder non-programming signals may be transmitted to said second conductor; and
whereby each said second conductor may subsequently be disconnected from said master terminal, said slave terminal and from said ladder network generally by programming said third fuse element through which it is connected to its associated slave terminal;
such that said second conductor is thereafter isolated, both from further ladder programming signals and from ladder non-programming signals which may subsequently be transmitted through said master terminal;
whereby said ladder network provides disconnectable control means for disconnectably controlling said plurality of second conductors.

16. The ladder network and connected circuitry of claim 15:
wherein said second conductors, in a region, comprise second essentially-parallel electrically-conductive fingers or tracks;

wherein said fingers are generally disposed in proximity to a piezoelectric substrate having one or more surface acoustic wave modes;
  wherein the transverse center-to-center spacings between said fingers substantially correspond to said modes of said piezoelectric substrate;
wherein said connected circuitry further comprises:
  a group of one or more first transducer terminals;
  a group of one or more first conductors consisting of first electrically-conductive tracks, each connected to a different one of said first transducer terminals;
  a plurality of first intersections formed where ones of said second conductors intersect with ones of said first conductors;
  a plurality of first three-state programmable matrix elements, each having first and second terminals;
    wherein each said element has:
      an unprogrammed state wherein said terminals are not electrically connected together;
      a first programmed state wherein said terminals are electrically connected together; and
      a second or final programmed state wherein said terminals are not electrically connected together;
    wherein ones of said three-state programmable elements connect ones of said second conductors to ones of said first conductors near their said intersection; and
  a second passive programming means whereby said first three-state programmable elements may be selectively programmed;
    wherein said three-state elements are responsive to predetermined matrix programming signals which may be transmitted to said three-state elements through said ladder control terminals, said first transducer terminals and said second passive programming means;
      wherein the ladder non-programming signals of each programmed state of said ladder network include the matrix programming signals which may be transmitted to said elements through said ladder control terminals in said state;
  wherein a second transducer terminal comprises said master terminal of said ladder network;
whereby said ladder network provides means whereby an electrically-programmable interdigital surface acoustic wave transducer, with user-programmable connections between said fingers of said transducer and said first and second transducer terminals, may be built;
  whereby electrical signals, substantially corresponding to said modes of said piezoelectric substrate and said finger spacings, when transmitted through said transducer terminals after programming is completed, will be transduced into surface acoustic waves of said modes, with properties dependent upon the user-selected pattern of said connections.

17. The ladder network and connected circuitry of claim 15 wherein said second conductors comprise second electrically-conductive tracks, further comprising:
  a user-programmable interconnect architecture, responsive to predetermined architecture programming signals, itself comprising said second conductors and further comprising:
    a first plurality of accessible architecture terminals, wherein direct electrical control of said terminals is practical, such that said architecture programming signals may be transmitted to said interconnect architecture through said terminals, whereby said terminals are accessible;
    a second plurality of inaccessible architecture terminals, wherein direct electrical control of said terminals is not practical, such that said architecture programming signals may not be transmitted to said architecture through said terminals, whereby said terminals are inaccessible;
    first conductors consisting of a first plurality of electrically-conductive tracks;
    a plurality of intersections formed where ones of said first conductors intersect with ones of said second conductors;
    a plurality of passive electrically-programmable first three-state interconnection elements, responsive to ones of said architecture programming signals, each having first and second terminals;
      wherein each said element has:
        an unprogrammed state wherein said terminals are not electrically connected together;
        a first programmed state wherein said terminals are electrically connected together; and
        a second or final programmed state wherein said terminals are not electrically connected together;
      wherein ones of said first conductors are connected to ones of said second conductors through ones of said three-state interconnection elements located near their said intersection; and
    a second passive programming means for selectively programming said first three-state interconnection elements;
  wherein the control terminals of said ladder network are accessible;
  wherein said first passive programming means further comprises a plurality of accessible first programming assist terminals;
  wherein said second passive programming means further comprises a plurality of accessible second programming assist terminals;
  wherein said architecture programming signals comprise:
    a first plurality of direct architecture programming signals which may be transmitted through said accessible terminals; and
    a second plurality of balked architecture programming signals which might advantageously have been transmitted through said inaccessible terminals, had they been accessible;
      wherein said balked architecture programming signals are instead transmitted through said ladder control terminals and routed through said ladder network to said architecture;
        wherein the ladder non-programming signals of each programmed ladder state include the balked architecture programming signals which may be transmitted through said ladder control terminals in said state;
whereby said ladder network provides means whereby said interconnect architecture may be programmed in response to architecture programming signals transmitted through said accessible terminals, but not through said inaccessible terminals.

18. The ladder network and interconnect architecture of claim 17, further comprising:
  a group of one or more seventh fuse elements;
    wherein at least one of said first conductor tracks is segmented by at least one of said seventh fuse elements;

wherein said segmented track is broken into a plurality of track segments by a group of one or more gaps in said track;
  wherein each different gap in said track is bridged by a different one of said fuse elements such that track is electrically continuous before programming;
  wherein said fuse elements allow said track to be selectively broken at said gaps by programming said fuse elements;
 whereby said track is said to be segmented by said fuse elements; and
a seventh passive programming means whereby said seventh fuse elements may be programmed.

19. The ladder network and interconnect architecture of claim 17 wherein each of said inaccessible terminals is electrically connected to a different one of said second conductors, so that:
  notwithstanding the inaccessibility of said inaccessible terminals;
    which prevents said balked architecture programming signals from being transmitted through said inaccessible terminals and thereby through said second conductors to said architecture;
    said signals may instead be transmitted through said ladder control terminals, routed through said ladder network to said second conductors and thereby to said architecture;
whereby said balked signals may effectively be transmitted to said architecture despite said inaccessibility.

20. The ladder network and interconnect architecture of claim 17 wherein said first conductors are electrically connected, before programming, each to a different subset of said accessible terminals.

21. The ladder network and interconnect architecture of claim 17 wherein said network and architecture are contained within an integrated circuit (IC) package, said package having a plurality of exterior surfaces:
  wherein said accessible terminals are physically disposed on said exterior surfaces of said package;
  wherein said inaccessible terminals are not physically disposed on said exterior surfaces of said package.

22. The ladder network and architecture of claim 17 wherein said network and architecture are contained within a stackable integrated circuit (IC) package, said package having a plurality of exterior surfaces including a top surface and a bottom surface, further comprising:
  a group of one or more external contact structures, each individually and separately comprising:
    a top input/output contact disposed on said top surface of said package;
    a bottom input/output contact located on said bottom surface of said package;
    a group of one or more internal contact terminals, disposed within said package;
    a group of one or more top fuse elements;
    wherein a different one of said top fuse elements is connected between each said internal contact terminal and said top contact;
  a group of one or more bottom fuse elements;
    wherein a different one of said bottom fuse elements is connected between each said internal contact terminal and said bottom contact;
  a second three-state programmable element with first and second terminals, connected between said top and bottom contacts;
  wherein said element has:
    an unprogrammed state wherein said terminals are not electrically connected together;
    a first programmed state wherein said terminals are electrically connected together; and
    a second or final programmed state wherein said terminals are not electrically connected together;
  a third passive programming means whereby said top fuse elements may be selectively programmed; and
  a fourth passive programming means whereby said bottom fuse elements may be selectively programmed;
  wherein said second three-state element may be programmed directly through said top and bottom contacts;
wherein said accessible architecture terminals include the internal contact terminals of said at least one external contact structure.

23. The ladder network, architecture and IC package of claim 21 wherein said IC package is a stackable IC package, wherein said package exterior surfaces include a top surface and a bottom surface, further comprising:
  a group of one or more external contact structures, each individually and separately comprising:
    a top input/output contact disposed on said top surface of said package;
    a bottom input/output contact located on said bottom surface of said package;
    an internal contact terminal, disposed within said package;
    a top fuse element, connected between said internal contact terminal and said top contact;
    a bottom fuse element, connected between said internal contact terminal and said bottom contact;
    a second three-state programmable element, electrically equivalent to a fifth antifuse element and a fifth fuse element in series, connected between said top and bottom contacts;
    a third passive programming means whereby said top fuse element may be selectively programmed; and
    a fourth passive programming means whereby said bottom fuse element may be selectively programmed;
wherein said accessible architecture terminals include the top and bottom input/output contacts of said one or more external contact structures.

24. The ladder network, architecture and IC package of claim 21, wherein said inaccessible terminals comprise a plurality of die-attach contact points disposed within said package to which one or more die terminals of one or more IC dice which may be contained within said package may be electrically connected.

25. The ladder network, architecture and IC package of claim 24, further comprising:
  one or more IC dice, permanently mounted within said package prior to programming;
    such that ones of said die terminals of said IC die are electrically connected to ones of said die-attach contact points; and
    such that said package is permanently hermetically sealed;
  first programming protection means whereby said IC dice are protected from damage due to exposure, through said connected die-attach contact points, to said ladder programming signals and said architecture programming signals which may occur at said die-attach contact points;

whereby said ladder network and architecture provide means whereby customers who purchase said IC dice prepackaged in said package may programmably define the connectivity, amongst the accessible terminals on said package exterior and the terminals of said IC dice, after said purchase.

26. The ladder network, architecture and IC package of claim 24 wherein said IC package is a stackable IC package, wherein said package exterior surfaces include a top surface and a bottom surface, further comprising:
 a plurality of external contact structures, each individually and separately comprising:
  a top input/output contact disposed on said top surface of said package;
  a bottom input/output contact located on said bottom surface of said package;
  an internal contact terminal, disposed within said package;
  a top fuse element, connected between said internal contact terminal and said top contact;
  a bottom fuse element, connected between said internal contact terminal and said bottom contact;
  a second three-state programmable element, electrically equivalent to a fifth antifuse element and a fifth fuse element in series, connected between said top and bottom contacts;
  a third passive programming means whereby said top fuse element may be selectively programmed; and
  a fourth passive programming means whereby said bottom fuse element may be selectively programmed;
  wherein said bottom contacts of said plurality of external contact structures are arrayed on said bottom surface of said package according to a predetermined bottom pattern; and
  wherein said top contacts of said plurality of external contact structures are arrayed on said top surface of said package according to a substantially-matching predetermined top pattern;
  such that if another stackable package with identical contact patterns was stacked atop said package, ones of said bottom contacts of said identical package would mate with ones of said top contacts;
  wherein said accessible architecture terminals comprise the top and bottom input/output contact points of said external contact structures;
 whereby said ladder network, architecture and external contact structures together provide means whereby the terminals of said IC dice may be connected;
  through said die-attach contact points;
  through said programmable interconnect architecture;
  through user-selected internal contact points; and
  through user-selected connections between said internal contact points and said top and bottom contacts;
 to user-selected top and bottom contacts;
  so that said terminals of said dice may be electrically connected, through said user-selected top and bottom contacts, to desired circuit nodes external to said package; and
 whereby said contact structures further provide means whereby user-selected ones of said contact structures may have their top and bottom contacts connected together electrically;
  so that connection paths may pass through said package via said selected pairs of connected top and bottom contacts.

27. An external contact structure within a stackable IC package, said package having a plurality of exterior surfaces including a top surface and a bottom surface, comprising:
 a top input/output contact disposed on said top surface of said package;
 a bottom input/output contact located on said bottom surface of said package;
 one or more internal contact terminals, disposed within said package;
 one or more top fuse elements;
  wherein a different one of said top fuse elements is connected between each said internal contact terminal and said top contact;
 one or more bottom fuse elements;
  wherein a different one of said bottom fuse elements is connected between each said internal contact terminal and said bottom contact;
 a second three-state programmable element, connected between said top and bottom contacts, whereby said element may be programmed directly through said top and bottom contacts;
 one or more third passive programming means whereby said top fuse elements may be selectively programmed; and
 one or more fourth passive programming means whereby said bottom fuse elements may be selectively programmed;
whereby each said internal contact terminal may be selectively connected either to said top contact or to said bottom contact, or to both, or neither; and
 whereby said top contact may be selectively connected to said bottom contact.

28. The external contact structure of claim 27:
 wherein said second three-state programmable element is electrically equivalent to a fifth antifuse element and a fifth fuse element in series.

29. The external contact structure of claim 27 wherein said second three-state programmable element has first and second terminals;
 wherein said second three-state programmable element has;
  an unprogrammed state wherein said terminals are not electrically connected together;
  a first programmed state wherein said terminals are electrically connected together; and
  a second or final programmed state wherein said terminals are not electrically connected together;
wherein said first and second terminals of said three-state element are connected to said top and bottom contacts, respectively.

30. The external contact structure of claim 29:
 wherein said one or more internal contact terminals, top fuse elements, bottom fuse elements, third programming means and fourth programming means each separately comprise exactly one internal contact terminal, top fuse element, bottom fuse element, third programming means and fourth programming means, respectively;
whereby said internal contact terminal may be selectively connected either to said top contact or to said bottom contact, or to both, or neither; and
 whereby said top contact may be selectively connected to said bottom contact.

31. A method of forming a desired system comprising a plurality of IC dice, each with a plurality of die terminals, by housing said dice within a vertically stacked array of stackable programmable IC packages;
 wherein each said package must be selected from a plurality of different predetermined packages;

wherein each of said different predetermined packages
comprises:
a plurality of external surfaces including a top surface and a bottom surface;
an array of bottom contacts, disposed on said bottom surface according to a predetermined bottom pattern;
an array of top contacts, disposed on said top surface according to a predetermined top pattern;
a third programmable means whereby the terminals of IC dice which may be enclosed within said package may be connected to user-selected ones of said top contacts and bottom contacts; and
fourth programmable means whereby selected pairs of contacts, including one top contact and one bottom contact, may be electrically connected together;
wherein said different predetermined packages may have different numbers of top and bottom contacts; and
wherein said third and fourth programmable means within said different predetermined packages may be capable of routing the signals from dice with different numbers of die terminals;
wherein said method comprises a sequence of steps including:
a) determining an overall system netlist;
wherein said netlist comprises a list of desired independent nets;
wherein each said independent net comprises a list of die terminals of said dice which must be connected together to form said system;
b) determining a distribution pattern for distributing said dice within said stackable packages;
wherein each said package may contain one or more of said dice;
c) enumerating and classifying said independent nets, by:
enumerating the intra-package nets, each of which must connect die terminals from dice which will all be contained within only one package, according to said distribution pattern; and
enumerating the multi-package nets, each of which must connect die terminals from dice which will be contained in different packages, according to said distribution pattern;
d) determining an optimum stacking sequence for said stackable packages, by:
prioritizing said multi-package nets; and
optimally minimizing the number of package traversals of said multi-package nets;
wherein one traversal occurs each time one of said multi-package nets must pass through one intervening package whose contained dice have no connection to said net; and
wherein greater weight is given in said optimal minimization to higher-priority multi-package nets;
e) enumerating the minimum number of vertical pathways required at each level of said stacking sequence in order to contain the multi-package nets at each level;
wherein said multi-package nets include both those which include die terminals within said package and those traversing said package;
f) determining, at each said level, the required interconnections between said dice and said top and bottom contacts, assuming said system will be built using said optimum stacking sequence;

g) selecting said array of stackable packages;
wherein the top pattern of said top contact array of each said package must matably match the bottom pattern of said bottom contact array of the next-higher package in said array of packages;
such that when the next higher package is stacked atop said package, ones of said array of bottom contacts of said next-higher package matably connect with ones of said array of top contacts of said package;
wherein the stackable package which will be used at each level must have at least as many top and bottom contacts as required vertical pathways; and
wherein the programmable means of each said package must allow said die terminals of the dice within said package to be connected to their required top and bottom contacts;
h) programming each of said plurality of stackable packages to achieve each required connectivity;
i) mounting each said die within its said programmed package;
wherein said die terminals are connected to said third programmable means; and
j) matably stacking said packages together in said array such that the top array of each said package electrically contacts the bottom array of each successively-higher package, thereby forming said system by completing each of said desired independent nets.

32. The method of claim 31:
wherein said programmable, stackable packages have been preselected;
wherein said packages are predetermined to have sufficient numbers of top and bottom contacts; and
wherein said third and fourth programmable means of each said package are predetermined to be capable of routing the signals from the dice contained within said package;
wherein said IC dice are premounted within said programmable, stackable packages; and
wherein each of said packages further comprises first programming protection means whereby the IC dice premounted within said package are protected from damage due to exposure, through said connections to said third programmable means, to any programming signals which may be present during the programming of said architecture;
whereby steps b), e), g) and i) of said method are not required and are deleted from said method.

33. A passive, electrically-programmable ladder network, having a first plurality of ladder control terminals comprising at least a first ground or common control terminal and a second master control terminal, and a second plurality of slave terminals, wherein said ladder network provides means whereby said slave terminals may be electrically controlled through said control terminals, further comprising;
a plurality of first fuse-antifuse elements, each individually and separately comprising:
a sixth antifuse element, having first and second antifuse terminals; and
a sixth fuse element, having first and second fuse terminals;
wherein said second antifuse terminal is connected to said second fuse terminal;
wherein said fuse-antifuse elements are electrically connected together sequentially, such that a fuse-antifuse chain is formed;

wherein said fuse-antifuse chain has a first end comprising said first antifuse terminal of a first of said fuse-antifuse elements;

wherein the first antifuse terminal of each successive fuse-antifuse element in said fuse-antifuse chain is connected to the second antifuse terminal of the preceding fuse-antifuse element; and wherein said fuse-antifuse chain has a second end comprising said second antifuse terminal of a last of said fuse-antifuse elements;

wherein said first fuse terminal of each fuse-antifuse element is electrically connected to said ground terminal;

wherein said master control terminal comprises said first end of said chain; and wherein said plurality of slave terminals comprises the second fuse terminal of each of said plurality of fuse-antifuse elements.

34. The ladder network of claim 33, further comprising:
an additional sixth fuse element, whose first fuse terminal is electrically connected to said ground terminal and whose second fuse terminal is connected to said first end of said fuse-antifuse chain;

wherein said plurality of slave terminals further comprises said second fuse terminal of said additional sixth fuse element.

35. The ladder network of claim 34, further comprising:
a plurality of slave rails, each individually and separately comprising:
   a second conductor; and
   a third fuse element with first and second fuse terminals, wherein said second fuse terminal is connected to said second conductor;
wherein each said slave terminal is connected to said first fuse terminal of a different one of said slave rails.

36. The ladder network of claim 35, wherein each said slave rail further comprises:
a first passive programming means whereby said third fuse element may be selectively programmed.

37. The ladder network of claim 36:
wherein said first passive programming means permits said third fuse element to be programmed when said slave rail is connected to said master terminal;
whereby each slave rail's second conductor, in sequence, may be connected to said master terminal, and then subsequently disconnected from said master terminal by programming the third fuse element of said slave rail;
whereby a plurality of passthrough signals, each different from said ladder programming signals such that said passthrough signals do not program any of said fuses or antifuses of said ladder network, may be transmitted from said master terminal to said second conductor when it is connected to said master terminal; and
whereby said second conductor may subsequently be isolated from all further signals from said master terminal by disconnecting it from said master terminal.

38. The ladder network and connected slave rails of claim 36, wherein said second conductors comprise a plurality of substantially-parallel conductive tracks;
wherein said conductive tracks are disposed in proximity to a piezoelectric substrate; and
wherein the spacings between said tracks substantially correspond to the half-wavelengths of one or more desired surface acoustic wave modes of said piezoelectric substrate;
further comprising:
a plurality of transducer terminals including at least first and second transducer terminals;
a first conductor connected to said first transducer terminal;
a plurality of electrically conductive fingers;
a plurality of first intersections formed where ones of said second conductors intersect with said first conductor;
a plurality of first three-state programmable elements, each electrically equivalent to a fourth fuse element and a fourth antifuse element in series;
   wherein one of said three-state programmable elements connects each second conductor to said first conductor near their said intersection; and
   a second passive programming means whereby said first three-state programmable elements may be selectively programmed;
   wherein said first transducer terminal comprises said master terminal of said ladder network; and
   wherein said conductive tracks comprise said conductive fingers;
whereby said ladder network provides the means for selectively connecting each of said plurality of conductive fingers to one of said transducer terminals;
such that electrical signals transmitted through said transducer terminals after programming will be transduced into surface acoustic waves with user-selectable properties, depending on the pattern in which said fingers have been connected to said transducer terminals.

* * * * *